(12) United States Patent
Minamio et al.

(10) Patent No.: US 7,286,729 B2
(45) Date of Patent: Oct. 23, 2007

(54) OPTICAL DEVICE CAVITY STRUCTURE, OPTICAL DEVICE, AND METHOD FOR MANUFACTURING AN OPTICAL DEVICE CAVITY STRUCTURE

(75) Inventors: Masanori Minamio, Osaka (JP);
Toshiyuki Fukuda, Kyoto (JP);
Noriyuki Yoshikawa, Osaka (JP);
Hiroaki Fujimoto, Osaka (JP);
Yoshinobu Kunitomo, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/396,651

(22) Filed: Apr. 4, 2006

(65) Prior Publication Data
US 2006/0222285 A1    Oct. 5, 2006

(30) Foreign Application Priority Data

| Apr. 4, 2005 | (JP) | ............................ 2005-107785 |
| Apr. 4, 2005 | (JP) | ............................ 2005-107792 |
| Apr. 8, 2005 | (JP) | ............................ 2005-112374 |

(51) Int. Cl.
*G02B 6/12* (2006.01)
(52) U.S. Cl. ....................................... 385/14
(58) Field of Classification Search ................... 385/14
See application file for complete search history.

(56) References Cited

U.S. PATENT DOCUMENTS

| 4,942,454 | A  | * | 7/1990  | Mori et al. ................. 257/676 |
| 5,054,870 | A  | * | 10/1991 | Losch et al. .................. 385/14 |
| 6,157,074 | A  | * | 12/2000 | Lee ............................. 257/666 |
| 6,320,126 | B1 | * | 11/2001 | Eng et al. .................... 174/521 |
| 6,472,729 | B1 | * | 10/2002 | Oka ........................... 257/676 |
| 2003/0128552 | A1 | * | 7/2003 | Takagi et al. ............... 362/555 |
| 2004/0218849 | A1 | * | 11/2004 | Blauvelt et al. ............. 385/14 |
| 2006/0067064 | A1 | * | 3/2006  | Crews et al. ............... 361/761 |

FOREIGN PATENT DOCUMENTS

JP    2001-332656    11/2001

* cited by examiner

*Primary Examiner*—Ellen E. Kim
(74) *Attorney, Agent, or Firm*—McDermott Will & Emery LLP

(57) ABSTRACT

An optical device cavity structure includes: insulator layers and metal layers alternately layered on one another; a first terminal section which is formed on a mounting surface to be mounted on a wiring substrate and which is electrically connected to the wiring substrate; a cavity portion having a generally rectangular opening formed in a central portion of the upper surface; and a light-transmitting member placement section formed on the upper surface surrounding the opening for receiving a light-transmitting member thereon, wherein the light-transmitting member is for transmitting therethrough light to be received by, or light emitted from, an optical element chip.

61 Claims, 57 Drawing Sheets

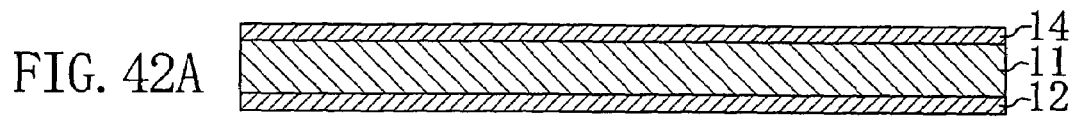
FIG. 42A
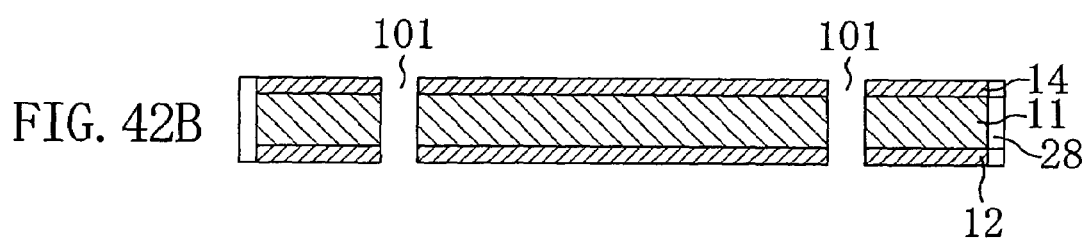
FIG. 42B
FIG. 42C
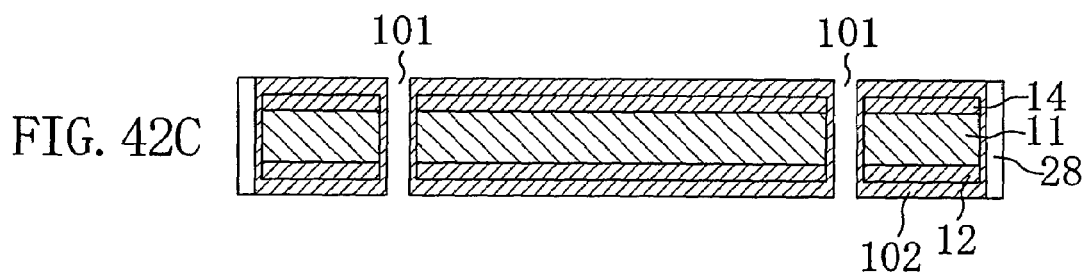
FIG. 42D
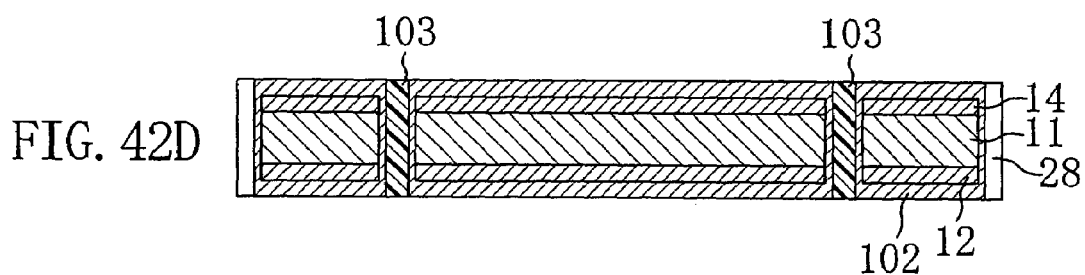
FIG. 42E
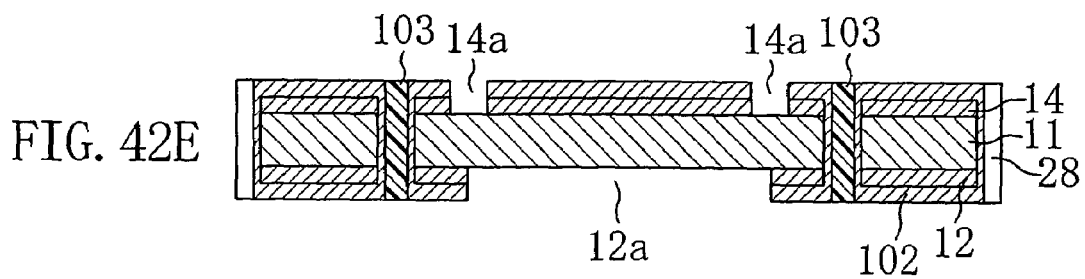

OPTICAL DEVICE CAVITY STRUCTURE, OPTICAL DEVICE, AND METHOD FOR MANUFACTURING AN OPTICAL DEVICE CAVITY STRUCTURE

BACKGROUND OF THE INVENTION

1. Field of the Invention

The present invention relates to an optical device cavity structure, an optical device and a method for manufacturing an optical device cavity structure.

2. Description of the Background Art

Optical semiconductor devices are known in the prior art. An optical semiconductor device is, for example, a CCD module provided in a video camera, a digital camera, a digital still camera, etc., and typically includes an optical device and a wiring substrate. An optical device includes an optical element chip, a light-transmitting member and a first terminal section. With the first terminal section being electrically connected to the wiring substrate, the optical device can emit light from the optical element chip or receive light coming through the light-transmitting member.

In addition to optical semiconductor devices, other types of semiconductor devices include semiconductor devices for high frequencies. For example, Japanese Laid-Open Patent Publication No. 2001-332656 discloses a high-frequency signal amplifier device and a method for manufacturing the same. The publication discloses a method for manufacturing a high-frequency signal amplifier device as follows. First, a dielectric layer with a plurality of metal patterns formed on the surface thereof is used as at least one of a plurality of dielectric layers, and a dielectric multi-layer substrate having a structure as follows is used. The dielectric multi-layer substrate has a structure such that when proceeding in the depth direction from anywhere within a predetermined area of one substrate surface of the dielectric multi-layer substrate, a plurality of metal patterns or a metal surface provided at a deeper position than the plurality of metal patterns will be reached before reaching the other substrate surface of the dielectric multi-layer substrate. Then, the predetermined area of the dielectric multi-layer substrate is irradiated with laser light. This removes the dielectric layer from a portion extending in the depth direction from one substrate surface to the plurality of metal patterns or the metal surface, thus exposing the plurality of metal patterns and the metal surface in the predetermined area. Then, a semiconductor element is placed in the predetermined area. Thus, a high-frequency signal is input to the semiconductor element via some of the plurality of metal patterns, and an amplified high-frequency signal is output from the semiconductor element via some other metal patterns. It is stated that with such a manufacturing method, as opposed to those in which a semiconductor device is manufactured while forming an isolation trench in advance, it is not necessary to account for a manufacturing margin, and it is possible to realize a reduction in size in the manufactured high-frequency signal amplifier device while compensating for the insufficient isolation.

Typically, in a semiconductor device for high frequencies, the semiconductor element chip is sealed with a resin. On the other hand, an optical component such as a light-transmitting member or a lens barrel is often placed on an optical semiconductor device. Therefore, the structure of an optical semiconductor device and that of a semiconductor device for high frequencies are quite different from each other. Therefore, if one attempts to manufacture an optical semiconductor device using the dielectric multi-layer substrate disclosed in Japanese Laid-Open Patent Publication No. 2001-332656, it is necessary to devise measures for placing an optical component on the dielectric multi-layer substrate.

SUMMARY OF THE INVENTION

It is an object of the present invention to provide an optical device cavity structure and an optical device, which can be manufactured without forming an isolation trench in advance, while devising measures for placing an optical component thereon, and to provide a method for manufacturing such an optical device cavity structure.

First to third optical device cavity structures of the present invention are each an optical device cavity structure which receives an optical element chip thereon and which is to be mounted on a wiring substrate.

The first optical device cavity structure includes: at least two insulator layers, including a first and a second insulator layer, and at least two metal layers, including a first and a second metal layer, alternately layered on one another; a first terminal section formed on a mounting surface to be mounted on the wiring substrate so as to be electrically connected to the wiring substrate; a cavity portion having a generally rectangular opening in a central portion of a surface opposite to the mounting surface; and a light-transmitting member placement section formed on the opposite surface surrounding the opening for receiving a light-transmitting member thereon, wherein the light-transmitting member is for transmitting therethrough light to be received by, or light emitted from, the optical element chip, wherein: a bottom surface of the cavity portion is a portion of the first metal layer and is a chip placement section for receiving the optical element chip thereon; each inner wall surface of the cavity portion is formed by the first insulator layer, the second metal layer and the second insulator layer, which are layered in this order from the bottom surface toward the opening, with a plurality of protruding portions protruding from the inner wall surface, each protruding portion being formed by the first insulator layer and the second metal layer; the second metal layer in each protruding portion is a second terminal section which is electrically connected to the first terminal section and which is to be electrically connected to the optical element chip; and the light-transmitting member placement section includes securing means, being a portion of the second insulator layer, for securing the light-transmitting member.

The second optical device cavity structure includes: at least three insulator layers, including a first, a second and a third insulator layer, and at least three metal layers, including a first, a second and a third metal layer, alternately layered on one another; a first terminal section formed on a mounting surface to be mounted on the wiring substrate so as to be electrically connected to the wiring substrate; and a cavity portion having a generally rectangular opening in a central portion of a surface opposite to the mounting surface, wherein: a bottom surface of the cavity portion is a portion of the first metal layer and is a chip placement section for receiving the optical element chip thereon; each inner wall surface of the cavity portion is formed by the first insulator layer, the second metal layer, the second insulator layer, the third metal layer and the third insulator layer, which are layered in this order from the bottom surface toward the opening, with a plurality of first protruding portions and a second protruding portion protruding from the inner wall surface, wherein the first protruding portions are formed by the first insulator layer and the second metal layer, and the second protruding portion is formed by second insulator layer and the third metal layer and is protruding over a shorter distance than the first protruding portions; the second metal layer in each first protruding portion is a second terminal section which is electrically connected to the first terminal section and which is to be electrically connected to the optical element chip; and a surface of the third metal layer in the second protruding portion is a light-transmitting member placement section for receiving a light-transmitting member thereon, wherein the light-transmitting member is for transmitting therethrough light to be received by, or light emitted from, the optical element chip.

The third optical device cavity structure includes: at least two insulator layers, including a first and a second insulator layer, and at least three metal layers, including a first, a second and a third metal layer, alternately layered on one another; a first terminal section formed on a mounting surface to be mounted on the wiring substrate so as to be electrically connected to the wiring substrate; a cavity portion having a generally rectangular opening in a central portion of a surface opposite to the mounting surface; and an optical component fitting section being a depression surrounding the opening in which an optical component for transmitting therethrough light to be received by, or light emitted from, the optical element chip is to be fitted, wherein: a bottom surface of the cavity portion is a portion of the first metal layer and is a chip placement section for receiving the optical element chip thereon; each inner wall surface of the cavity portion is formed by the first insulator layer, the second metal layer and the second insulator layer, which are layered in this order from the bottom surface toward the opening, with a plurality of protruding portions protruding from the inner wall surface, each protruding portion being formed by the first insulator layer and the second metal layer; the second metal layer in each protruding portion is a second terminal section which is electrically connected to the first terminal section and which is to be electrically connected to the optical element chip; and a surface of the optical component fitting section generally parallel to the bottom surface of the cavity portion is a portion of the third metal layer.

A light-transmitting member can be placed on, or an optical component can be fitted in, the first to third optical device cavity structures. Therefore, the cavity structure can be provided in an optical semiconductor device.

Particularly, with the first optical device cavity structure, the light-transmitting member can be secured in close contact with the first optical device cavity structure. With the second optical device cavity structure, the light-transmitting member can be placed inside the cavity portion, whereby it is possible to provide a compact optical device.

A first optical device of the present invention includes: the first optical device cavity structure; an optical element chip placed on the chip placement section of the optical device cavity structure; and a light-transmitting member placed on the light-transmitting member placement section of the optical device cavity structure.

A second optical device of the present invention includes: the second optical device cavity structure; an optical element chip placed on the chip placement section of the optical device cavity structure; and a light-transmitting member placed on the light-transmitting member placement section of the optical device cavity structure.

A third optical device of the present invention includes: the third optical device cavity structure; an optical element chip placed on the chip placement section of the optical device cavity structure; and an optical component fitted in the optical component fitting section of the optical device cavity structure. The "optical component" as used herein is a lens barrel, or the like.

The first to third optical devices, including the first to third optical device cavity structures, respectively, have substantially the same advantageous effects as those described above.

First to fourth manufacturing methods of the present invention are each a method for manufacturing an optical device cavity structure which receives an optical element chip thereon and which is to be mounted on a wiring substrate, the optical device cavity structure including a first terminal section electrically connected to the wiring substrate, a second terminal section electrically connected to the first terminal section, a chip placement section for receiving thereon the optical element chip electrically connected to the second terminal section, and a light-transmitting member placement section for receiving a light-transmitting member thereon, wherein the light-transmitting member is for transmitting therethrough light to be received by, or light emitted from, the optical element chip.

The first manufacturing method includes: a step of providing a base substrate, the base substrate including a first metal layer which is formed on one surface of a first insulator layer and which is to be the first terminal section, a second metal layer formed on the other surface of the first insulator layer, a second insulator layer formed on a surface of the second metal layer, a third metal layer formed on a peripheral portion of a surface of the second insulator layer and a plurality of tongue-shaped portions extending from the peripheral portion toward a central portion of the surface of the second insulator layer, and a third insulator layer formed on a surface of the third metal layer and on a portion of the second insulator layer that is not covered by the third metal layer; and a laser light irradiation step of irradiating a surface of the base substrate with laser light, thereby removing a portion of the second insulator layer that is not covered by the third metal layer, a portion of the third insulator layer where the third metal layer is absent and a portion of the third insulator layer formed over the tongue-shaped portions, while roughening a remaining portion of the third insulator layer, wherein: in the laser light irradiation step, as a result of the removal of the second and third insulator layers, a cavity portion having a generally rectangular opening is formed in a central portion of the surface of the base substrate; as a result of the removal of the second insulator layer, at least a portion of the second metal layer is exposed, thus forming a bottom surface of the cavity portion, which serves as the optical element chip placement section; as a result of the removal of the third insulator layer, the tongue-shaped portions are exposed, thus forming a plurality of protruding portions protruding from inner wall surfaces of the cavity portion, each protruding portion serving as the second terminal section; and as a result of the roughening of the remaining portion of the third insulator layer, the light-transmitting member placement section is formed.

The second manufacturing method includes: a step of providing a base substrate, the base substrate including a first metal layer which is formed on one surface of a first insulator layer and which is to be the first terminal section, a second metal layer formed on the other surface of the first insulator layer, a second insulator layer formed on a surface of the second metal layer, a third metal layer formed on a peripheral portion of a surface of the second insulator layer and a plurality of tongue-shaped portions extending from the peripheral portion toward a central portion of the surface of the second insulator layer, and a third insulator layer formed on a surface of the third metal layer and on a portion of the second insulator layer that is not covered by the third metal layer; a laser light irradiation step of irradiating a portion of a surface of the base substrate where the third metal layer is absent and portions thereof corresponding to the tongue-shaped portions with laser light, thereby removing a portion of the second insulator layer that is not covered by the third metal layer and an irradiated portion of the third insulator layer; and a step of, after the laser light irradiation step, forming a resist layer on a surface of a remaining portion of the third insulator layer, thus forming the light-transmitting member placement section, wherein: in the laser light irradiation step, as a result of the removal of the second and third insulator layers, a cavity portion having a generally rectangular opening is formed in a central portion of the surface of the base substrate; as a result of the removal of the second insulator layer, at least a portion of the second metal layer is exposed, thus forming a bottom surface of the cavity portion, which serves as an optical element chip placement section; and as a result of the removal of the third insulator layer, the tongue-shaped portions are exposed, thus forming a plurality of protruding portions protruding from inner wall surfaces of the cavity portion, each protruding portion serving as the second terminal section.

The third manufacturing method includes: a step of providing a base substrate, the base substrate including a first metal layer which is formed on one surface of a first insulator layer and which is to be the first terminal section, a second metal layer formed on the other surface of the first insulator layer, a second insulator layer formed on a surface of the second metal layer, a third metal layer formed on a peripheral portion of a surface of the second insulator layer and a plurality of tongue-shaped portions extending from the peripheral portion toward a central portion of the surface of the second insulator layer, a fourth metal layer formed on a surface of a third insulator layer formed on the third metal layer so as to be narrower than the third metal layer, and a fourth insulator layer formed on a surface of the fourth metal layer and on a portion of the third insulator layer that is not covered by the fourth metal layer; and a laser light irradiation step of irradiating a portion of a surface of the base substrate where the third metal layer is absent and portions thereof corresponding to the tongue-shaped portions and a peripheral portion of the tongue-shaped portions with laser light, thereby removing an irradiated portion of the fourth insulator layer, a portion of the third insulator layer that is not covered by the fourth metal layer and a portion of the second insulator layer that is not covered by the third metal layer, wherein: in the laser light irradiation step, as a result of the removal of the second, third and fourth insulator layers, a cavity portion having a generally rectangular opening is formed in a central portion of the surface of the base substrate; as a result of the removal of the second insulator layer, at least a portion of the second metal layer is exposed, thus forming a bottom surface of the cavity portion, which serves as the optical element chip placement section; as a result of the removal of the third insulator layer, the tongue-shaped portions are exposed, thus forming a plurality of protruding portions protruding from inner wall surfaces of the cavity portion, each protruding portion serving as the second terminal section; and as a result of the removal of the fourth insulator layer, at least a portion of the fourth metal layer is exposed, thereby forming a second protruding portion protruding, over a shorter distance than the first protruding portion, from each inner wall surface of the cavity portion, the second protruding portion serving as the light-transmitting member placement section.

The fourth manufacturing method is a method for manufacturing an optical device cavity structure which receives an optical element chip thereon and which is to be mounted on a wiring substrate, the optical device cavity structure including a first terminal section electrically connected to the wiring substrate, a second terminal section electrically connected to the first terminal section, a chip placement section for receiving thereon the optical element chip electrically connected to the second terminal section, and an optical component fitting section in which an optical component is fitted, the optical component transmitting therethrough light to be received by, or light emitted from, the optical element chip. The method includes: a step of providing a base substrate, including a first metal layer which is formed on one surface of a first insulator layer and which is to be the first terminal section, a second metal layer formed on the other surface of the first insulator layer, a second insulator layer formed on a surface of the second metal layer, a third metal layer formed on a peripheral portion of a surface of the second insulator layer and a plurality of tongue-shaped portions extending from the peripheral portion toward a central portion of the surface of the second insulator layer, a fourth metal layer formed on a surface of a third insulator layer formed on the third metal layer so as to be narrower than the third metal layer, and a fourth insulator layer formed on a surface of the fourth metal layer and on a portion of the third insulator layer that is not covered by the fourth metal layer; and a laser light irradiation step of irradiating a portion of a surface of the base substrate where the third metal layer is absent and portions corresponding to the tongue-shaped portions and the fourth metal layer with laser light, thereby removing an irradiated portion of the fourth insulator layer, a portion of third insulator layer that is not covered by the fourth metal layer and a portion of the second insulator layer that is not covered by the third metal layer, wherein: in the laser light irradiation step, as a result of the removal of the second, third and fourth insulator layers, a cavity portion having a generally rectangular opening is formed in a central portion of the surface of the base substrate; as a result of the removal of the second insulator layer, at least a portion of the second metal layer is exposed, thus forming a bottom surface of the cavity portion, which serves as an optical element chip placement section; as a result of the removal of the third insulator layer, the tongue-shaped portions are exposed, thereby forming a plurality of first protruding portions protruding from inner wall surfaces of the cavity portion, each first protruding portion serving as the second terminal section; and as a result of the removal of the peripheral portion of the fourth insulator layer, at least a portion of the fourth metal layer is exposed, thereby forming the optical component fitting section.

In the first to fourth manufacturing methods, a section is formed for receiving thereon a light-transmitting member, a lens barrel, or the like. Therefore, a structure manufactured by these manufacturing methods can be provided in an optical apparatus.

Each metal layer functions as a laser stop layer. Therefore, it is possible to design devices without having to account for a manufacturing margin, or the like.

A fourth optical device cavity structure of the present invention is an optical device cavity structure which is mounted on a wiring substrate and which receives an optical element chip thereon. The fourth optical device cavity structure includes: a plurality of insulator layers, including a first and a second insulator layer, and a plurality of metal layers, including a first, a second and a third metal layer, alternately layered on one another; a first terminal section formed on a mounting surface to be mounted on the wiring substrate so as to be electrically connected to the wiring substrate; a cavity portion having a generally rectangular opening in a central portion of a surface opposite to the mounting surface; and a light-transmitting member placement section for receiving a light-transmitting member thereon, wherein the light-transmitting member is for transmitting therethrough light to be received by, or light emitted from, the optical element chip, wherein: a bottom surface of the cavity portion is a portion of the first metal layer and is a chip placement section for receiving the optical element chip thereon; each inner wall surface of the cavity portion is formed by the first insulator layer, the second metal layer and the second insulator layer, which are layered in this order from the bottom surface toward the opening, with a plurality of protruding portions protruding from the inner wall surface, each protruding portion being formed by the first insulator layer and the second metal layer; the second metal layer in each protruding portion is a second terminal section which is electrically connected to the first terminal section and which is to be electrically connected to the optical element chip; and the third metal layer is placed closer to the mounting surface than the first metal layer.

With the fourth optical device cavity structure of the present invention, it is possible to improve the degree of flatness of the chip placement section, or the like. Therefore, the placement of a lens barrel, or the like, will not influence the tilt.

A fourth optical device of the present invention includes: the fourth optical device cavity structure; an optical element chip placed on the chip placement section of the optical device cavity structure; and a light-transmitting member placed on the light-transmitting member placement section of the optical device cavity structure.

Fifth to seventh optical device cavity structures of the present invention are each an optical device cavity structure which receives an optical element chip thereon and which is to be mounted on a wiring substrate.

The fifth optical device cavity structure includes: at least two insulator layers, including a first and a second insulator layer, and at least two metal layers, including a first and a second metal layer, alternately layered on one another; a cavity portion having a generally rectangular opening in a central portion of a surface opposite to a mounting surface to be mounted on the wiring substrate; a light-transmitting member placement section formed on the opposite surface surrounding the opening for receiving a light-transmitting member thereon, wherein the light-transmitting member is for transmitting therethrough light to be received by, or light emitted from, the optical element chip; and a first terminal section electrically connected to a wire of the wiring substrate, wherein: a bottom surface of the cavity portion is a portion of the first metal layer and is a chip placement section for receiving the optical element chip thereon; each inner wall surface of the cavity portion is formed by the first insulator layer, the second metal layer and the second insulator layer, which are layered in this order from the bottom surface toward the opening, with a plurality of protruding portions protruding from the inner wall surface, each protruding portion being formed by the first insulator layer and the second metal layer; the second metal layer in each protruding portion is a second terminal section which is electrically connected to the first terminal section and which is to be electrically connected to the optical element chip; the first terminal section is protruding outwardly from an outer wall surface generally perpendicular to the mounting surface, and a lower surface and at least a portion of a side surface of the first terminal section are covered by a conductive layer; and the light-transmitting member placement section includes securing means, being a portion of the second insulator layer, for securing the light-transmitting member.

The sixth optical device cavity structure includes: at least three insulator layers, including a first, a second and a third insulator layer, and at least three metal layers, including a first, a second and a third metal layer, alternately layered on one another; a cavity portion having a generally rectangular opening in a central portion of a surface opposite to a mounting surface to be mounted on the wiring substrate; and a first terminal section electrically connected to a wire of the wiring substrate, wherein: a bottom surface of the cavity portion is a portion of the first metal layer and is a chip placement section for receiving the optical element chip thereon; each inner wall surface of the cavity portion is formed by the first insulator layer, the second metal layer, the second insulator layer, the third metal layer and the third insulator layer, which are layered in this order from the bottom surface toward the opening, with a plurality of first protruding portions and a second protruding portion protruding from the inner wall surface, wherein the first protruding portions are formed by the first insulator layer and the second metal layer, and the second protruding portion is formed by second insulator layer and the third metal layer and is protruding over a shorter distance than the first protruding portions; the second metal layer in each first protruding portion is a second terminal section which is electrically connected to the first terminal section and which is to be electrically connected to the optical element chip; a surface of the third metal layer in the second protruding portion is a light-transmitting member placement section for receiving a light-transmitting member thereon, wherein the light-transmitting member is for transmitting therethrough light to be received by, or light emitted from, the optical element chip; and the first terminal section is protruding outwardly from an outer wall surface generally perpendicular to the mounting surface, and a lower surface and at least a portion of a side surface of the first terminal section are covered by a conductive layer.

The seventh optical device cavity structure includes: at least two insulator layers, including a first and a second insulator layer, and at least three metal layers, including a first, a second and a third metal layer, alternately layered on one another; a cavity portion having a generally rectangular opening in a central portion of a surface opposite to a mounting surface to be mounted on the wiring substrate; an optical component fitting section being a depression surrounding the opening in which an optical component for transmitting therethrough light to be received by, or light emitted from, the optical element chip is to be fitted; and a first terminal section electrically connected to a wire of the wiring substrate, wherein: a bottom surface of the cavity portion is a portion of the first metal layer and is a chip placement section for receiving the optical element chip thereon; each inner wall surface of the cavity portion is formed by the first insulator layer, the second metal layer and the second insulator layer, which are layered in this order from the bottom surface toward the opening, with a plurality of protruding portions protruding from the inner wall surface, each protruding portion being formed by the first insulator layer and the second metal layer; the second metal layer in each protruding portion is a second terminal section which is electrically connected to the first terminal section and which is to be electrically connected to the optical element chip; a surface of the optical component fitting section generally parallel to the bottom surface of the cavity portion is a portion of the third metal layer; and the first terminal section is protruding outwardly from an outer wall surface generally perpendicular to the mounting surface, and a lower surface and at least a portion of a side surface of the first terminal section are covered by a conductive layer.

A light-transmitting member can be placed on, or an optical component can be fitted in, the fifth to seventh optical device cavity structures. Therefore, the cavity structure can be provided in an optical semiconductor device.

Particularly, with the fifth optical device cavity structure, the light-transmitting member can be secured in close contact with the fifth optical device cavity structure. With the sixth optical device cavity structure, the light-transmitting member can be placed inside the cavity portion, whereby it is possible to provide a compact optical device.

A fifth optical device of the present invention includes: the fifth optical device cavity structure; an optical element chip placed on the chip placement section of the optical device cavity structure; and a light-transmitting member placed on the light-transmitting member placement section of the optical device cavity structure.

A sixth optical device of the present invention includes: the sixth optical device cavity structure; an optical element chip placed on the chip placement section of the optical device cavity structure; and a light-transmitting member placed on the light-transmitting member placement section of the optical device cavity structure.

A seventh optical device of the present invention includes: the seventh optical device cavity structure; an optical element chip placed on the chip placement section of the optical device cavity structure; and an optical component fitted in the optical component fitting section of the optical device cavity structure. The "optical component" as used herein is a lens barrel, or the like.

The fifth to seventh optical devices, including the fifth to seventh optical device cavity structures, respectively, have substantially the same advantageous effects as those described above.

Fifth to eighth manufacturing methods of the present invention are each a method for manufacturing an optical device cavity structure which receives an optical element chip thereon and which is to be mounted on a wiring substrate, the optical device cavity structure including a first terminal section electrically connected to the wiring substrate, a second terminal section electrically connected to the first terminal section, a chip placement section for receiving thereon the optical element chip electrically connected to the second terminal section, and a light-transmitting member placement section for receiving a light-transmitting member thereon, wherein the light-transmitting member is for transmitting therethrough light to be received by, or light emitted from, the optical element chip.

The fifth manufacturing method includes: a step of providing a base substrate, the base substrate including a first metal layer formed on one surface of a first insulator layer, a second metal layer formed on the other surface of the first insulator layer and having a plurality of first tongue-shaped portions extending outwardly, a second insulator layer formed on a surface of the second metal layer, a third metal layer formed on a peripheral portion of the second insulator layer and a plurality of second tongue-shaped portions extending from the peripheral portion toward a central portion of the second insulator layer, and a third insulator layer formed on a surface of the third metal layer and on a portion of the second insulator layer that is not covered by the third metal layer; and a laser light irradiation step of irradiating a surface of the base substrate with laser light, thereby removing a portion of the second insulator layer that is not covered by the third metal layer, a portion of the third insulator layer where the third metal layer is absent, a portion of the third insulator layer that is formed on the second tongue-shaped portion, and a portion of the first insulator layer that is not covered by the second metal layer, while roughening a remaining portion of the third insulator layer, wherein: in the laser light irradiation step, as a result of the removal of the second and third insulator layers, a cavity portion having a generally rectangular opening is formed in a central portion of the surface of the base substrate; as a result of the removal of the second insulator layer, at least a portion of the second metal layer is exposed, thus forming a bottom surface of the cavity portion, which serves as an optical element chip placement section, and the first tongue-shaped portions are exposed; as a result of the removal of the first insulator layer, the first terminal section is formed whose upper surface is covered by the first tongue-shaped portions; as a result of the removal of the third insulator layer, the second tongue-shaped portions are exposed, thereby forming a plurality of protruding portions protruding from inner wall surfaces of the cavity portion, each protruding portion serving as the second terminal section; and as a result of the roughening of the remaining portion of the third insulator layer, the light-transmitting member placement section is formed.

The sixth manufacturing method includes: a step of providing a base substrate, including a first metal layer formed on one surface of a first insulator layer, a second metal layer formed on the other surface of the first insulator layer and having a plurality of first tongue-shaped portions extending outwardly, a second insulator layer formed on a surface of the second metal layer, a third metal layer formed on a peripheral portion of the second insulator layer and a plurality of second tongue-shaped portions extending from the peripheral portion toward a central portion of the second insulator layer, and a third insulator layer formed on a surface of the third metal layer and on a portion of the second insulator layer that is not covered by the third metal layer; a laser light irradiation step of irradiating a portion of a surface of the base substrate where the third metal layer is absent and portions thereof corresponding to the second tongue-shaped portions with laser light, thereby removing an irradiated portion of the second insulator layer that is not covered by the third metal layer, an irradiated portion of the third insulator layer, and an irradiated portion of the first insulator layer; and a step of, after the laser light irradiation step, forming a resist layer on a surface of a remaining portion of the third insulator layer, thus forming the light-transmitting member placement section, wherein: in the laser light irradiation step, as a result of the removal of the second and third insulator layers, a cavity portion having a generally rectangular opening is formed in a central portion of the surface of the base substrate; as a result of the removal of the second insulator layer, at least a portion of the second metal layer is exposed, thus forming a bottom surface of the cavity portion, which serves as an optical element chip placement section, and the first tongue-shaped portions are exposed; as a result of the removal of the first insulator layer, the first terminal section is formed whose upper surface is covered by the first tongue-shaped portions; and as a result of the removal of the third insulator layer, the second tongue-shaped portions are exposed, thereby forming a plurality of protruding portions protruding from inner wall surfaces of the cavity portion, each protruding portion serving as the second terminal section.

The seventh manufacturing method includes: a step of providing a base substrate, including a first metal layer formed on one surface of a first insulator layer, a second metal layer formed on the other surface of the first insulator layer and having a plurality of first tongue-shaped portions extending outwardly, a second insulator layer formed on a surface of the second metal layer, a third metal layer formed on a peripheral portion of the second insulator layer and a plurality of second tongue-shaped portions extending from the peripheral portion toward a central portion of the second insulator layer, a fourth metal layer formed on a surface of a third insulator layer formed on the third metal layer so as to be narrower than the third metal layer, and a fourth insulator layer formed on a surface of the fourth metal layer and on a portion of the third insulator layer that is not covered by the fourth metal layer; and a laser light irradiation step of irradiating a portion of a surface of the base substrate where the third metal layer is absent and portions thereof corresponding to the second tongue-shaped portions and a peripheral portion of the tongue-shaped portions with laser light, thereby removing an irradiated portion of the fourth insulator layer, a portion of the third insulator layer that is not covered by the fourth metal layer, a portion of the second insulator layer that is not covered by the third metal layer, and a portion of the first insulator layer, wherein: in the laser light irradiation step, as a result of the removal of the second, third and fourth insulator layers, a cavity portion having a generally rectangular opening is formed in a central portion of the surface of the base substrate; as a result of the removal of the second insulator layer, at least a portion of the second metal layer is exposed, thus forming a bottom surface of the cavity portion, which serves as the optical element chip placement section, and the first tongue-shaped portions are exposed; as a result of the removal of the first insulator layer, the first terminal section is formed whose upper surface is covered by the first tongue-shaped portions; as a result of the removal of the third insulator layer, the second tongue-shaped portions are exposed, thereby forming a plurality of protruding portions protruding from inner wall surfaces of the cavity portion, each protruding portion serving as the second terminal section; and as a result of the removal of the fourth insulator layer, at least a portion of the fourth metal layer is exposed, thereby forming a second protruding portion protruding, over a shorter distance than the first protruding portion, from each inner wall surface of the cavity portion, the second protruding portion serving as the light-transmitting member placement section.

The eighth manufacturing method includes: a step of forming a base substrate, including a first metal layer formed on one surface of a first insulator layer, a second metal layer formed on the other surface of the first insulator layer and having a plurality of first tongue-shaped portions extending outwardly, a second insulator layer formed on a surface of the second metal layer, a third metal layer formed on a peripheral portion of the second insulator layer and a plurality of second tongue-shaped portions extending from the peripheral portion toward a central portion of the second insulator layer, a fourth metal layer formed on a surface of a third insulator layer formed on the third metal layer so as to be narrower than the third metal layer, and a fourth insulator layer formed on a surface of the fourth metal layer and on a portion of the third insulator layer that is not covered by the fourth metal layer; and a laser light irradiation step of irradiating, a portion of a surface of the base substrate where the third metal layer is absent and portions thereof corresponding to the second tongue-shaped portions and the fourth metal layer with laser light, thereby removing an irradiated portion of the fourth insulator layer, a portion of the third insulator layer that is not covered by the fourth metal layer, a portion of the second insulator layer that is not covered by the third metal layer, and a portion of the first insulator layer, wherein: in the laser light irradiation step, as a result of the removal of the second, third and fourth insulator layers, a cavity portion having a generally rectangular opening is formed in a central portion of the surface of the base substrate; as a result of the removal of the second insulator layer, at least a portion of the second metal layer is exposed, thus forming a bottom surface of the cavity portion, which serves as an optical element chip placement section, and the first tongue-shaped portions are exposed; as a result of the removal of the first insulator layer, the first terminal section is formed whose upper surface is covered by the first tongue-shaped portions; as a result of the removal of the third insulator layer, the second tongue-shaped portions are exposed, thereby forming a plurality of first protruding portions protruding from inner wall surfaces of the cavity portion, each first protruding portion serving as the second terminal section; and as a result of the removal of the fourth insulator layer, the peripheral portion of the fourth metal layer, at least a portion of the fourth metal layer is exposed, thereby forming the optical component fitting section.

In the fifth to eighth manufacturing methods, a section is formed for receiving thereon a light-transmitting member, a lens barrel, or the like. Therefore, a structure manufactured by these manufacturing methods can be provided in an optical apparatus.

Each metal layer functions as a laser stop layer. Therefore, it is possible to design devices without having to account for a manufacturing margin, or the like.

BRIEF DESCRIPTION OF THE DRAWINGS

FIGS. 42A to 42E are cross-sectional views showing a part of the manufacturing process of the optical device cavity structure C11 according to Embodiment 11.

DETAILED DESCRIPTION OF THE PREFERRED EMBODIMENTS

Figure 1:
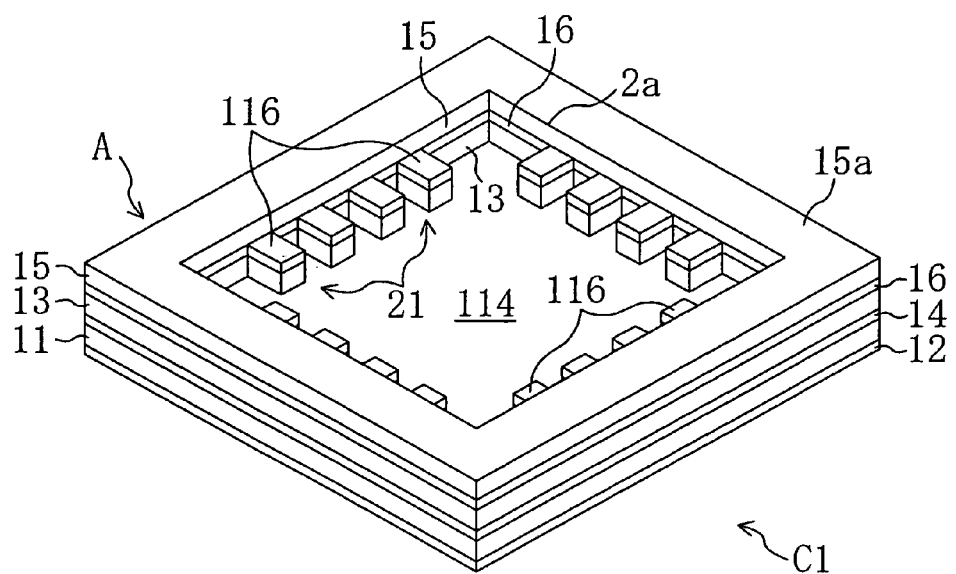
FIG. 1 is a perspective view showing the structure of an optical device cavity structure C1 according to Embodiment 1.

Findings that the present inventors had before arriving at the present invention will first be discussed below, before showing preferred embodiments of the present invention.

An optical semiconductor device preferably has four elements. The four elements will be listed below, along with a discussion on why they are necessary.

The first element is an optical component such as a light-transmitting member or a lens barrel. These optical components are provided in an optical device cavity structure or an optical device so as to oppose the optical plane of an optical element chip.

The second element is a high degree of flatness of an optical device. The degree of flatness of an optical device includes that of a chip placement section and that of an optical component placement section. If a chip placement section does not have a high degree of flatness, when the optical element chip is placed on the chip placement section, the optical plane of an optical element chip and the plane on which it is placed cannot be made generally parallel to each other. Then, where the optical element chip is a light-receiving element, a portion of light to be received is blocked by the optical device cavity structure or the optical device and cannot be received by the optical element chip. Where the optical element chip is a light-emitting element, a portion of light to be output is blocked by the optical device cavity structure or the optical device and cannot be output. If an optical component placement section does not have a high degree of flatness, an optical component cannot be placed generally in parallel to the plane on which it is placed. This influences the tilt when placing the optical component, thereby deteriorating the performance of the optical apparatus.

The third element is means for preventing diffused reflection of light within the apparatus. In an optical semiconductor device, an optical element chip and a terminal section (second terminal section) are electrically connected to each other via a conductive thread, which is bonded to the optical plane of the optical element chip. Therefore, light received by or emitted from the optical element chip may be diffusively reflected by the surface of the conductive thread. Diffused reflection not only reduces the intensity of light received or emitted, but also causes the optical semiconductor device to receive or output the diffusively reflected light, thereby deteriorating the performance, e.g., the resolution, of the optical semiconductor device.

The fourth element is a condensation preventing function. If the humidity increases, a glass portion, or the like, of an optical component may become fogged. Then, it is no longer possible to receive or emit light.

As described above, it is preferred for an optical device cavity structure or an optical device to include an optical component placement section on which an optical component thereof is placed, to have a high degree of flatness, to have diffused reflection preventing means, and to have a condensation preventing function.

The present inventors arrived at the present invention based on these findings. Preferred embodiments of the present invention will now be described in detail. For the sake of simplicity, elements having substantially the same function will be denoted by the same reference numeral throughout the various figures. Note that the present invention is not limited to the following embodiments.

EMBODIMENT 1

Figure 2A:
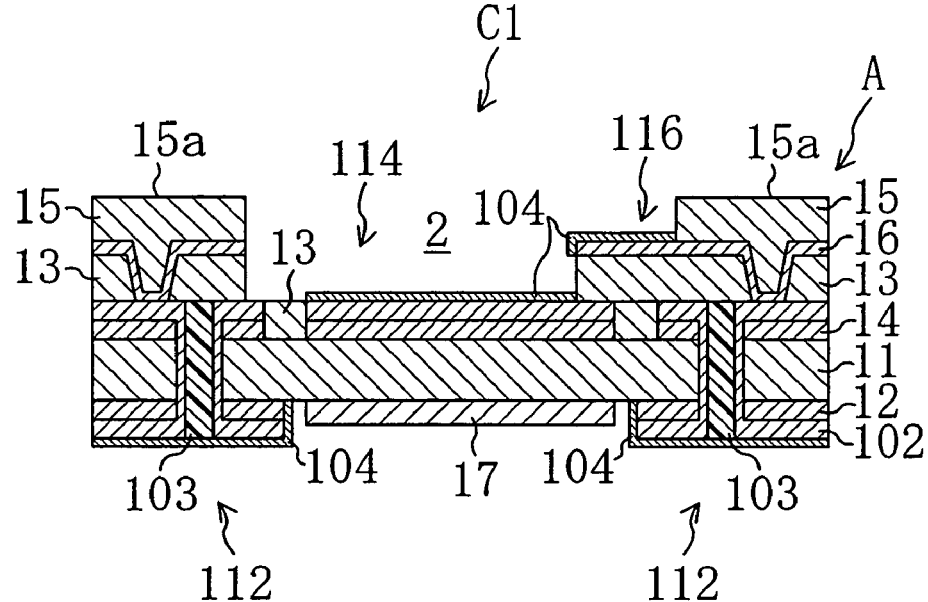
FIG. 2A is a cross-sectional view showing the structure of the optical device cavity structure C1 according to Embodiment 1.
Figure 2B:
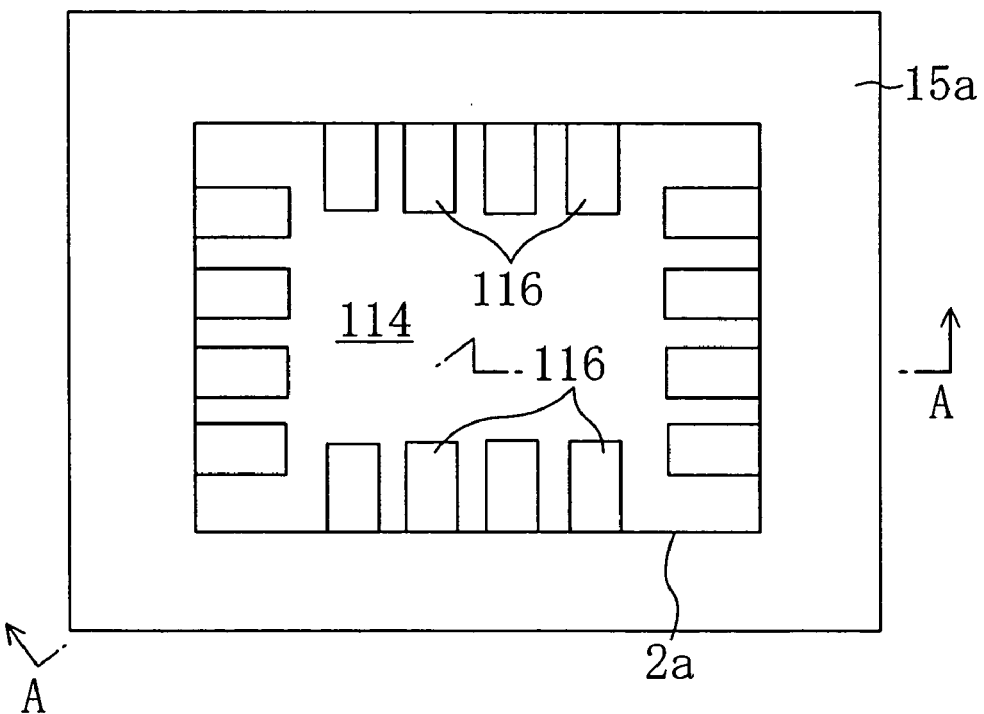
FIG. 2B is a plan view thereof.

Referring to FIGS. 1 to 7C, the structure and manufacturing method of an optical device cavity structure C1 and those of an optical device D1 according to Embodiment 1 of the present invention will now be described. FIGS. 1 to 2B are perspective views and a cross-sectional view showing the structure of the optical device cavity structure C1. FIG. 2A is a cross-sectional view taken along line IIA-IIA of FIG. 2B. FIGS. 3A to 5C are cross-sectional views showing the manufacturing process of the optical device cavity structure C1. FIGS. 6A to 7C are cross-sectional views and perspective views showing the manufacturing process of the optical device D1.

—Structure of Optical Device Cavity Structure C1—

As shown in FIGS. 1 to 2B, the optical device cavity structure C1 includes a first metal layer 12, a first insulator layer 11, a second metal layer 14, a second insulator layer 13, a third metal layer 16 and a third insulator layer 15, which are layered in this order from the mounting surface thereof (the lower surface as shown in FIG. 1) on which it is mounted on a wiring substrate, and includes a cavity portion 2, 16 second terminal sections 116, 116, . . . , a chip placement section 114, a light-transmitting member placement section 15a and 16 first terminal sections 112, 112, . . . . It is preferred that the first, second and third insulator layers 11, 13 and 15 contain a moisture-absorbing porous material (not shown). Then, the optical device cavity structure C1 has a condensation preventing function. Moreover, it is preferred that the first, second and third metal layers 12, 14 and 16 are each made of Cu. Then, it is possible to manufacture the optical device cavity structure C1 by laser light irradiation.

As shown in FIG. 1, the cavity portion 2 includes a generally rectangular opening 2a at the center of the upper surface of the optical device cavity structure C1, and is made by taking the material away in a generally rectangular parallelepiped shape. As shown in FIGS. 2A and 2B, the bottom surface is formed by a plating 104 applied on the upper surface of a central portion of the second metal layer 14. The inner wall surface is formed by the second insulator layer 13, the third metal layer 16 and the third insulator layer 15, which are layered in this order from the bottom surface toward the opening 2a, and a total of 16 protruding portions 21, 21, . . . , are formed along the inner wall surface. The protruding portions 21, 21, . . . , are formed on the inner wall surface, four on each side, while being equally spaced apart from one another so that the second insulator layer 13 and the third metal layer 16 are flush with each other along the three side surfaces of each protruding portion.

As shown in FIGS. 1 to 2B, the second terminal sections 116, 116, . . . , are formed by applying the plating 104 on the upper surface and the side surface of the third metal layer 16 in the protruding portions 21, 21, . . . , of the cavity portion 2.

As shown in FIG. 1, the chip placement section 114 is formed by applying the plating 104 on the bottom surface of the cavity portion 2. As stated above to be the second element of an optical semiconductor device, it is preferred that the chip placement section 114 has a high degree of flatness. Specifically, it is formed so that the surface has an Rz value greater than or equal to 1 µm and less than or equal to 5 µm. Thus, it is possible to place an optical element chip 121 on the chip placement section 114 so as to be generally parallel to the mounting surface. Thus, an optical component such as a lens barrel can be placed, without being tilted, on the optical device in which the optical element chip 121 is placed on the chip placement section 114.

The chip placement section 114 is formed so that the distance between the chip placement section 114 and the upper surface of the second terminal sections 116, 116, . . . , is less than or equal to the thickness of the semiconductor element chip 121, i.e., so that the distance is greater than or equal to 50 µm and less than or equal to 575 µm. If the distance is less than 50 µm, the thickness of the second insulator layer 13 will be too small, thereby making it difficult to provide the second insulator layer 13. If the distance is greater than 575 µm, the upper surface of the second terminal section 116 will be above the optical plane of the semiconductor element chip 121. As a result, light diffusively reflected by the surface of conductive threads 123, 123, . . . , may be received by the semiconductor element chip 121, or light emitted from the semiconductor element chip 121 may be diffusively reflected by the surface of the conductive threads 123, 123, . . . , so as to be output from the optical device cavity structure C1. Thus, it is preferred that the distance is greater than or equal to 50 µm and less than or equal to 575 µm. In many cases, the actual thickness of the semiconductor element chip 121 is a value within the range from 100 µm to 200 µm.

As shown in FIG. 1, the light-transmitting member placement section 15a is at least a part of the upper surface of the third insulator layer 15, and includes securing means A for securing a light-transmitting member 124 to be described later. The securing means A is the upper surface of the third insulator layer 15, which has been roughened. Thus, the light-transmitting member 124 can be secured in close contact with the light-transmitting member placement section 15a. The method for roughening the upper surface of the third insulator layer 15 is not limited to any particular method as long as the roughened surface has an Rz value greater than or equal to 5 µm and less than or equal to 20 µm, preferably an Rz value greater than or equal to 10 µm and less than or equal to 20 µm, more preferably an Rz value greater than or equal to 15 µm and less than or equal to 20 µm, whereby the light-transmitting member 124 can be very firmly secured in close contact with the light-transmitting member placement section 15a. It is more preferred that the light-transmitting member 124 is placed on the light-transmitting member placement section 15a via an adhesive, whereby the light-transmitting member 124 can be even more firmly secured in close contact with the light-transmitting member placement section 15a.

The first terminal sections 112, 112, . . . , are formed around the mounting surface, four on each side, while being equally spaced apart from one another. As shown in FIGS. 2A and 2B, a plating 102 is applied on the lower surface of the first metal layer 12 and the plating 104 is applied on the lower surface of the plating 102 to form the first terminal sections 112, 112 . . . . The platings 102 and 104 are each formed by layering an Au layer on the surface of an Ni layer.

As shown in FIGS. 2A and 2B, a warp preventing depressed portion 12a is formed in a central portion of the mounting surface. Thus, even with the cavity portion 2 formed on the upper surface, it is possible to prevent the optical device cavity structure C1 from warping toward the mounting surface, and it is possible to prevent the optical element chip 121 from warping in a state where the optical element chip 121 is placed on the chip placement section 114. As shown in FIGS. 2A and 2B, an insulator layer 17 is formed on the lower surface of the warp preventing depressed portion 12a, whereby it is possible to completely prevent shorting between the first terminal sections 112.

The first terminal sections 112, 112, . . . , and the second terminal sections 116, 116, . . . , are electrically connected to each other. Specifically, a total of 16 through holes 101, 101, . . . , (shown in FIG. 3B) are formed so as to run through the first metal layer 12, the first insulator layer 11 and the second metal layer 14, and the plating 102 is applied on the inner wall surface of each through hole 101, the lower surface of the first metal layer 12 and the upper surface of the second metal layer 14. A total of 16 etched portions 13a, 13a, . . . , (shown in FIG. 4B) are formed in the second insulator layer 13 on the outer side with respect to the through holes 101, 101, . . . , each corresponding to one of the through holes 101, 101, . . . . Thus, the second metal layer 14 and the third metal layer 16 are in contact with each other in each etched portion 13a, as shown in FIG. 2A. As described above, each first terminal section 112 is electrically connected to the second metal layer 14 via the plating 102, and the second metal layer 14 is electrically connected to the third metal layer 16 in each etched portion 13a. Thus, each first terminal section 112 is electrically connected to a corresponding one of the second terminal sections 116.

An etched portion 14a having a generally-square-shaped bottom surface (shown in FIG. 3E) is formed in the second metal layer 14 on the inner side with respect to the through holes 101, 101, . . . . Therefore, the chip placement section 114 will not be electrically connected to the first terminal sections 112. A resin portion 103 is formed on the plating 102 inside each through hole 101.

The optical device cavity structure C1 has the following advantageous effects.

It is possible to secure the light-transmitting member 124 in close contact with the light-transmitting member placement section 15a.

It is possible to prevent light to be received by, or light to be emitted from, the optical element chip 121 from being diffusively reflected by the surface of the conductive threads 123, 123, . . . .

It is possible to place the optical element chip 121 on the chip placement section 114 with the optical plane being generally parallel to the mounting surface.

It is possible to prevent the optical device cavity structure C1 from warping toward the mounting surface due to the formation of the cavity portion 2.

It is possible to prevent, with desirable moisture absorbency, the mounted light-transmitting member from being fogged.

With a conventional optical device cavity structure, it is necessary to provide ribs in order to place a light-transmitting member, an optical component, etc., while being spaced apart from an optical element chip. In contrast, with the optical device cavity structure C1, it is not necessary to additionally provide ribs because the second and third insulator layers 13 and 15 and the third metal layer 16 layered above the chip placement section 114 function as ribs.

—Structure of Optical Device D1—

Figure 6A:
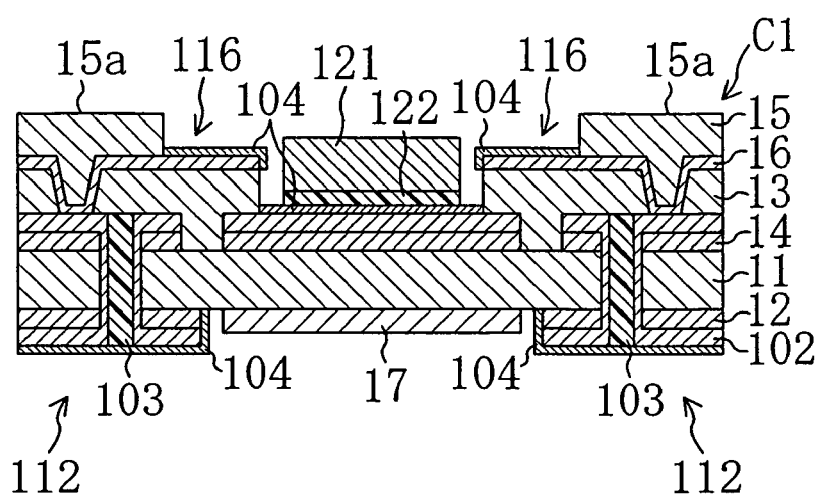
FIGS. 6A to 6C are cross-sectional views showing the manufacturing process of an optical device D1 according to Embodiment 1.
Figure 6B:
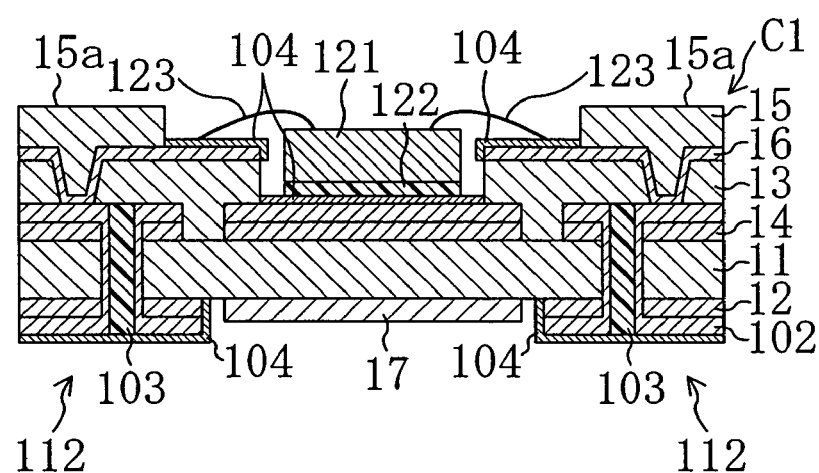
Figure 6C:
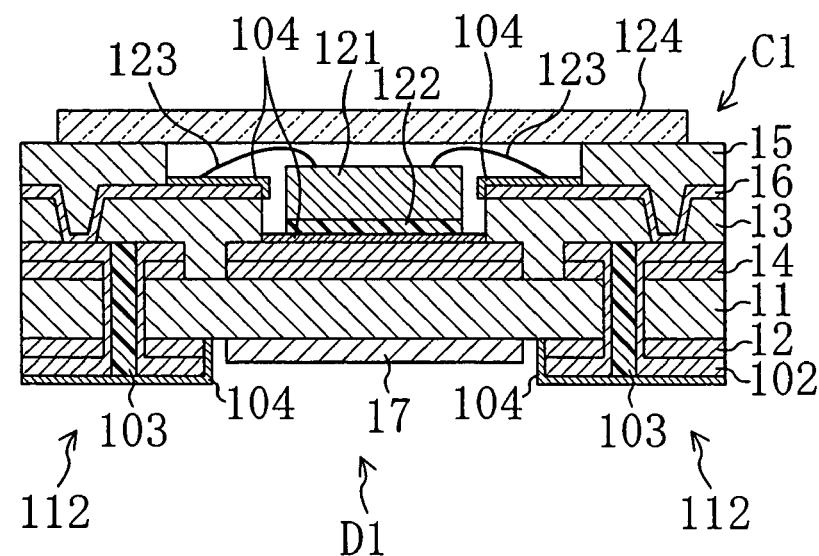
Figure 7A:
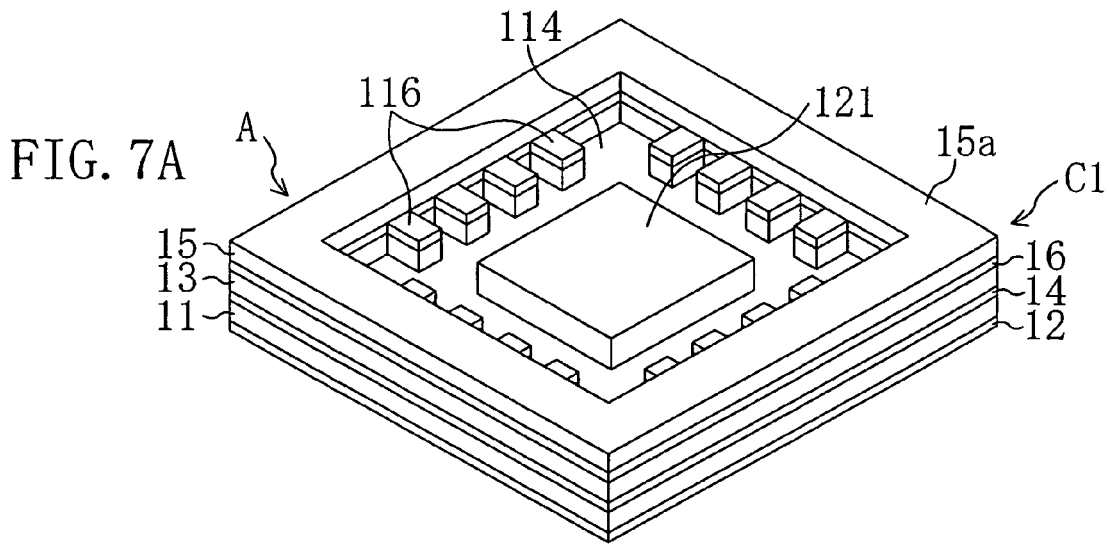
FIGS. 7A to 7C are diagrams showing the manufacturing process of the optical device D1 according to Embodiment 1.
Figure 7B:
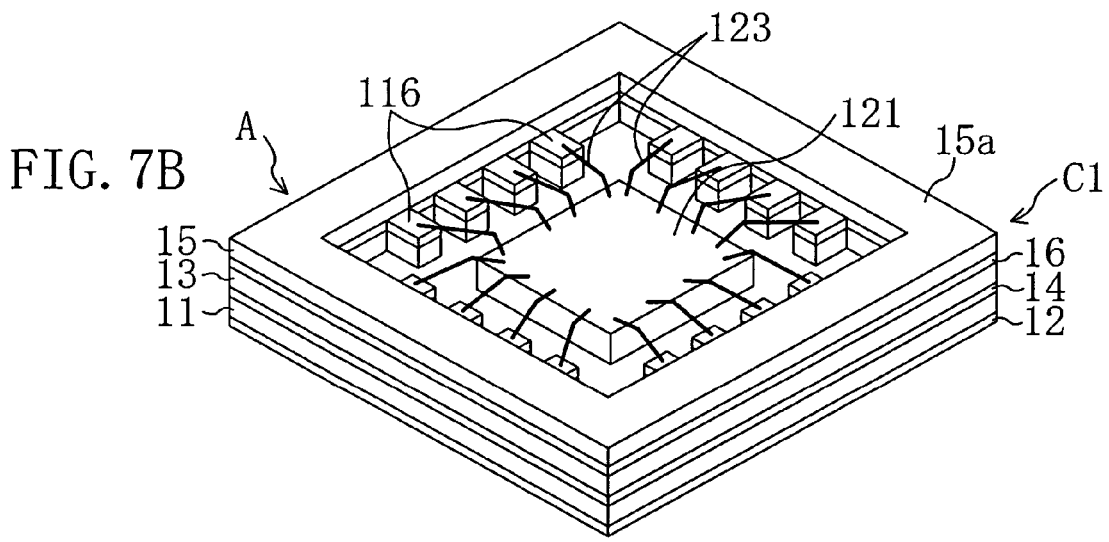
Figure 7C:
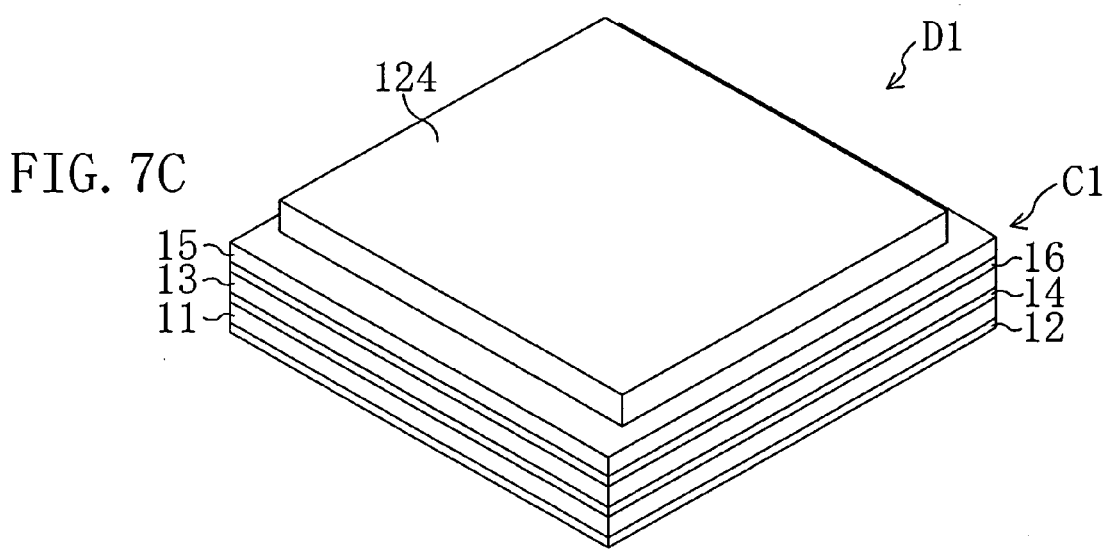

As shown in FIGS. 6C and 7C, the optical device D1 includes the optical device cavity structure C1, the optical element chip 121 and the light-transmitting member 124. The optical element chip 121 is a light-receiving element or a light-emitting element secured on the chip placement section 114 via an adhesive 122, and is connected to the second terminal sections 116, 116, . . . , via the conductive threads 123, 123, . . . . The light-transmitting member 124 is a member placed on the light-transmitting member placement section 15a, and transmits 70% or more, preferably 80% or more, and more preferably 90% or more, of incident light. Specifically, the light-transmitting member 124 is a glass plate.

After the optical device D1 is mounted on the wiring substrate, a voltage is applied to the optical element chip 121 via the first terminal sections 112, 112, . . . , the second terminal sections 116, 116, . . . , and the conductive threads 123, 123, . . . Thus, the optical element chip 121 emits light, and the emitted light is output to the outside of the optical device D1 through the light-transmitting member 124. Alternatively, light transmitted through the light-transmitting member 124 is received by the optical element chip 121.

Thus, the optical device D1, which is obtained by placing the optical element chip 121 and the light-transmitting member 124 on the optical device cavity structure C1, provides substantially the same advantageous effects as those of the optical device cavity structure C1.

—Method for Manufacturing Optical Device Cavity Structure C1—

Figure 3A:
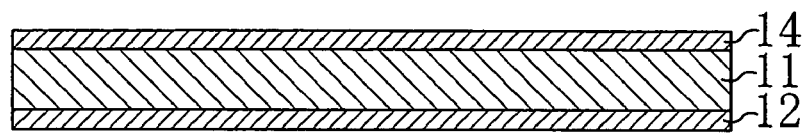
FIGS. 3A to 3E are cross-sectional views showing a part of the manufacturing process of the optical device cavity structure C1 according to Embodiment 1.
Figure 3B:
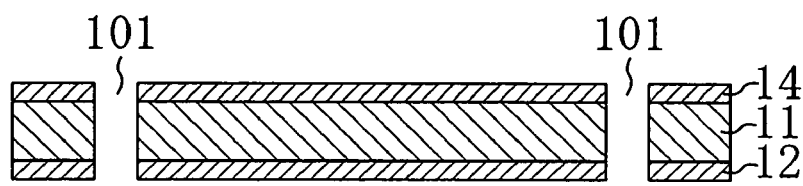
Figure 3C:
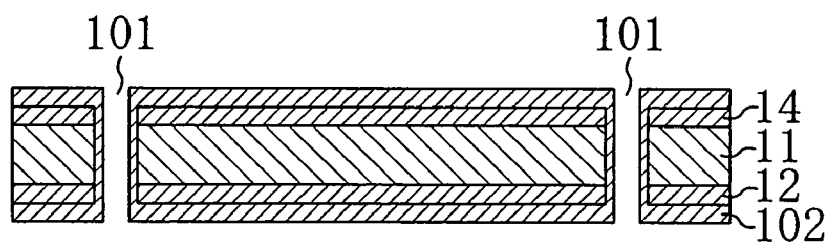
Figure 3D:
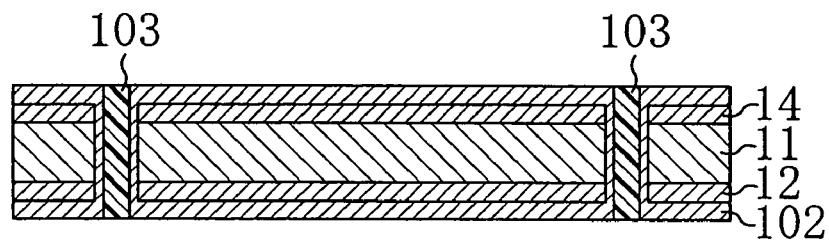
Figure 3E:
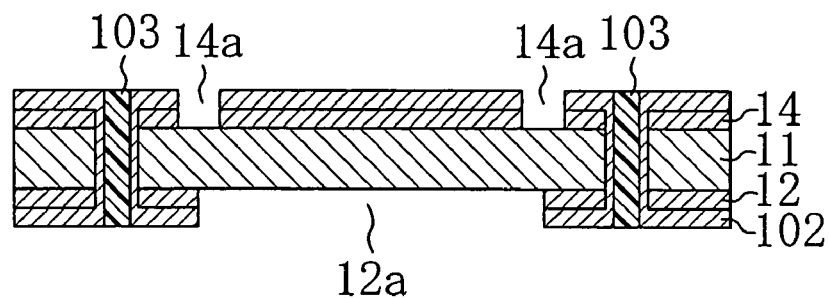
Figure 4A:
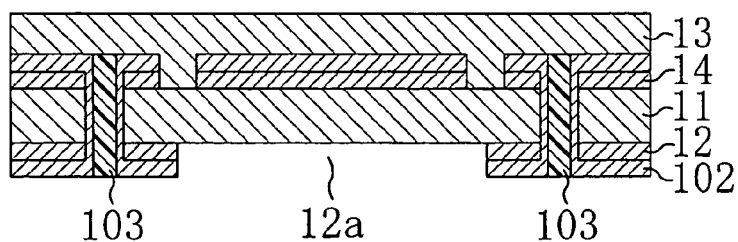
FIGS. 4A to 4E are cross-sectional views showing another part of the manufacturing process of the optical device cavity structure C1 according to Embodiment 1.
Figure 4B:
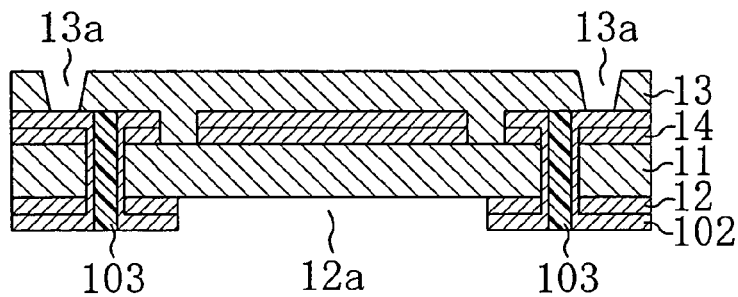
Figure 4C:
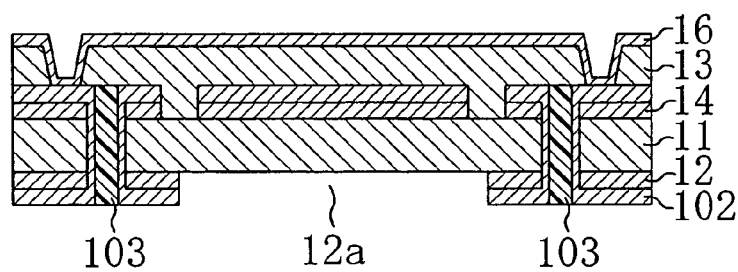
Figure 4D:
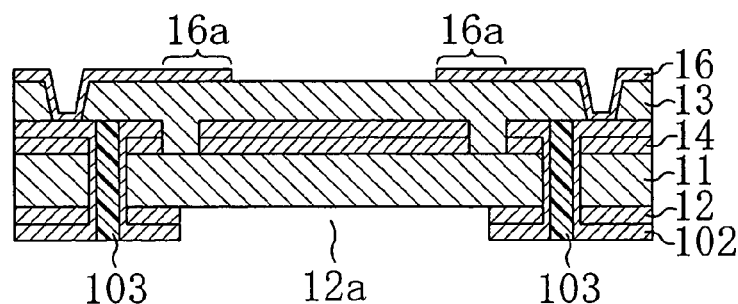
Figure 4E:
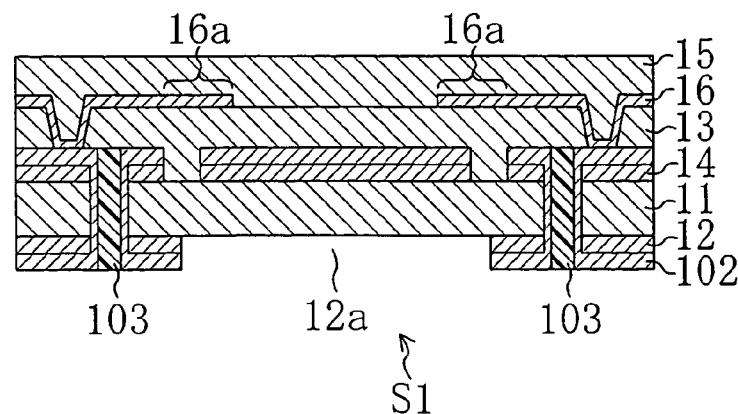
Figure 5A:
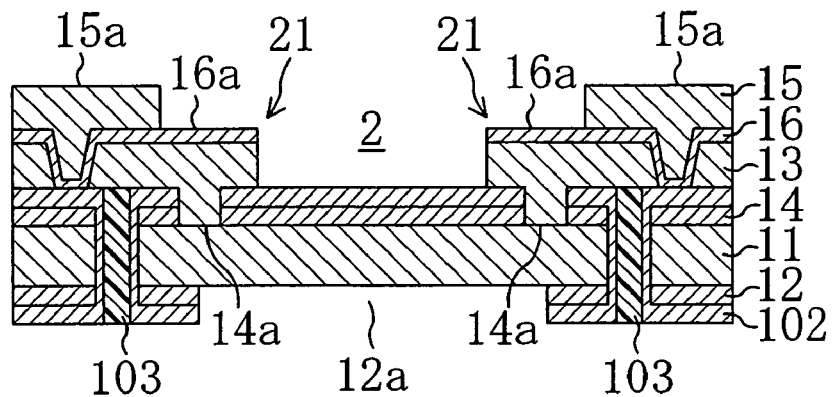
FIGS. 5A to 5C are cross-sectional views showing still another part of the manufacturing process of the optical device cavity structure C1 according to Embodiment 1.
Figure 5B:
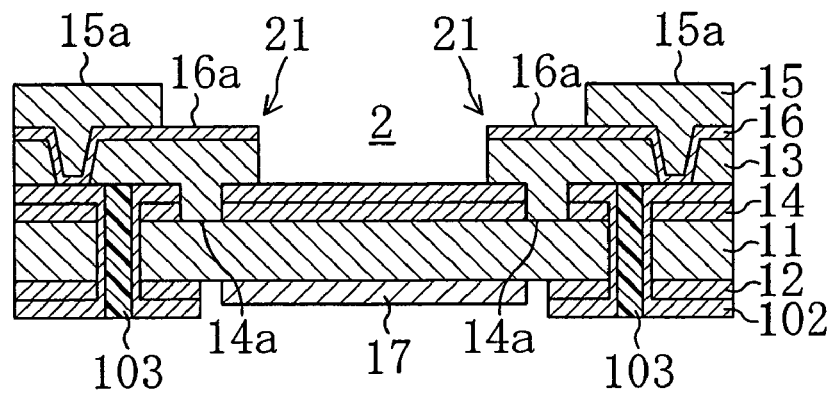
Figure 5C:
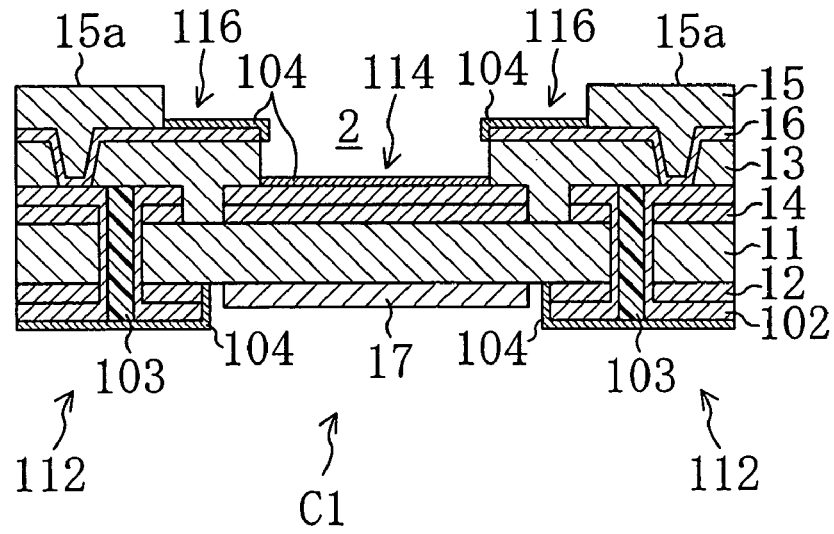

A base substrate S1 is manufactured through steps shown in FIGS. 3A to 4E, and then a laser light irradiation step shown in FIG. 5A is performed to obtain the optical device cavity structure C1 shown in FIG. 5C. The details will be described below.

1. Step of Forming Base Substrate S1

First, as shown in FIG. 3A, the first metal layer 12 is formed on the lower surface of the first insulator layer 11, and the second metal layer 14 is formed on the upper surface of the first insulator layer 11.

Then, the lower surface of the first metal layer 12 or the upper surface of the second metal layer 14 is irradiated with laser light at four positions, for each side of that plane, along a straight line generally parallel to the side. Thus, a total of 16 through hole portions 101, 101, . . . , are formed, as shown in FIG. 3B.

Then, as shown in FIG. 3C, the plating 102 is applied, by forming an Ni layer and then forming an Au layer on the surface of the Ni layer, on the lower surface of the first metal layer 12, the upper surface of the second metal layer 14 and the surface of each through hole portion 101.

Then, as shown in FIG. 3D, a resin is poured into each through hole portion with the plating 102 having been applied to the inner wall thereof, thereby forming the resin portion 103. Then, a plating (not shown) is applied on the resin portions 103 on the surface of the plating 102.

Then, an etching mask is formed partially over the lower surface of the first metal layer 12, which has been plated with the plating 102, and partially over the upper surface of the second metal layer 14, which has been plated with the plating 102, and the first metal layer 12 and the second metal layer 14 are partially etched away. Thus, as shown in FIG. 3E, a large portion of the first metal layer 12 is etched away to form the warp preventing depressed portion 12a at the center thereof, while leaving portions of the first metal layer 12 at a total of 16 positions, four along each side of the lower surface of the first insulator layer 11. Moreover, the generally-square-shaped etched portion 14a is formed in the second metal layer 14 on the inner side with respect to the resin portions 103.

Then, as shown in FIG. 4A, the second insulator layer 13 is formed on the upper surface of the second metal layer 14, which has been plated with the plating 102, and in the etched portion 14a.

Then, an etching mask is formed partially over the upper surface of the second insulator layer 13, and the second insulator layer 13 is etched. Thus, as shown in FIG. 4B, the 16 etched portions 13a, 13a, . . . , are formed on the outer side with respect to the resin portions 103, each corresponding to one of the resin portions 103.

Then, as shown in FIG. 4C, the third metal layer 16 is formed on the upper surface of the second insulator layer 13 and the surface of each etched portion 13a.

Then, an etching mask is formed partially over the upper surface of the third metal layer 16, and the third metal layer 16 is etched. Thus, as shown in FIG. 4D, a central portion of the third metal layer 16 is etched in a generally rectangular shape, whereas a total of 16 tongue-shaped portions 16a, 16a, . . . , are left unetched in the etched portion. The tongue-shaped portions 16a, 16a, . . . , are each extending from one side of the etched portion into the etched portion, with four tongue-shaped portions 16a being arranged along each side of the etched portion while being equally spaced apart from one another.

Then, as shown in FIG. 4E, the third insulator layer 15 is formed on the upper surface of the third metal layer 16 and on portions of the second insulator layer 13 that have been exposed through the etching process. Thus, the base substrate S1 is obtained.

2. Laser Light Irradiation Step

First, the entire upper surface of the base substrate S1 shown in FIG. 4E is irradiated with laser light. Specifically, a central portion of the upper surface of the base substrate S1 (specifically, a portion of the upper surface of the base substrate S1 where the third metal layer 16 is absent and portions thereof corresponding to the tongue-shaped portions 16a) is irradiated with laser light that is more powerful in terms of the laser intensity, or the like. In this process, a metal layer functions as a laser stop layer, whereas an insulator layer is removed by the laser light irradiation. Therefore, as shown in FIG. 5A, a portion of the second insulator layer 13 that is not covered by the third metal layer 16 and a portion of the third insulator layer 15 are removed, thereby forming the cavity portion 2 and the protruding portions 21, 21, . . . . It is preferred that the more powerful laser light is output under such laser irradiation conditions that the Rz value of the surface of the second metal layer 14 will be greater than or equal to 1 µm and less than or equal to 5 µm.

A periphery of the upper surface of the base substrate S1 is irradiated with laser light that is less powerful in terms of the laser intensity, or the like. With this laser light irradiation, the unetched portion of the upper surface of the third insulator layer 15 is roughened to be the light-transmitting member placement section 15a.

Then, as shown in FIG. 5B, the insulator layer 17 is formed in the warp preventing depressed portion 12a. Thus, it is possible to prevent shorting between the first terminal sections 112.

Then, the plating 104 is applied on the upper surface of the tongue-shaped portions 16a, 16a, . . . , thereby forming the second terminal sections 116, 116, . . . The plating 104 is applied on the upper surface of the second metal layer 14, which has been plated with the plating 102, thereby forming the chip placement section 114. The plating 104 is applied on the surface of the first metal layers 12, 12, . . . , thereby forming the first terminal sections 112, 112, . . . . It is possible to manufacture the optical device cavity structure C1 shown in FIG. 1 as described above.

The method for manufacturing the optical device cavity structure C1 has the following advantageous effects.

The optical device cavity structure C1 is obtained by removing unnecessary portions of insulator layers through laser light irradiation. Therefore, it is possible to manufacture the optical device cavity structure C1 without forming an isolation trench in advance.

In the optical device cavity structure C1, the cavity portion 2 is formed by laser irradiation, and the upper surface of the cavity portion 2 serves as the light-transmitting member placement section 15a. Therefore, as opposed to a conventional method for manufacturing an optical device cavity structure, it is not necessary to separate provide a step of forming ribs for placing a light-transmitting member.

—Method for Manufacturing Optical Device D1—

First, as shown in FIGS. 6A and 7A, the optical element chip 121 is bonded to the chip placement section 114 by using the adhesive 122.

Then, as shown in FIGS. 6B and 7B, the optical element chip 121 is electrically connected to the second terminal sections 116, 116, . . . , by using the 16 conductive threads 123, 123, . . . . In this process, it is preferred that the conductive threads 123, 123, . . . , are connected to the semiconductor element chip 121 and the second terminal sections 116, 116, . . . , by using a conductive adhesive (not shown). Then, the conductive threads 123, 123, . . . , are sealed with a resin (not shown).

Then, as shown in FIGS. 6C and 7C, the light-transmitting member 124 is bonded to the light-transmitting member placement section 15a by using an adhesive (not shown). Thus, the light-transmitting member 124 can be secured in close contact with the light-transmitting member placement section 15a. It is possible to manufacture the optical device D1 as described above.

Then, the first terminal sections 112, 112, . . . , are mounted on predetermined locations of the wiring substrate by using a conductive adhesive, thus obtaining an optical semiconductor device.

Other than the securing means A, the optical device cavity structure C1 may include means capable of visualizing the position of a first terminal section associated with a particular function. Optical device cavity structures C101 and C201 will now be described.

Variation 1

Figure 8:
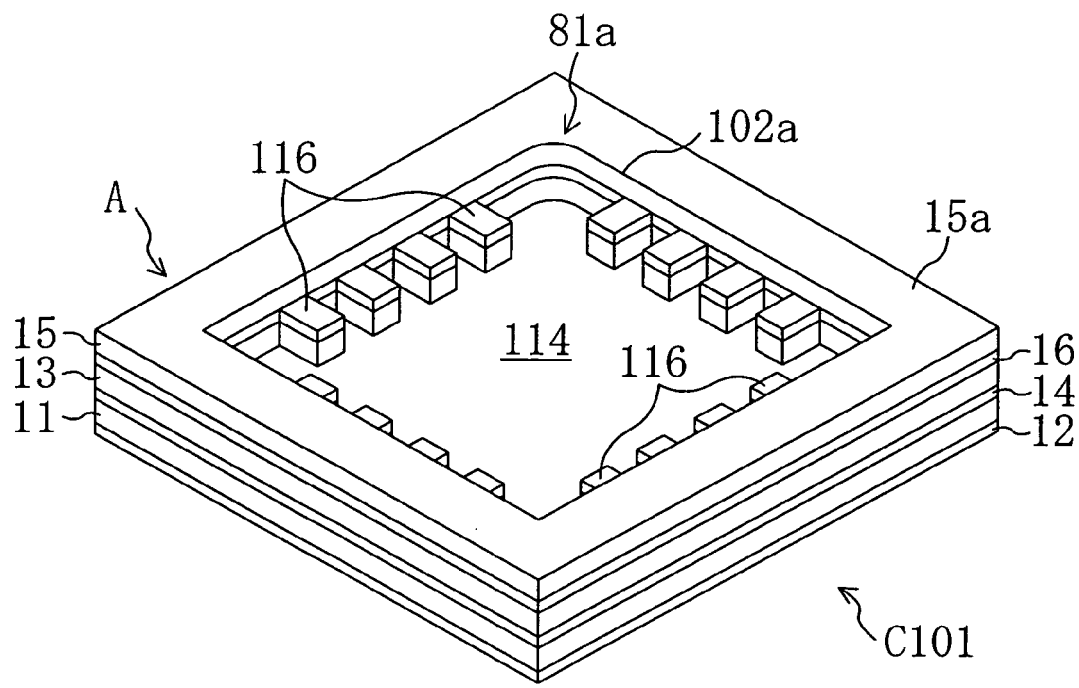
FIG. 8 is a perspective view showing the structure of an optical device cavity structure C101 according to Variation 1 of Embodiment 1.

FIG. 8 shows the optical device cavity structure C101 of Variation 1. With the optical device cavity structure C101, it is possible to identify the position of a first terminal section associated with a particular function by looking at the shape of an opening 102a of the cavity portion.

Specifically, the outline shape of the opening 102a of the cavity portion does not have point symmetry with respect to a generally center point of the opening 102a, as shown in FIG. 8. More specifically, one of the four corners of the rectangular opening 102a is in an arc shape (hereinafter an arc-shaped corner 81a will be referred to as "the non-point-symmetry portion 81a"). The non-point-symmetry portion 81a is formed at a position along the outline of the opening that is closest to the first terminal section associated with the particular function. Therefore, it is possible to identify the position of the first terminal section associated with the particular function by looking at the optical device cavity structure C101 from above the opening 102a.

The outline shape of the opening of the cavity portion is not limited to that specified above. For example, the outline of the opening may be a rectangular shape with one corner thereof being filled with a generally triangular prism.

Variation 2

Figure 9:
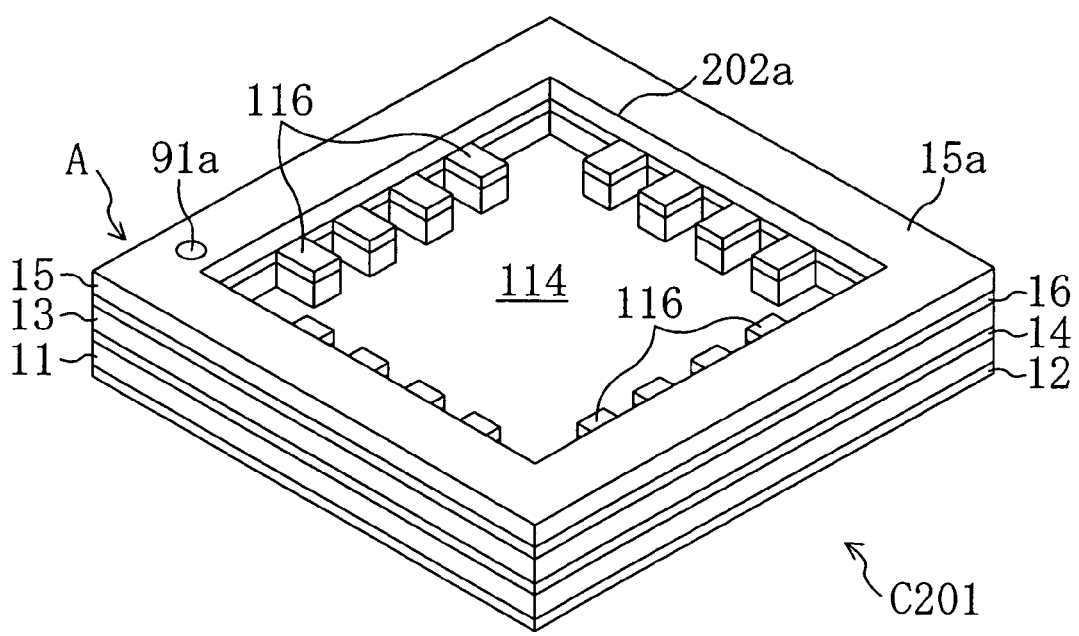
FIG. 9 is a perspective view showing the structure of an optical device cavity structure C201 according to Variation 2 of Embodiment 1.

FIG. 9 shows the optical device cavity structure C201 of Variation 2. With the optical device cavity structure C201, it is possible to identify the position of a first terminal section associated with a particular function by looking at the upper surface of the optical device cavity structure C201.

Specifically, a hole 91a is formed on the upper surface of the optical device cavity structure C201, as shown in FIG. 9, and the first terminal section associated with the particular function is located near the hole 91a. Therefore, it is possible to identify the first terminal section associated with the particular function by looking at the upper surface of the optical device cavity structure C201.

EMBODIMENT 2

Figure 10:
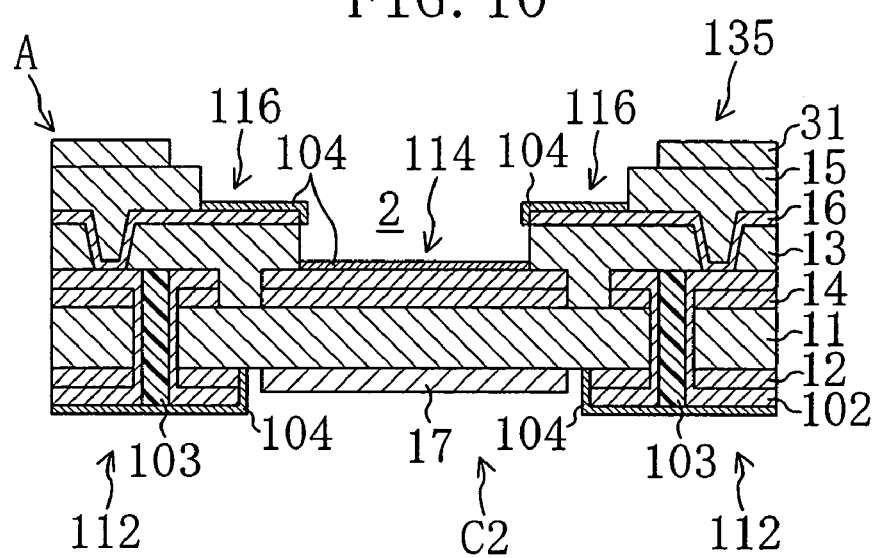
FIG. 10 is a cross-sectional view showing the structure of an optical device cavity structure C2 according to Embodiment 2.
Figure 11A:
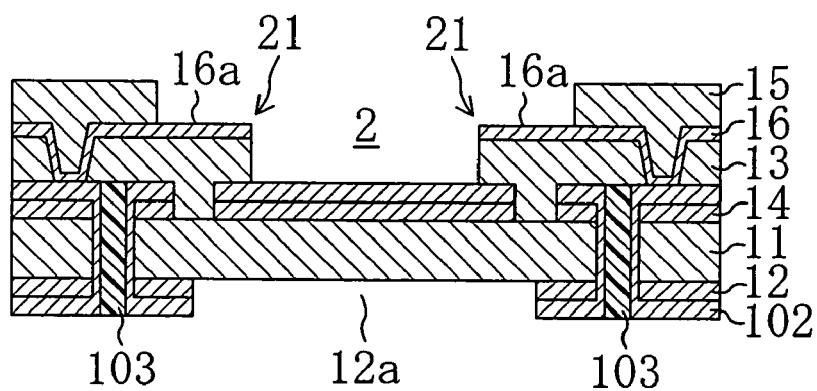
FIGS. 11A and 11B are cross-sectional views showing a part of the manufacturing process of the optical device cavity structure C2 according to Embodiment 2.
Figure 11B:
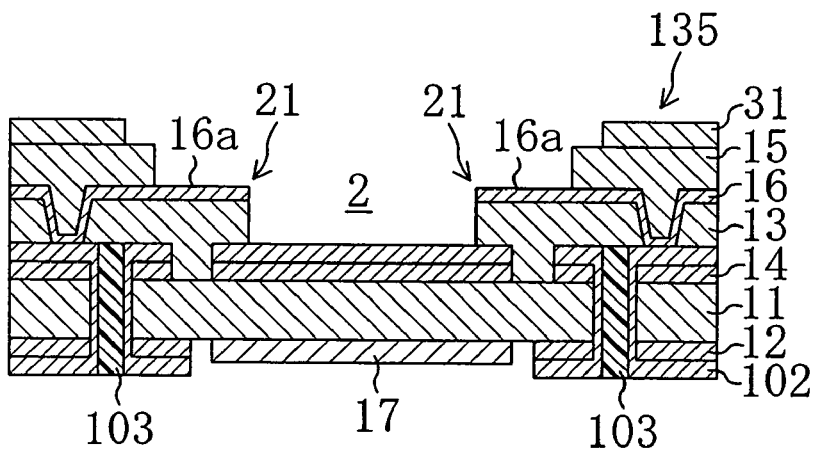

Referring to FIGS. 10 to 11B, the structure and manufacturing method of an optical device cavity structure C2 according to Embodiment 2 of the present invention will now be described. FIG. 10 is a cross-sectional view showing the structure of the optical device cavity structure C2. FIGS. 11A and 11B are cross-sectional views showing a part of the manufacturing process of the optical device cavity structure C2.

—Structure of Optical Device Cavity Structure C2—

As opposed to the optical device cavity structure C1 of Embodiment 1, the optical device cavity structure C2 includes a resist layer 31 formed on the surface of the third insulator layer 15, as shown in FIG. 10, with the upper surface of the resist layer 31 serving as a light-transmitting member placement section 135. Thus, since the light-transmitting member placement section 135 is the surface of the resist layer 31, the light-transmitting member 124 can be secured in close contact with the light-transmitting member placement section 135 in the optical device cavity structure C2.

The term "resist layer" as used herein refers to a layer that is formed on the foremost surface of the substrate in order to improve the resistance to shock, moisture and heat, e.g., to prevent corrosion of wirings or to prevent shorting between wirings (maintain the insulation reliability). A typical material of the resist layer is obtained by mixing an acrylic resin with an epoxy curing agent, and serves also as an insulator.

It is more preferred that the resist layer 31 is formed on the roughened surface of the third insulator layer, whereby it is possible to more firmly secure the light-transmitting member 124.

—Method for Manufacturing Optical Device Cavity Structure C2—

First, a base substrate of the optical device cavity structure C2 is manufactured through steps shown in FIGS. 3A to 4E as described above in Embodiment 1.

Then, a central portion of the base substrate (specifically, a portion of the surface of the base substrate S1 where the third metal layer 16 is absent and portions thereof corresponding to the tongue-shaped portions 16a) is irradiated with laser light. Then, as shown in FIG. 11A, a portion of the third insulator layer 15 irradiated with laser light and a portion of the second insulator layer 13 that is not covered by the third metal layer 16 are removed.

Then, as shown in FIG. 11B, the resist layer 31 is formed on the surface of the third insulator layer 15. Thus, the light-transmitting member placement section 135 is obtained.

Thereafter, the plating process shown in FIG. 5C is performed as described above in Embodiment 1, thereby obtaining the optical device cavity structure C2 shown in FIG. 10, and the steps shown in FIGS. 6A to 7C are performed, thereby obtaining an optical device (not shown) including the optical device cavity structure C2.

EMBODIMENT 3

Figure 12:
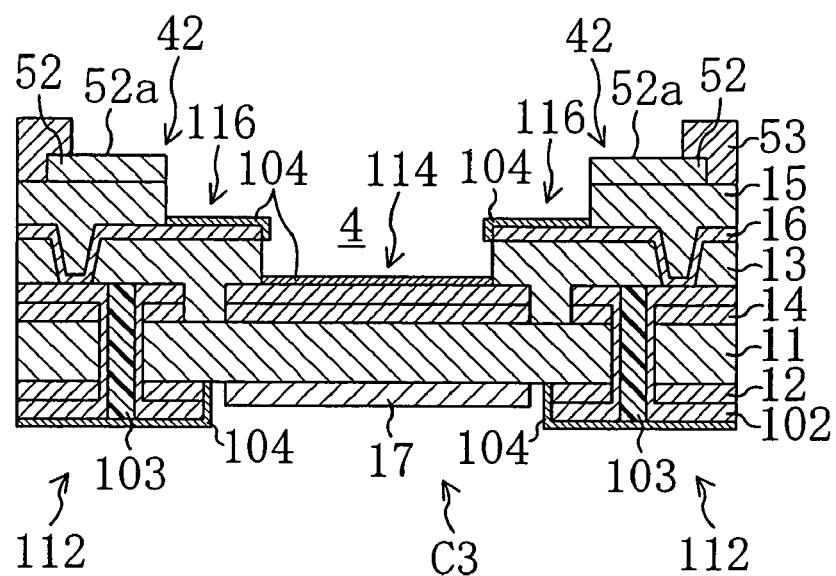
FIG. 12 is a cross-sectional view showing the structure of an optical device cavity structure C3 according to Embodiment 3.

Referring to FIGS. 12 to 14C, the structure and manufacturing method of an optical device cavity structure C3 and those of an optical device D3 according to Embodiment 3 of the present invention will now be described. FIG. 12 is a cross-sectional view showing the structure of the optical device cavity structure C3. FIGS. 13A to 14C are cross-sectional views showing the manufacturing process of the optical device cavity structure C3 and that of the optical device D3.

—Structure of Optical Device Cavity Structure C3—

As opposed to the optical device cavity structure C1 of Embodiment 1, the optical device cavity structure C3 includes a fourth metal layer 52 and a fourth insulator layer 53 layered in this order on the third insulator layer 15, as shown in FIG. 12. The fourth metal layer 52 is preferably a Cu layer, and the fourth insulator layer 53 is preferably an insulator layer containing a moisture-absorbing porous material.

The inner wall surface of a cavity portion 4 is formed by the second insulator layer 13, the third metal layer 16, the third insulator layer 15, the fourth metal layer 52 and the fourth insulator layer 53, which are layered in this order from the bottom surface toward the opening, and a total of 16 first protruding portions 41, 41, . . . , and one second protruding portion 42 are formed along the inner wall surface. The first protruding portions 41, 41, . . . , are formed on the inner wall surface, four on each side, while being equally spaced apart from one another so that the second insulator layer 13 and the third metal layer 16 are flush with each other along the three side surfaces of each protruding portion. The second protruding portion 42 protrudes over a shorter distance than the first protruding portions 41, and the third insulator layer 15 and the fourth metal layer 52 are flush with each other along the three side surfaces of the protruding portion.

A light-transmitting member placement section 52a of the present embodiment is the surface of the second protruding portion 42, and is thus formed in the cavity portion 4. Therefore, as compared with the optical device cavity structure C1, the optical device cavity structure C3 can provide a compact optical device.

—Method for Manufacturing Optical Device Cavity Structure C3—

First, a layered structure as shown in FIG. 4E is formed by the method shown in FIGS. 3A to 3E and 4A to 4E as described above in Embodiment 1.

Then, the fourth metal layer 52 is formed on the surface of the third insulator layer 15, after which an etching mask is formed over a large portion of the surface of the fourth metal layer 52 and an etching process is performed. Thus, it is possible to form the fourth metal layer 52 near a peripheral portion of the surface of the third insulator layer 15, as shown in FIG. 13A.

Figure 13A:
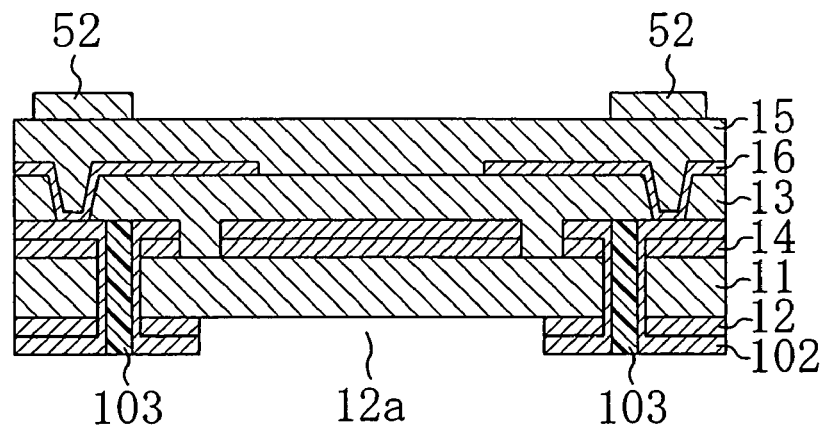
FIGS. 13A and 13B are cross-sectional views showing a part of the manufacturing process of the optical device cavity structure C3 according to Embodiment 3.
Figure 13B:
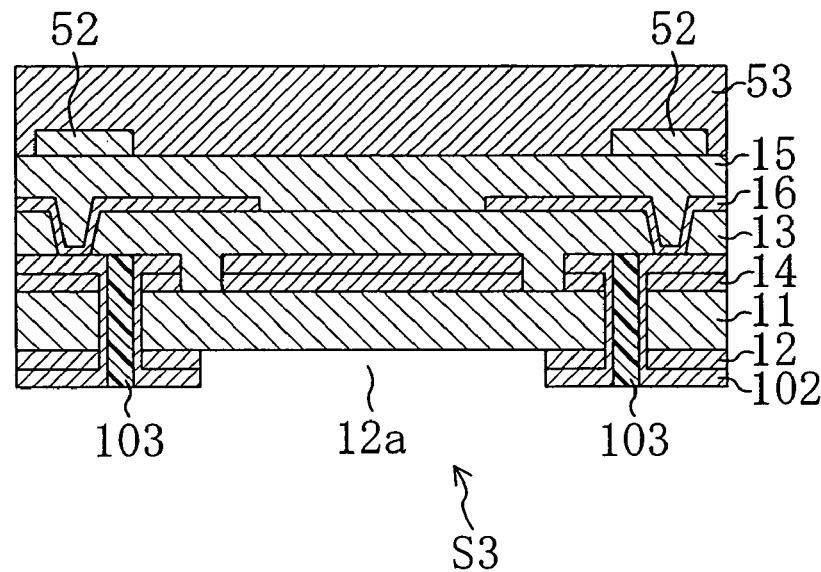

Then, the fourth insulator layer 53 is formed on the surface of the fourth metal layer 52 and on a portion of the surface of the third insulator layer 15 that has been exposed through the etching process of FIG. 13A. Thus, it is possible to obtain a base substrate S3 of the optical device cavity structure C3 as shown in FIG. 13B.

Figure 14A:
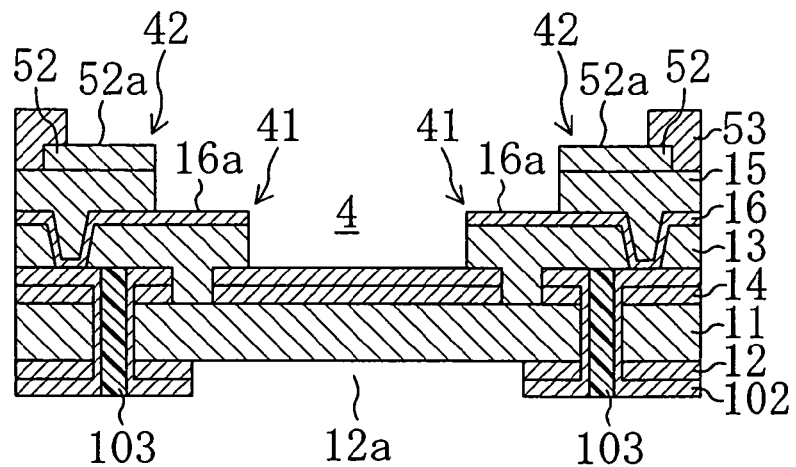
FIGS. 14A to 14C are cross-sectional views showing a part of the manufacturing process of an optical device D3 according to Embodiment 3.

Then, a central portion of the base substrate S3 (specifically, a portion of the surface of the base substrate S3 where the third metal layer 16 is absent and portions thereof corresponding to the tongue-shaped portion 16a and a peripheral portion of the tongue-shaped portion 16a) is irradiated with laser light. Then, as shown in FIG. 14A, a portion of the second insulator layer 13 that is not covered by the third metal layer 16 and a portion of the third insulator layer 15 are removed, thereby forming the cavity portion 2 and the first protruding portions 41, 41, . . . . Moreover, a portion of the fourth insulator layer 53 is removed to form the second protruding portion 42, thus forming the light-transmitting member placement section 52a.

Then, the plating process shown in FIG. 5C is performed as described above in Embodiment 1, thereby obtaining the optical device cavity structure C3 shown in FIG. 12.

Figure 14B:
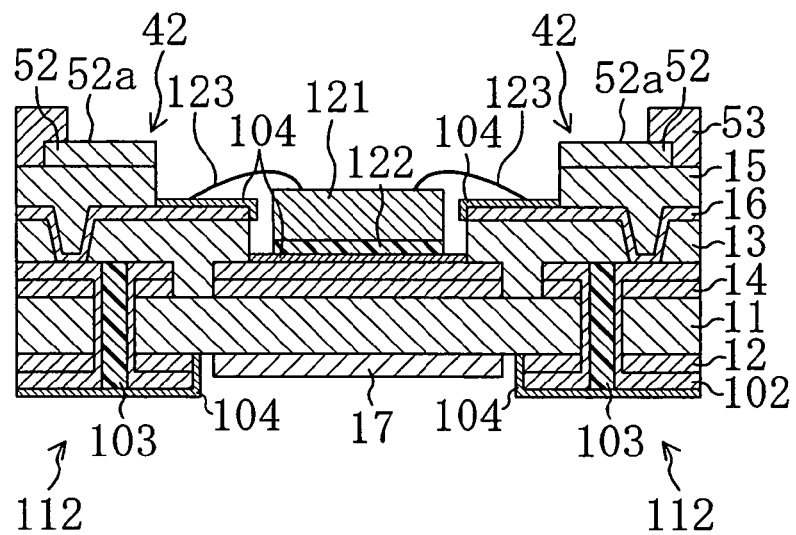

Then, as shown in FIG. 14B, the optical element chip 121 is secured on the chip placement section 114 by using the adhesive 122, and the second terminal sections 116, . . . , and the optical element chip 121 are electrically connected to each other by using the conductive threads 123, 123, . . . .

Figure 14C:
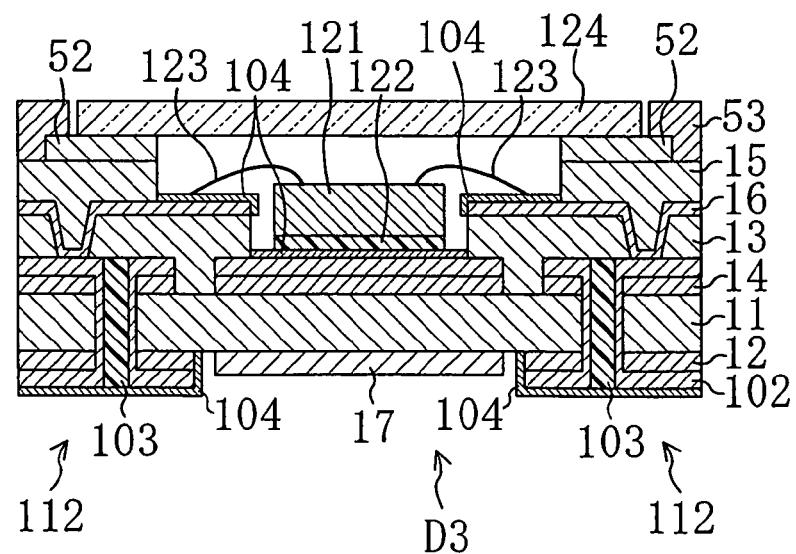

Then, as shown in FIG. 14C, the light-transmitting member 124 is placed on the light-transmitting member placement section 52a. Thus, it is possible to obtain the optical device D3.

EMBODIMENT 4

Figure 15:
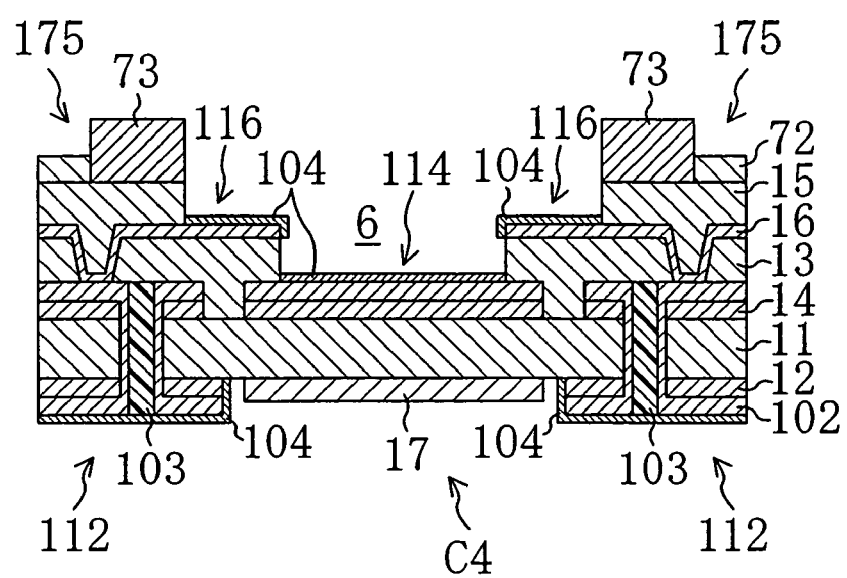
FIG. 15 is a cross-sectional view showing the structure of an optical device cavity structure C4 according to Embodiment 4.
Figure 16A:
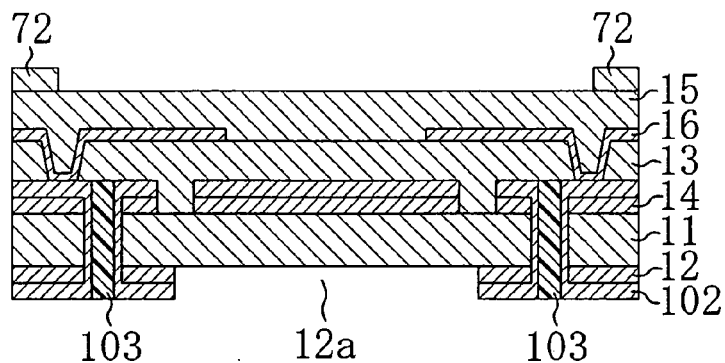
FIGS. 16A to 16C are cross-sectional views showing a part of the manufacturing process of the optical device cavity structure C4 according to Embodiment 4.
Figure 16B:
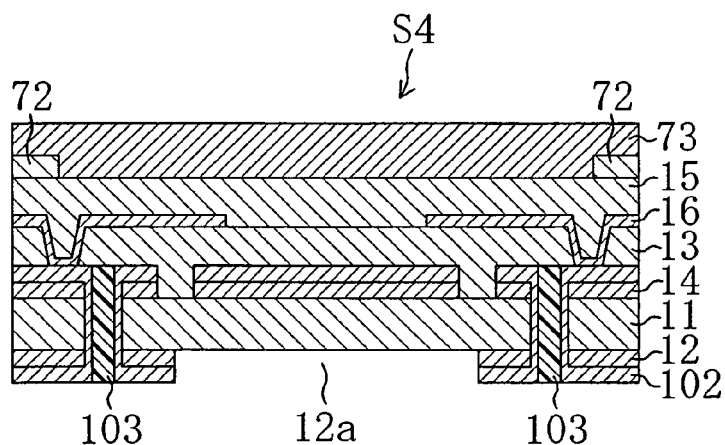
Figure 16C:
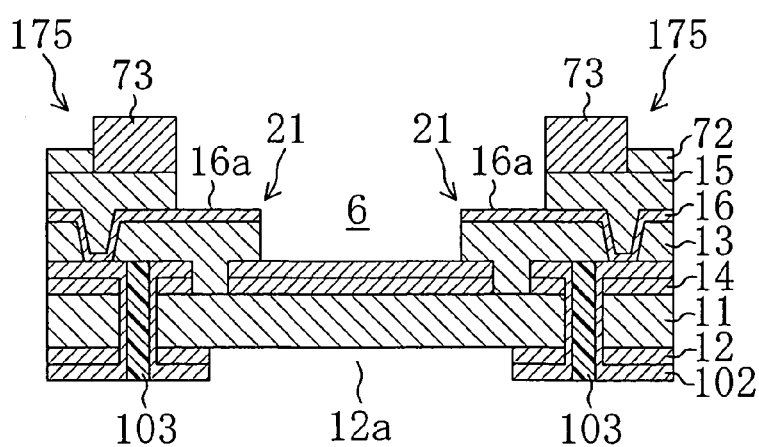
Figure 17:
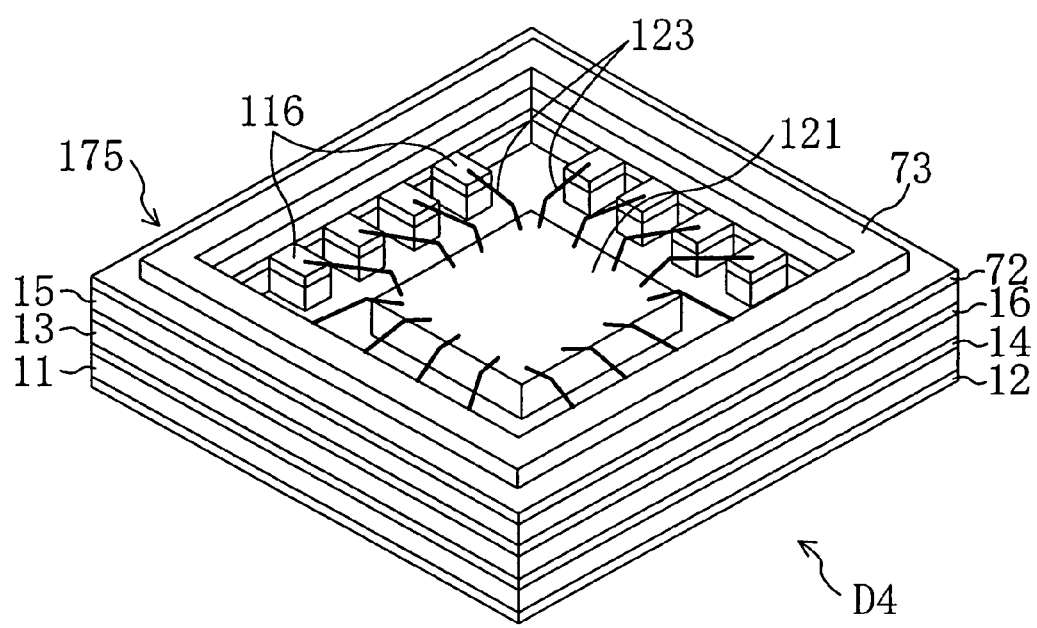
FIG. 17 is a perspective view showing an optical device D4 according to Embodiment 4.

Referring to FIGS. 15 to 17, the structure and manufacturing method of an optical device cavity structure C4 and those of an optical device D4 according to Embodiment 4 of the present invention will now be described. FIG. 15 is a cross-sectional view showing the structure of the optical device cavity structure C4. FIGS. 16A and 16B are cross-sectional views showing the manufacturing process of the optical device cavity structure C4. FIG. 17 is a perspective view showing the optical device D4.

—Structure of Optical Device Cavity Structure C4—

As opposed to the optical device cavity structure C1 of Embodiment 1, the optical device cavity structure C4 includes a fourth metal layer 72 and a fourth insulator layer 73 layered in this order on the third insulator layer 15, as shown in FIG. 15. The fourth metal layer 72 is preferably a Cu layer, and the fourth insulator layer 73 is preferably an insulator layer containing a moisture-absorbing porous material. The optical device cavity structure C4 includes an optical component fitting section 175, instead of a light-transmitting member placement section.

The inner wall surface of a cavity portion 6 is substantially the same as that of the cavity portion 2 of Embodiment 1, and is formed by the second insulator layer 13, the third metal layer 16 and the third insulator layer 15, which are layered in this order from the bottom surface toward the opening.

The optical component fitting section 175 is a section in which an optical component such as a lens barrel is to be fitted, and is formed so as to surround the opening of the cavity portion 6. The lower surface thereof is a part of the fourth metal layer 72.

—Method for Manufacturing Optical Device Cavity Structure C4—

First, a layered structure as shown in FIG. 4E is formed by the method shown in FIGS. 3A to 3E and 4A to 4E as described above in Embodiment 1.

Then, the fourth metal layer 72 is formed on the surface of the third insulator layer 15, after which an etching mask is formed over a central portion of the surface of the fourth metal layer 72 and an etching process is performed. Thus, it is possible to form the fourth metal layer 72 along the periphery of the upper surface of the third insulator layer 15, as shown in FIG. 16A.

Then, the fourth insulator layer 73 is formed on the surface of the fourth metal layer 72 and a portion of the surface of the third insulator layer 15 that has been exposed through the etching process of FIG. 16A. Thus, it is possible to obtain a base substrate S4 as shown in FIG. 16B.

Then, as described above in Embodiment 1, a central portion of the surface of the base substrate S4 is irradiated with laser light, thereby forming the cavity portion 6 and the protruding portions 21, 21, . . . . Moreover, the periphery of the surface of the base substrate S4 is irradiated with laser light, thereby removing a portion of the fourth insulator layer 73 and thus exposing the fourth metal layer 72. Thus, the optical component fitting section 175 is obtained.

Thereafter, the plating process shown in FIG. 5C is performed as described above in Embodiment 1, thereby obtaining the optical device cavity structure C4 as shown in FIG. 15.

Then, the optical element chip 121 is secured on the chip placement section 114 by using an adhesive, the second terminal sections 116, 116, . . . , and the optical element chip 121 are electrically connected to each other by using the conductive threads 123, 123, . . . , and an optical component (not shown) is placed on an optical component placement section 175. Thus, it is possible to obtain the optical device D4 as shown in FIG. 17.

EMBODIMENT 5

Figure 18A:
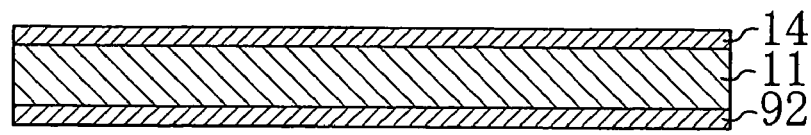
FIGS. 18A to 18D are cross-sectional views showing a part of the manufacturing process of an optical device cavity structure C5 according to Embodiment 5.
Figure 18B:
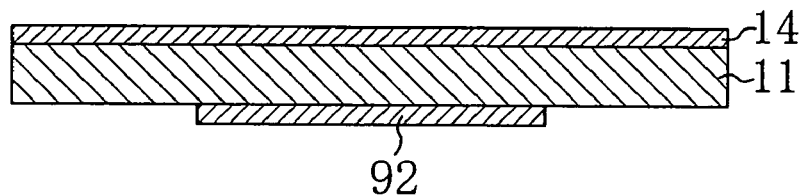
Figure 18C:
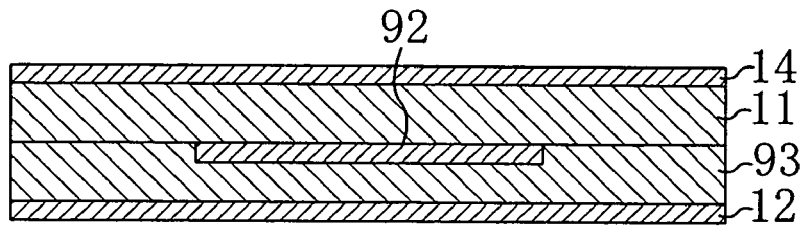
Figure 18D:
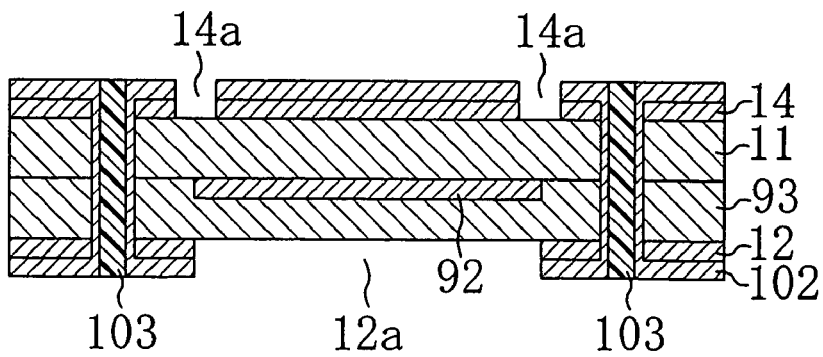
Figure 19A:
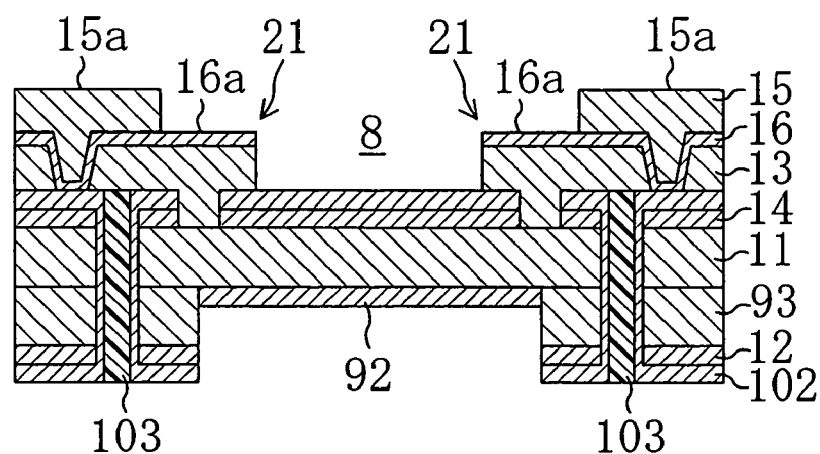
FIGS. 19A and 19B are cross-sectional views showing another part of the manufacturing process of the optical device cavity structure C5 according to Embodiment 5.
Figure 19B:
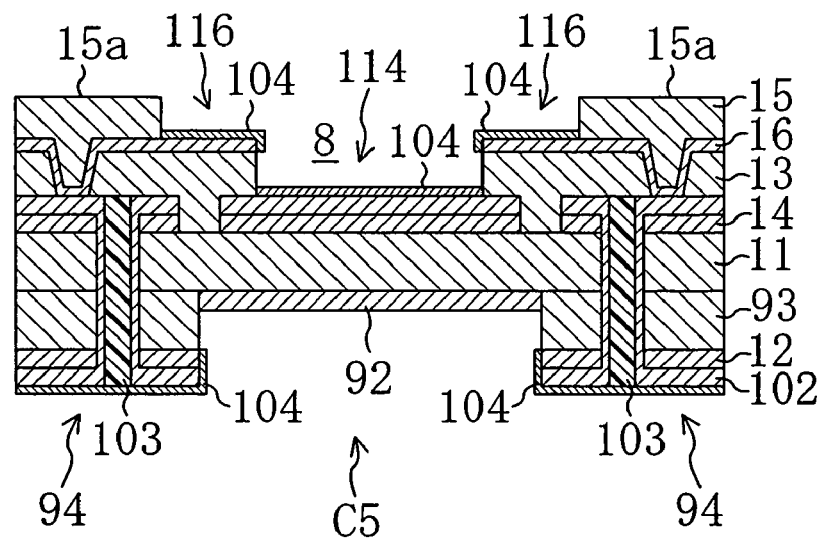
Figure 20:
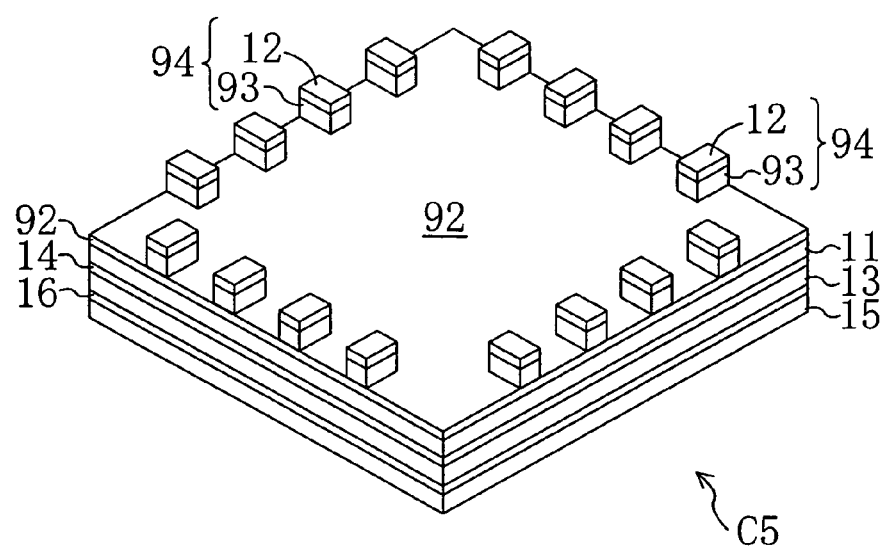
FIG. 20 is a perspective view showing the reverse surface side of the optical device cavity structure C5 according to Embodiment 5.

Referring to FIGS. 18A to 20, the structure and manufacturing method of an optical device cavity structure C5 according to Embodiment 5 of the present invention will now be described. FIGS. 18A to 19B are cross-sectional views showing the manufacturing process of the optical device cavity structure C5, and FIG. 20 is a perspective view showing the reverse surface side of the optical device cavity structure C5.

—Structure of Optical Device Cavity Structure C5—

As opposed to the optical device cavity structure C1 of Embodiment 1, the optical device cavity structure C5 includes a standoff insulator layer 93 and a standoff metal layer 92 layered between the first metal layer 12 and the first insulator layer 11. The standoff metal layer 92 is preferably a Cu layer, and the standoff insulator layer 93 is preferably an insulator layer containing a moisture-absorbing porous material.

The inner wall surface of a cavity portion 8 is substantially the same as that of the cavity portion 2 of Embodiment 1, and is formed by the second insulator layer 13, the third metal layer 16 and the third insulator layer 15, which are layered in this order from the bottom surface toward the opening.

As shown in FIG. 20, a first terminal section 94 is formed by the standoff insulator layer 93 and the first metal layer 12, and is protruding from the standoff metal layer 92. Therefore, as opposed to the optical device cavity structures C1, C2, C3 and C4 described above, the optical device cavity structure C5 can be firmly secured on the wiring substrate.

—Method for Manufacturing Optical Device Cavity Structure C5—

First, as shown in FIG. 18A, the second metal layer 14 is formed on the upper surface of the first insulator layer 11, and the standoff metal layer 92 is formed on the lower surface of the first insulator layer 11.

Then, although not shown in the drawings, an etching mask is formed partially over the lower surface of the standoff metal layer 92, and the standoff metal layer 92 is etched. Thus, the standoff metal layer 92 is left unetched at the center of the reverse surface of the first insulator layer 11, as shown in FIG. 18B.

Then, as shown in FIG. 18C, the standoff insulator layer 93 is formed on the reverse surface of the standoff metal layer 92 and a portion of the reverse surface of the first insulator layer 11 that has been exposed through the etching process of FIG. 18B, and the first metal layer 12 is formed on the reverse surface of the standoff insulator layer 93.

Then, the plating 102, the resin layer 103, the warp preventing depressed portion 12a and the etched portion 14a are formed by substantially the same method as that of Embodiment 1 shown FIGS. 3D and 3E. Thus, it is possible to obtain a layered structure as shown in FIG. 18D.

Then, steps as shown in FIGS. 4A to 4E are performed as described above in Embodiment 1 to obtain a base substrate of the optical device cavity structure C5.

Then, the upper surface and the reverse surface of the base substrate are irradiated with laser light. In this process, the upper surface of the base substrate is irradiated with laser light by substantially the same method as the laser irradiation step of Embodiment 1, whereas the reverse surface of the base substrate is irradiated with laser light of substantially the same intensity across the reverse surface. As the reverse surface of the base substrate is irradiated with laser light, a portion of the standoff insulator layer 93 where the first metal layer 12 is absent is removed, thereby exposing the standoff metal layer 92.

Then, the plating process shown in FIG. 5C is performed as described above in Embodiment 1, thereby forming the first terminal section 94, the chip placement section 114, the first terminal section 94 and the second terminal sections 116, 116, . . . , thus obtaining the optical device cavity structure C5 as shown in FIG. 19B.

EMBODIMENT 6

Figure 21:
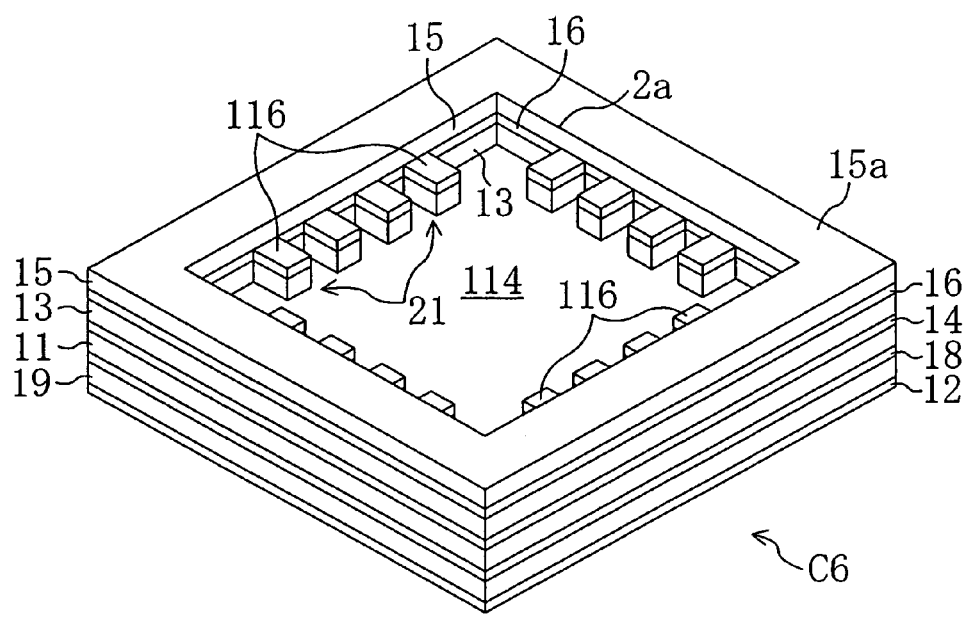
FIG. 21 is a perspective view showing the structure of an optical device cavity structure C6 according to Embodiment 6.
Figure 22A:
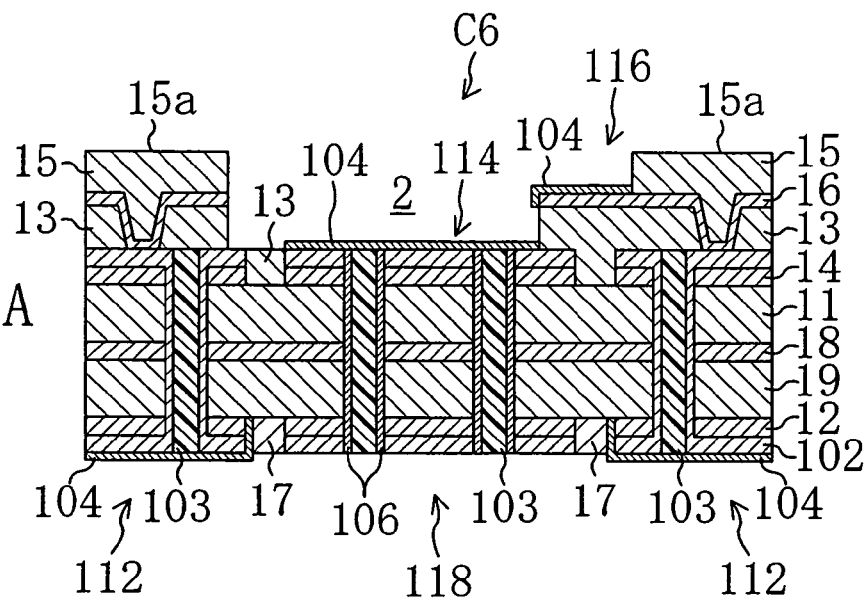
FIG. 22A is a cross-sectional view showing the structure of the optical device cavity structure C6 according to Embodiment 6.
Figure 22B:
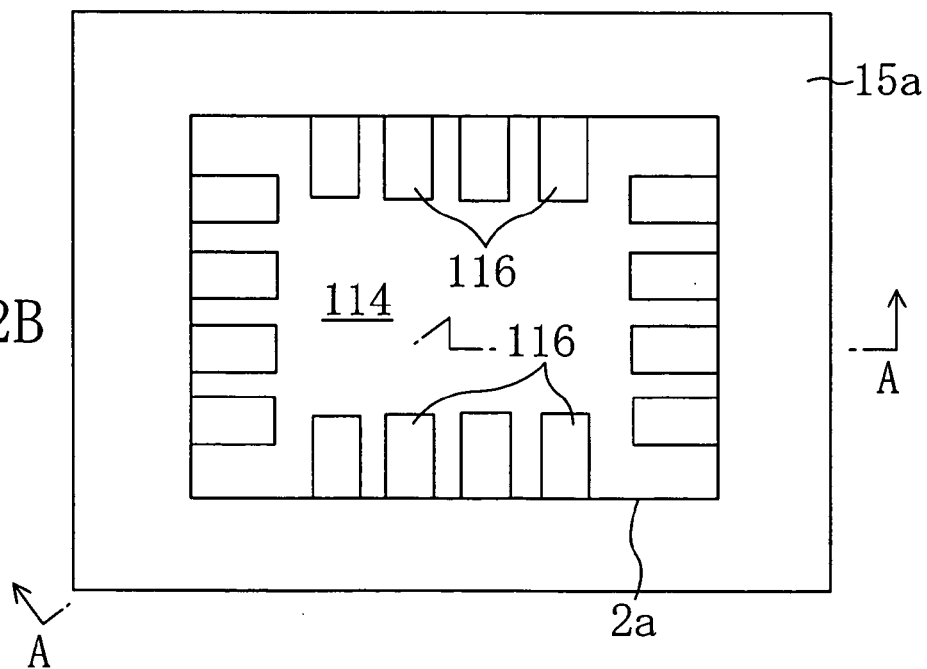
FIG. 22B is a plan view thereof.

Referring to FIGS. 21 to 27C, the structure and manufacturing method of an optical device cavity structure C6 and those of an optical device D6 according to Embodiment 6 of the present invention will now be described. FIGS. 21 to 22B are perspective views and a cross-sectional view showing the structure of the optical device cavity structure C6. FIG. 22A is a cross-sectional view taken along line IIA-IIA of FIG. 22B. FIGS. 23A to 2SC are cross-sectional views showing the manufacturing process of the optical device cavity structure C6. FIGS. 26A to 27C are cross-sectional views and perspective views showing the manufacturing process of the optical device D6.

—Structure of Optical Device Cavity Structure C6—

As shown in FIGS. 21 to 22B, the optical device cavity structure C6 includes the first metal layer 12, a warp preventing insulator layer 19, a warp preventing metal layer 18, the first insulator layer 11, the second metal layer 14, the second insulator layer 13, the third metal layer 16 and the third insulator layer 15, which are layered in this order from the mounting surface thereof (the lower surface of FIG. 21) on which it is mounted on a wiring substrate, and includes the cavity portion 2, the 16 second terminal sections 116, 116, . . . , the chip placement section 114, the light-transmitting member placement section 15a, the 16 first terminal sections 112, 112, . . . , a first heat-radiating section 118 and a second heat-radiating portion 106. It is preferred that the warp preventing insulator layer 19, the first insulator layer 11, the second insulator layer 13 and the third insulator layer 15 contain a moisture-absorbing porous material (not shown). Then, the optical device cavity structure C6 has a condensation preventing function. Moreover, it is preferred that the first metal layer 12, the warp preventing metal layer 18, the second metal layer 14 and the third metal layer 16 are each a Cu layer. Then, it is possible to manufacture the optical device cavity structure C6 by laser light irradiation.

As shown in FIG. 22A, the cavity portion 2 includes the generally rectangular opening 2a at the center of the upper surface, and is made by taking the material away in a generally rectangular parallelepiped shape. As shown in FIG. 22A, the bottom surface is formed by the plating 104 applied on the upper surface of a central portion of the second metal layer 14. The inner wall surface is formed by the second insulator layer 13, the third metal layer 16 and the third insulator layer 15, which are layered in this order from the bottom surface toward the opening 2a, and a total of 16 protruding portions 21, 21, . . . , are formed along the inner wall surface. The protruding portions 21, 21, . . . , are formed on the inner wall surface, four on each side, while being equally spaced apart from one another so that the second insulator layer 13 and the third metal layer 16 are flush with each other along the three side surfaces of each protruding portion.

As shown in FIGS. 21 to 22B, the second terminal sections 116, 116, . . . , are formed by applying the plating 104 on the upper surface and the side surface of the third metal layer 16 in the protruding portions 21, 21, . . . , of the cavity portion 2.

As shown in FIG. 22, the chip placement section 114 is formed by applying the plating 104 on the bottom surface of the cavity portion 2. As stated above to be the second element of an optical semiconductor device, it is preferred that the chip placement section 114 has a high degree of flatness. Specifically, it is formed so that the surface has an Rz value greater than or equal to 1 μm and less than or equal to 5 μm. Thus, it is possible to place the optical element chip 121 on the chip placement section 114 so as to be generally parallel to the mounting surface. Thus, an optical component such as a lens barrel can be placed, without being tilted, on the optical device in which the optical element chip 121 is placed on the chip placement section 114.

The chip placement section 114 is formed so that the distance between the chip placement section 114 and the upper surface of the second terminal sections 116, 116, . . . , is less than or equal to the thickness of the semiconductor element chip 121, i.e., so that the distance is greater than or equal to 50 μm and less than or equal to 575 μm. If the distance is less than 50 μm, the thickness of the second insulator layer 13 will be too small, thereby making it difficult to provide the second insulator layer 13. If the distance is greater than 575 μm, the upper surface of the second terminal section 116 will be above the optical plane of the semiconductor element chip 121. As a result, light diffusively reflected by the surface of conductive threads 123, 123, . . . , may be received by the semiconductor element chip 121, or light emitted from the semiconductor element chip 121 may be diffusively reflected by the surface of the conductive threads 123, 123, . . . , so as to be output from the optical device cavity structure C6. Thus, it is preferred that the distance is greater than or equal to 50 μm and less than or equal to 575 μm. In many cases, the actual thickness of the semiconductor element chip 121 is a value within the range from 100 μm to 200 μm.

As shown in FIG. 21, the light-transmitting member placement section 15a is at least a portion of the surface of the third insulator layer 15, and includes securing means for securing the light-transmitting member 124 to be described later. The securing means is the roughened surface of the third insulator layer 15. Thus, the light-transmitting member 124 can be secured in close contact with the light-transmitting member placement section 15a. The method for roughening the surface is not limited to any particular method as long as the roughened surface has an Rz value greater than or equal to 5 μm and less than or equal to 20 μm, preferably an Rz value greater than or equal to 10 μm and less than or equal to 20 μm, more preferably an Rz value greater than or equal to 15 μm and less than or equal to 20 μm, whereby the light-transmitting member 124 can be very firmly secured in close contact with the light-transmitting member placement section 15a. It is more preferred that the light-transmitting member 124 is placed on the light-transmitting member placement section 15a via an adhesive, whereby the light-transmitting member 124 can be even more firmly secured in close contact with the light-transmitting member placement section 15a.

The first terminal sections 112, 112, . . . , are the same as those described above in Embodiment 1. Specifically, the first terminal sections 112, 112, . . . , are formed around the mounting surface, four on each side, while being equally spaced apart from one another. As shown in FIG. 22A, the plating 102 is applied on the surface of the first metal layer 12 and the plating 104 is applied on the surface of the plating 102 to form the first terminal sections 112, 112, . . . . The platings 102 and 104 are each formed by layering an Au layer on the surface of an Ni layer.

The first terminal sections 112 and the second terminal sections 116 are electrically connected to each other. Specifically a total of 16 through holes 101, 101, . . . , (shown in FIG. 23B) are formed so as to run through the first metal layer 12, an insulator layer 19, the warp preventing metal layer 18, the first insulator layer 11 and the second metal layer 14, and the plating 102 is applied on the inner wall surface of each through hole 101, the surface of the first metal layer 12 and the surface of the second metal layer 14. A total of 16 etched portions 13a, 13a, . . . , (shown in FIG. 24B) are formed in the second insulator layer 13 on the outer side with respect to the through holes 101, 101, . . . , each corresponding to one of the through holes 101, 101, . . . .

Thus, the second metal layer 14 and the third metal layer 16 are in contact with each other in each etched portion 13a, as shown in FIG. 22A. As described above, each first terminal section 112 is electrically connected to the second metal layer 14 via the plating 102, and the second metal layer 14 is electrically connected to the third metal layer 16 in each etched portion 13a. Thus, each first terminal section 112 is electrically connected to a corresponding one of the second terminal sections 116.

An etched portion 14a having a generally-square-shaped bottom surface (shown in FIG. 23E) is formed in the second metal layer 14 on the inner side with respect to the through holes 101, 101, . . . . Therefore, the chip placement section 114 will not be electrically connected to the first terminal sections 112. The resin portion 103 is formed on the plating 102 inside each through hole 101.

As shown in FIG. 22A, the first heat-radiating section 118 is a portion of the first metal layer 12, and is formed on the mounting surface via the first terminal section 112 and an insulator section 17.

The second heat-radiating portion 106 is a metal portion and, as shown in FIG. 22A, is formed so as to cover the side surface of the resin portion 103, with the resin portion 103 running through the first heat-radiating section 118, the insulator layer 19, the warp preventing metal layer 18, the first insulator layer 11 and the second metal layer 14. Thus, the second heat-radiating portion 106 is connecting the chip placement section 114 and the first heat-radiating section 118 with each other. Thus, heat generated in the optical element chip when receiving or emitting light is transmitted from the chip placement section 114 to the second heat-radiating portion 106 and the first heat-radiating section 118, and is radiated from the first heat-radiating section 118.

The optical device cavity structure C6 has the following advantageous effects.

It is possible to secure the light-transmitting member 124 in close contact with the light-transmitting member placement section 15a.

It is possible to prevent light to be received by, or light to be emitted from, the optical element chip 121 from being diffusively reflected by the surface of the conductive threads 123, 123, . . . .

It is possible to prevent the optical device cavity structure C6 from warping toward the mounting surface due to the formation of the cavity portion 2.

It is possible to prevent, with desirable moisture absorbency, the mounted light-transmitting member from being fogged.

With a conventional optical device cavity structure, it is necessary to provide ribs in order to place a light-transmitting member, an optical component, etc., while being spaced apart from an optical element chip. In contrast, with the optical device cavity structure C6, it is not necessary to additionally provide ribs because the second and third insulator layers 13 and 15 and the third metal layer 16 layered above the chip placement section 114 function as ribs.

In the optical device cavity structure C6, the warp preventing metal layer 18 is provided on the mounting surface side of the chip placement section 114. Thus, it is possible to better prevent the chip placement section 114 from warping and to place the optical element chip 121 on the chip placement section 114 with the optical plane being generally parallel to the mounting surface, than with the optical device cavity structure C1 of Embodiment 1.

Since the optical device cavity structure C6 includes the first heat-radiating section 118 and the second heat-radiating portion 106, it is possible to provide an optical device having a desirable heat-radiating property.

—Structure of Optical Device D6—

Figure 26A:
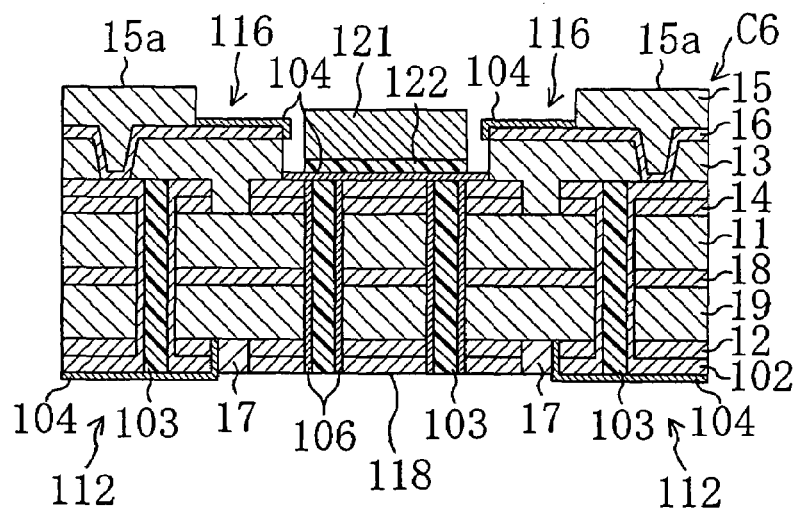
FIGS. 26A to 26C are cross-sectional views showing the manufacturing process of an optical device D6 according to Embodiment 6.
Figure 26B:
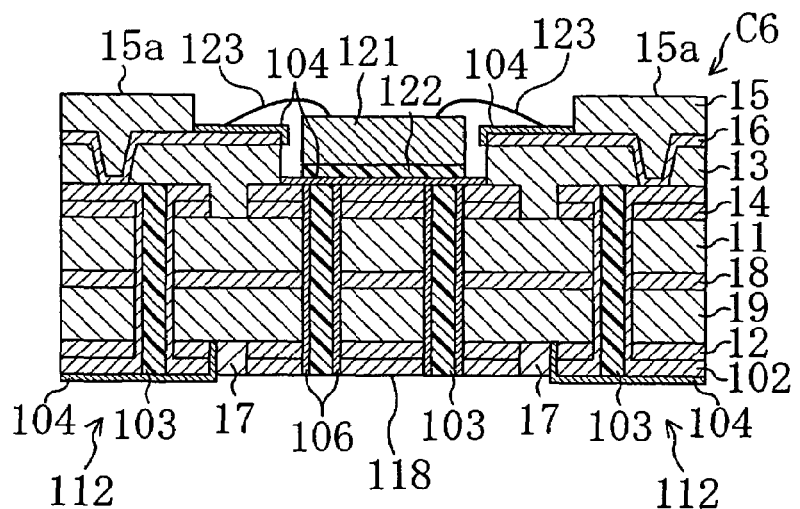
Figure 26C:
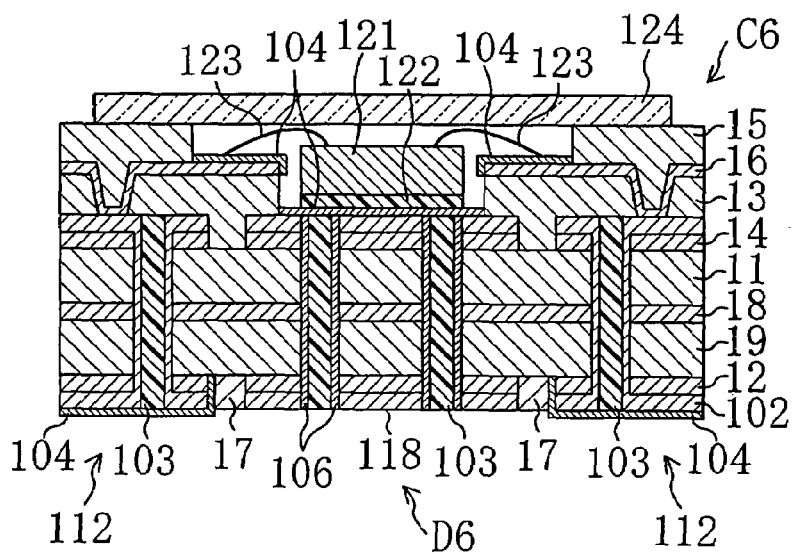
Figure 27A:
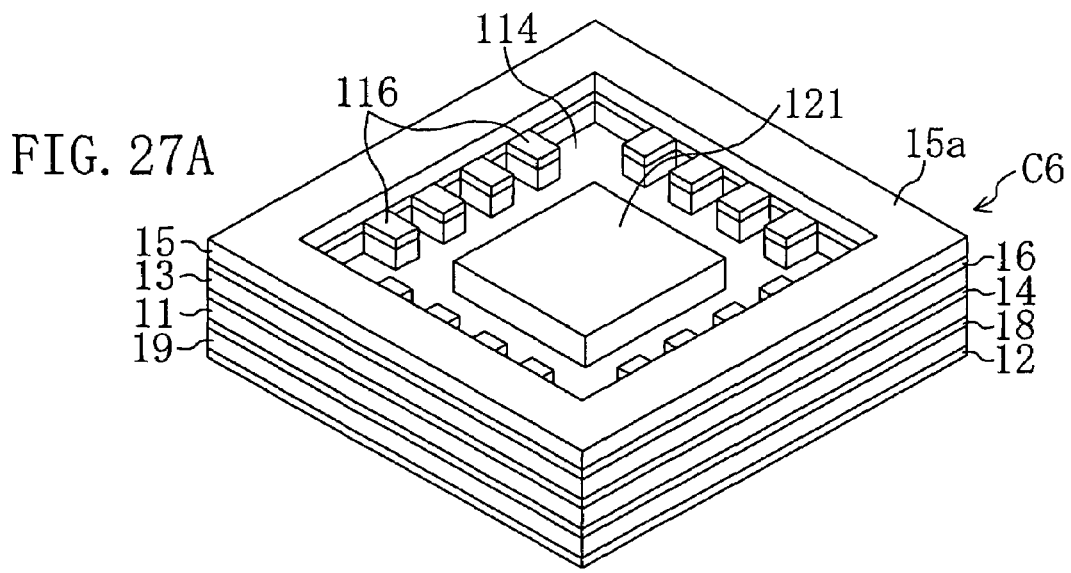
FIGS. 27A to 27C are diagrams showing the manufacturing process of the optical device D6 according to Embodiment 6.
Figure 27B:
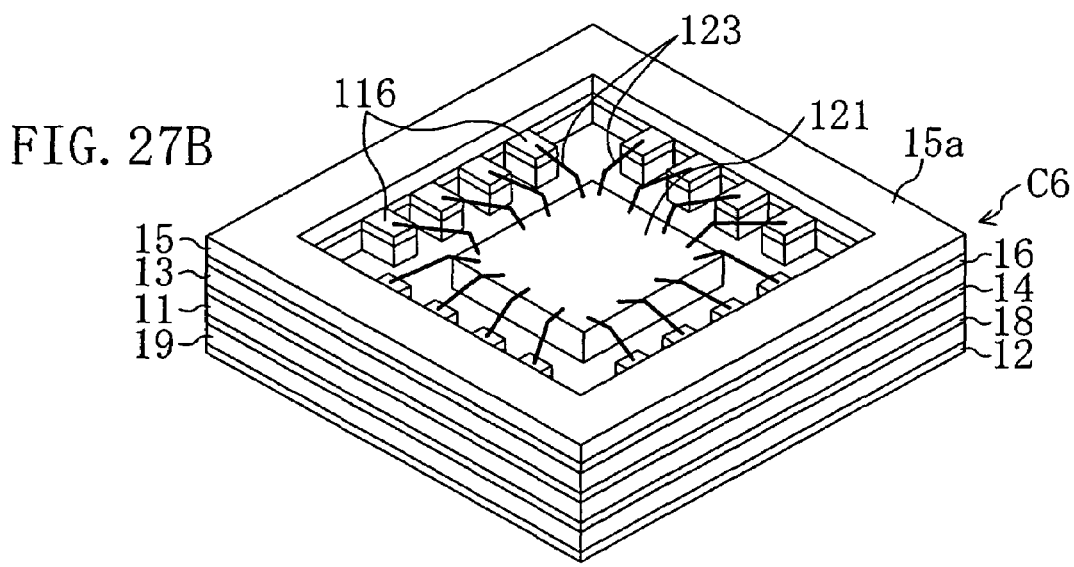
Figure 27C:
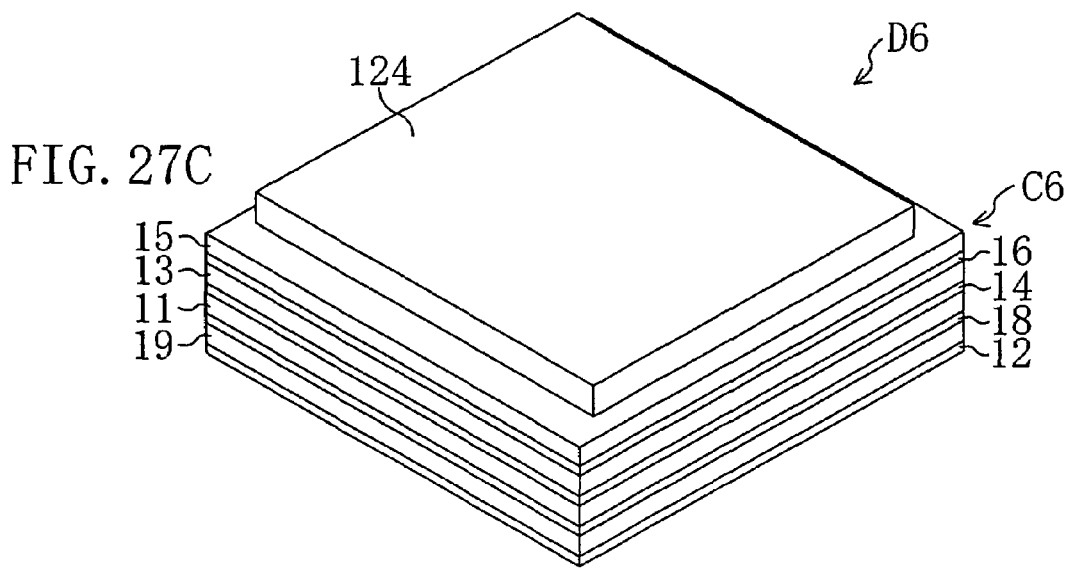

As shown in FIGS. 26C and 27C, the optical device D6 includes the optical device cavity structure C6, the optical element chip 121 and the light-transmitting member 124. The optical element chip 121 is a light-receiving element or a light-emitting element secured on the chip placement section 114 via the adhesive 122, and is connected to the second terminal sections 116, 116, . . . , via the conductive threads 123, 123, . . . . The light-transmitting member 124 is a member placed on the light-transmitting member placement section 15a, and transmits 70% or more, preferably 80% or more, and more preferably 90% or more, of incident light. Specifically, the light-transmitting member 124 is a glass plate.

After the optical device D6 is mounted on the wiring substrate, a voltage is applied to the optical element chip 121 via the first terminal section 112, the second terminal sections 116, 116, . . . , and the conductive threads 123, 123, . . . . Thus, the optical element chip 121 emits light, and the emitted light is output to the outside of the optical device D6 through the light-transmitting member 124. Alternatively, light transmitted through the light-transmitting member 124 is received by the optical element chip 121.

Thus, the optical device D6, which is obtained by placing the optical element chip 121 and the light-transmitting member 124 on the optical device cavity structure C6, provides substantially the same advantageous effects as those of the optical device cavity structure C6.

—Method for Manufacturing Optical Device Cavity Structure C6—

Figure 23A:
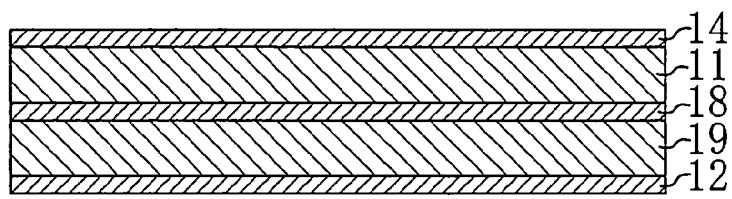
FIGS. 23A to 23E are cross-sectional views showing a part of the manufacturing process of the optical device cavity structure C6 according to Embodiment 6.
Figure 23B:
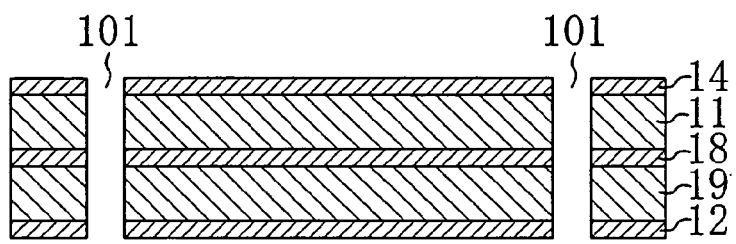
Figure 23C:
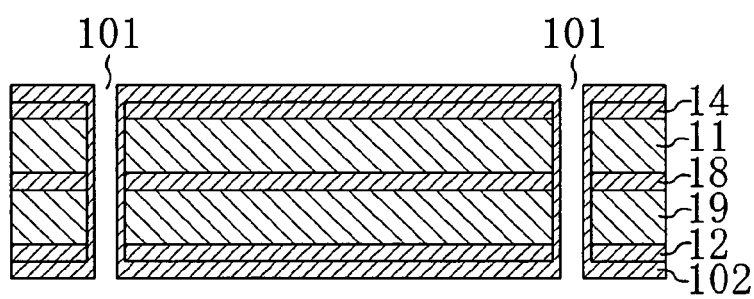
Figure 23D:
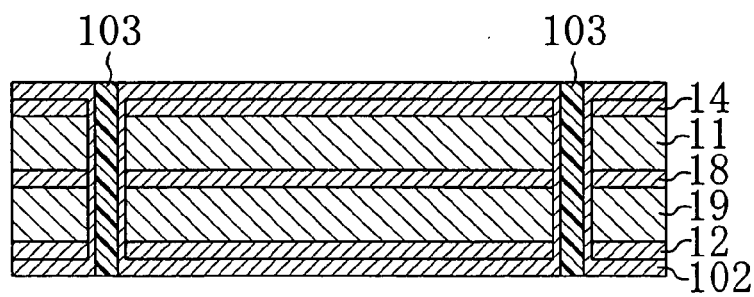
Figure 23E:
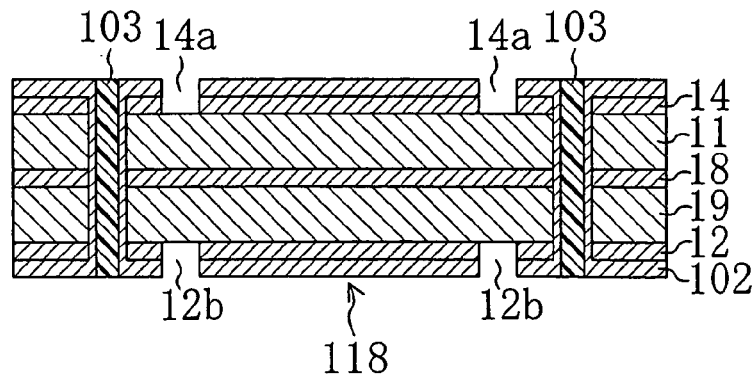
Figure 24A:
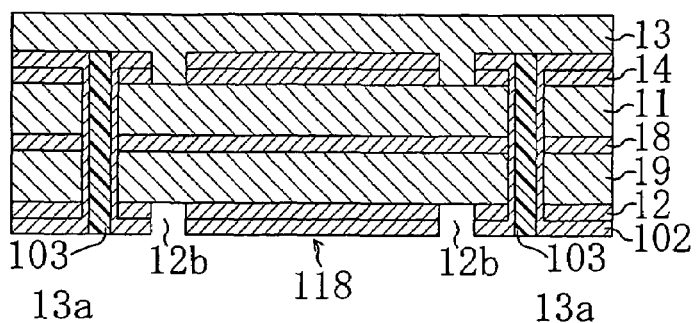
FIGS. 24A to 24E are cross-sectional views showing another part of the manufacturing process of the optical device cavity structure C6 according to Embodiment 6.
Figure 24B:
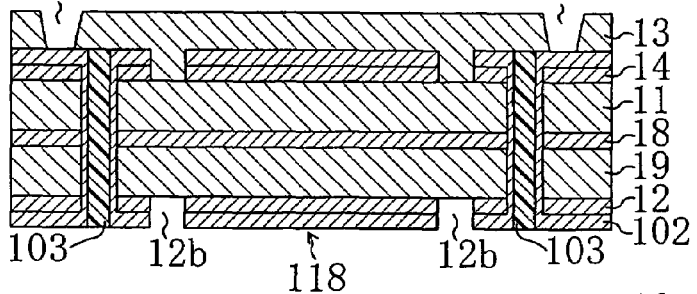
Figure 24C:
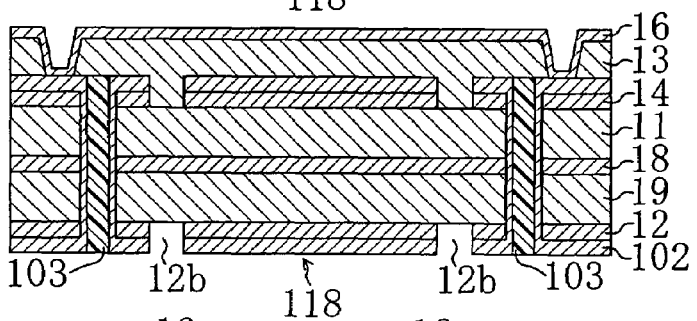
Figure 24D:
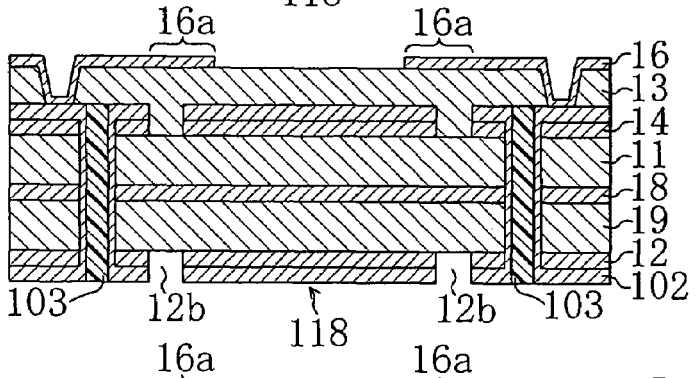
Figure 24E:
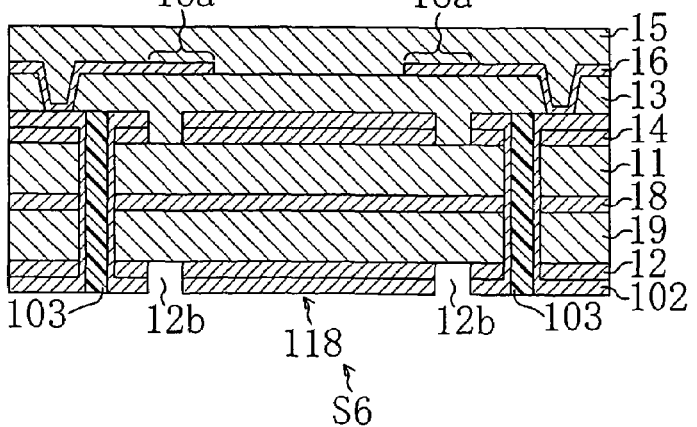
Figure 25A:
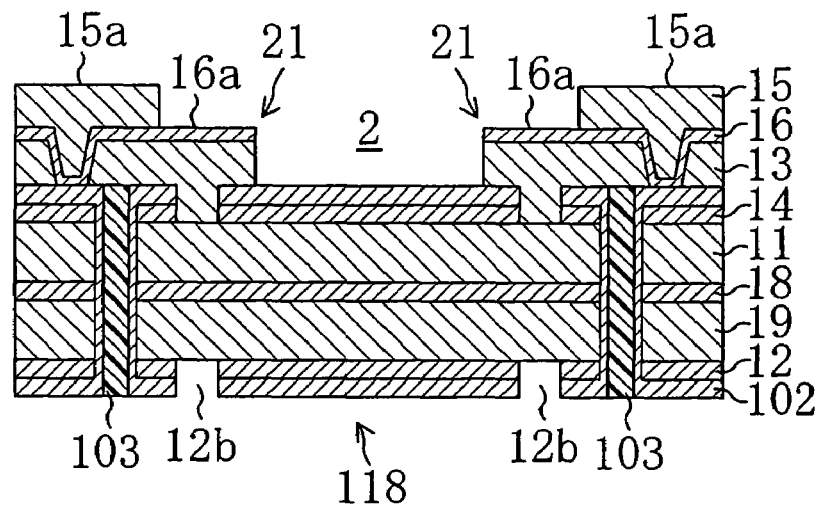
FIGS. 25A and 25B are cross-sectional views showing still another part of the manufacturing process of the optical device cavity structure C6 according to Embodiment 6.
Figure 25B:
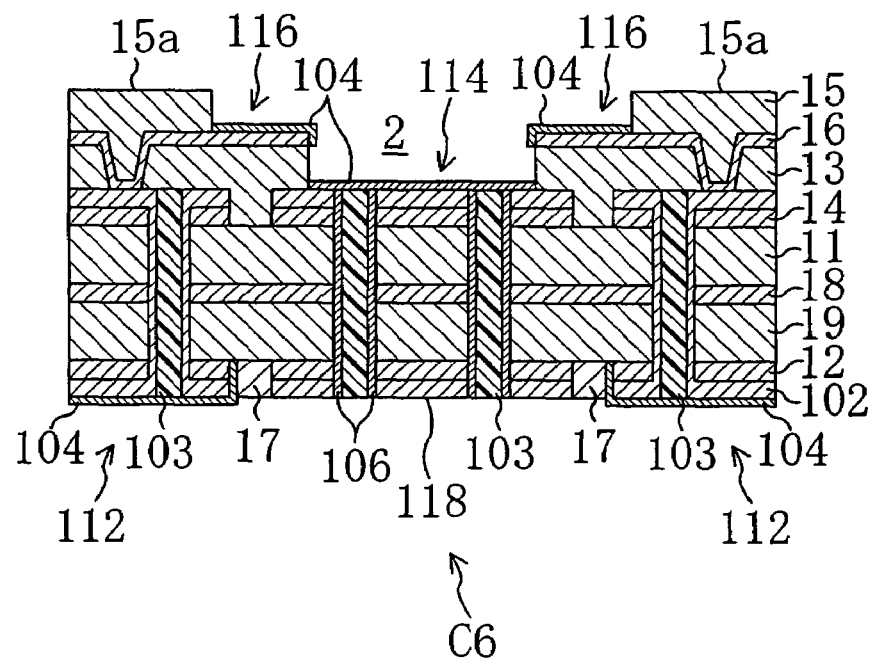

A base substrate S6 is manufactured through steps shown in FIGS. 23A to 24E, and then a laser light irradiation step shown in FIG. 25A is performed, after which a step of forming the second heat-radiating portion 106 shown in FIG. 25B is performed, to obtain the optical device cavity structure shown in FIG. 25A. The details will be described below.

1. Step of Forming Base Substrate S6

First, as shown in FIG. 23A, the first metal layer 12 is formed on the lower surface of the insulator layer 19. The warp preventing metal layer 18, the first insulator layer 11 and the second metal layer 14 are layered in this order on the upper surface of the insulator layer 19.

Then, the lower surface of the first metal layer 12 or the upper surface of the second metal layer 14 is irradiated with laser light at four positions, for each side of that plane, along a straight line generally parallel to the side. Thus, a total of 16 through hole portions 101, 101, . . . , are formed, as shown in FIG. 23B.

Then, as shown in FIG. 23C, the plating 102 is applied, by forming an Ni layer and then forming an Au layer on the surface of the Ni layer, on the surface of the first and second metal layers 12 and 14 and the surface of each through hole portion 101.

Then, as shown in FIG. 23D, a resin is poured into each through hole portion with the plating 102 having been applied to the inner wall thereof, thereby forming the resin portion 103. Then, a plating (not shown) is applied on the resin portions 103 on the surface of the plating 102.

Then, an etching mask is formed partially over the lower surface of the first metal layer 12, which has been plated with the plating 102, and partially over the upper surface of the second metal layer 14, which has been plated with the plating 102, and the first metal layer 12 and the second metal layer 14 are partially etched away. Thus, as shown in FIG. 23E, portions of the first metal layer 12 are left unetched at a total of 16 positions, four along each side of the lower surface of the insulator layer 19, thereby forming a generally-square-shaped etched portion 12b on the inner side with respect to the resin portion 103. Thus, the first heat-radiating section 118 is formed. In the second metal layer 14, the generally-square-shaped etched portion 14a is formed so as to correspond to the etched portion 12b of the first metal layer 12.

Then, as shown in FIG. 24A, the second insulator layer 13 is formed on the surface of the second metal layer 14, which has been plated with the plating 102, and inside the etched portion 14a.

Then, an etching mask is formed partially over the surface of the second insulator layer 13, and the second insulator layer 13 is etched. Thus, as shown in FIG. 24B, the 16 etched portions 13a, 13a, . . . , are formed on the outer side with respect to the resin portions 103, each corresponding to one of the resin portions 103.

Then, as shown in FIG. 24C, the third metal layer 16 is formed on the upper surface of the second insulator layer 13 and the upper surface of each etched portion 13a.

Then, an etching mask is formed partially over the upper surface of the third metal layer 16, and the third metal layer 16 is etched. Thus, as shown in FIG. 24D, a central portion of the third metal layer 16 is etched in a generally rectangular shape, whereas a total of 16 tongue-shaped portions 16a, 16a, . . . , are left unetched in the etched portion. The tongue-shaped portions 16a, 16a, . . . , are each extending from one side of the etched portion into the etched portion, with four tongue-shaped portions 16a being arranged along each side of the etched portion while being equally spaced apart from one another.

Then, as shown in FIG. 24E, the third insulator layer 15 is formed on the surface of the third metal layer 16 and on portions of the second insulator layer 13 that have been exposed through the etching process. Thus, the base substrate S6 is obtained.

2. Laser Light Irradiation Step

First, the entire upper surface of the base substrate S6 shown in FIG. 24E is irradiated with laser light. Specifically, a central portion of the surface of the base substrate S6 (specifically, a portion of the surface of the base substrate S6 where the third metal layer 16 is absent and portions thereof corresponding to the tongue-shaped portions 16a) is irradiated with laser light that is more powerful in terms of the laser intensity, or the like. In this process, a metal layer functions as a laser stop layer, whereas an insulator layer is removed by the laser light irradiation. Therefore, as shown in FIG. 25A, a portion of the second insulator layer 13 that is not covered by the third metal layer 16 and a portion of the third insulator layer 15 are removed, thereby forming the cavity portion 2 and the protruding portions 21, 21, . . . . It is preferred that the more powerful laser light is output under such laser irradiation conditions that the Rz value of the surface of the second metal layer 14 will be greater than or equal to 1 µm and less than or equal to 5 µm.

A periphery of the surface of the base substrate S6 is irradiated with laser light that is less powerful in terms of the laser intensity, or the like. With this laser light irradiation, the unetched portion of the surface of the third insulator layer 15 is roughened to be the light-transmitting member placement section 15a.

3. Step of Forming Second Heat-Radiating Portion 106

The second heat-radiating portion 106 is formed through steps that are substantially the same as those shown in FIGS. 23C to 23E. Specifically, first, the surface of a portion of the second metal layer 14 that has been exposed through the step of FIG. 25A or the surface of the first heat-radiating section 118 is irradiated with laser light. Thus, through holes (not shown) are obtained, running through the first heat-radiating section 118, the insulator layer 19, the warp preventing metal layer 18, the first insulator layer 11 and the second metal layer 14. Then, a plating is applied on the side wall of the through holes. Thus, the second heat-radiating section 106 is formed. Then, a resin is poured into each through hole portion with the second heat-radiating portion 106 having been formed on the side wall thereof, thereby forming the resin portion 103.

Then, the plating 104 is applied on the lower surface of a portion of the first metal layer 12 other than the first heat-radiating section 118, thereby forming the first terminal section 112. The plating 104 is applied on the upper surface of an exposed portion of the second metal layer 14, thereby forming the chip placement section 114. The plating 104 is applied on the upper surface of the tongue-shaped portions 16a, 16a, . . . , thereby forming the second terminal sections 116, 116, . . . .

Then, the insulator section 17 is formed in the etched portion 12b. Thus, it is possible to obtain the optical device cavity structure C6.

—Method for Manufacturing Optical Device D6—

First, as shown in FIGS. 26A and 27A, the optical element chip 121 is bonded to the chip placement section 114 by using the adhesive 122.

Then, as shown in FIGS. 26B and 27B, the optical element chip 121 is electrically connected to the second terminal sections 116, 116, . . . , by using the 16 conductive threads 123, 123, . . . . In this process, it is preferred that the conductive threads 123, 123, . . . , are connected to the semiconductor element chip 121 and the second terminal sections 116, 116, . . . , by using a conductive adhesive (not shown). Then, the conductive threads 123, 123, . . . , are sealed with a resin (not shown).

Then, as shown in FIGS. 26C and 27C, the light-transmitting member 124 is bonded to the light-transmitting member placement section 15a by using an adhesive (not shown). Thus, the light-transmitting member 124 can be secured in close contact with the light-transmitting member placement section 15a. It is possible to manufacture the optical device D1 as described above.

Then, the first terminal sections 112, 112, . . . , are mounted on predetermined locations of the wiring substrate by using a conductive adhesive, thus obtaining an optical semiconductor device.

The optical device cavity structure C6 may include means capable of visualizing the position of a first terminal section associated with a particular function. Optical device cavity structures C106 and C206 will now be described.

Variation 1

Figure 28:
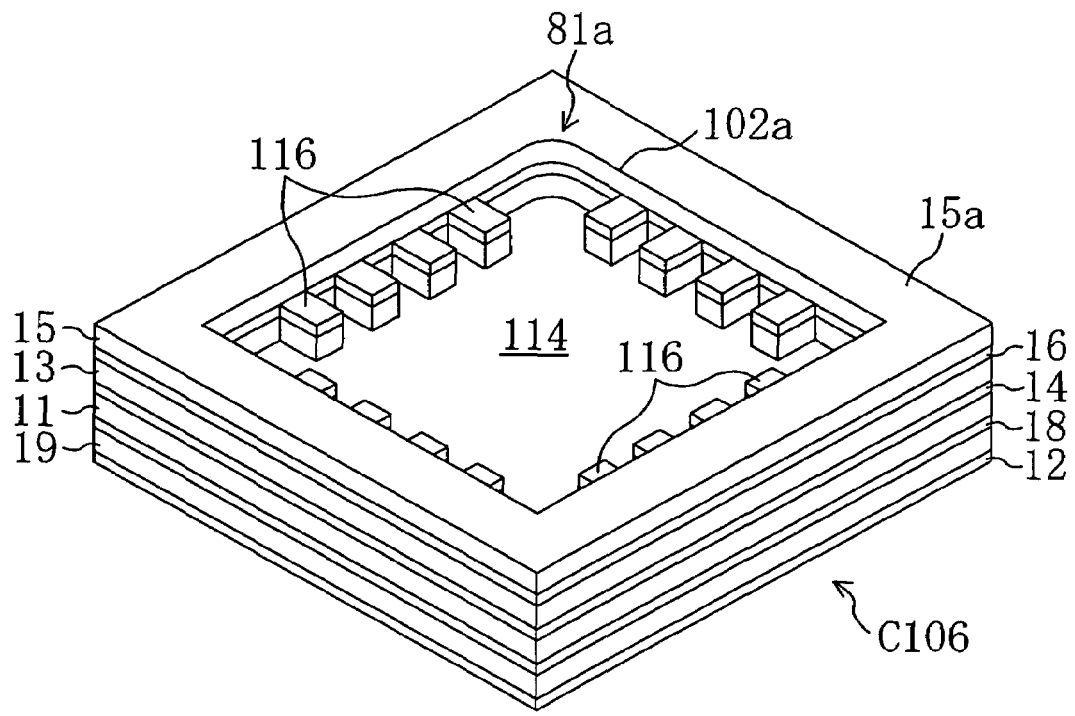
FIG. 28 is a perspective view showing the structure of an optical device cavity structure C106 according to Variation 1 of Embodiment 6.

FIG. 28 shows the optical device cavity structure C106 of Variation 1. With the optical device cavity structure C106, it is possible to identify the position of a first terminal section associated with a particular function by looking at the shape of an opening 102a of the cavity portion.

Specifically, the outline shape of the opening 102a of the cavity portion does not have point symmetry with respect to a generally center point of the opening 102a, as shown in FIG. 28. More specifically, one of the four corners of the rectangular opening 102a is in an arc shape (hereinafter the arc-shaped corner 81a will be referred to as "the non-point-symmetry portion 81a"). The non-point-symmetry portion 81a is formed at a position along the outline of the opening that is closest to the first terminal section associated with the particular function. Therefore, it is possible to identify the position of the first terminal section associated with the particular function by looking at the optical device cavity structure C106 from above the opening 102a.

The outline shape of the opening of the cavity portion is not limited to that specified above. For example, the outline of the opening may be a rectangular shape with one corner thereof being filled with a generally triangular prism.

Variation 2

Figure 29:
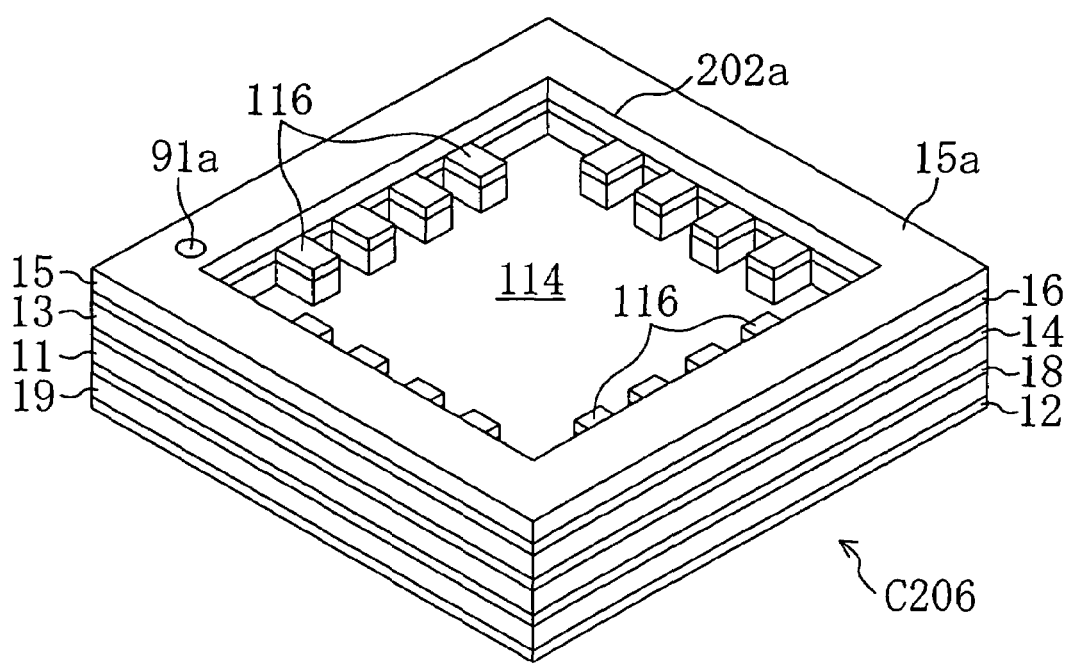
FIG. 29 is a perspective view showing the structure of an optical device cavity structure C206 according to Variation 2 of Embodiment 6.

FIG. 29 shows the optical device cavity structure C206 of Variation 2. With the optical device cavity structure C206, it is possible to identify the position of a first terminal section associated with a particular function by looking at the upper surface of the optical device cavity structure C206.

Specifically, the hole 91a is formed on the upper surface of the optical device cavity structure C206, as shown in FIG. 29, and the first terminal section associated with the particular function is located near the hole 91a. Therefore, it is possible to identify the first terminal section associated with the particular function by looking at the upper surface of the optical device cavity structure C206.

EMBODIMENT 7

Figure 30:
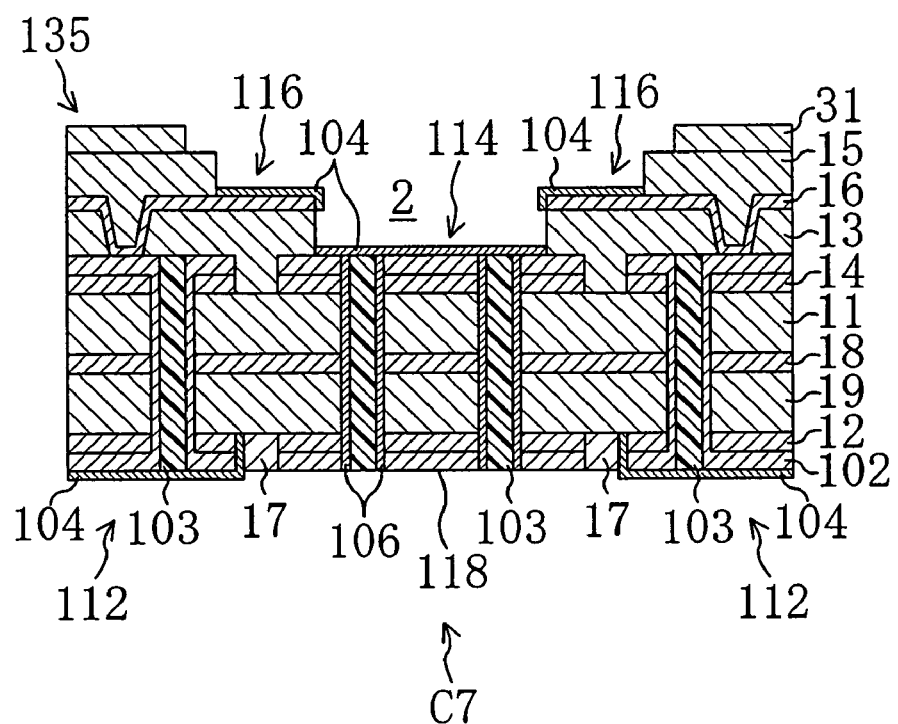
FIG. 30 is a cross-sectional view showing the structure of an optical device cavity structure C7 according to Embodiment 7.

Referring to FIG. 30, the structure of an optical device cavity structure C7 according to Embodiment 7 of the present invention will now be described. FIG. 30 is a cross-sectional view showing the structure of the optical device cavity structure C7.

—Structure of Optical Device Cavity Structure C7—

As opposed to the optical device cavity structure C6 of Embodiment 6, the optical device cavity structure C7 includes the resist layer 31 formed on the upper surface of the third insulator layer 15, with the upper surface of the resist layer 31 serving as the light-transmitting member placement section 135. Thus, since the light-transmitting member placement section 135 is the surface of the resist layer 31, the light-transmitting member 124 can be secured in close contact with the light-transmitting member placement section 135 in the optical device cavity structure C7.

The term "resist layer" as used herein refers to a layer that is formed on the foremost surface of the substrate in order to improve the resistance to shock, moisture and heat, e.g., to prevent corrosion of wirings or to prevent shorting between wirings (maintain the insulation reliability). A typical material of the resist layer is obtained by mixing an acrylic resin with an epoxy curing agent, and serves also as an insulator.

The optical device cavity structure C7 is manufactured by forming the resist layer 31 on the surface of the third insulator layer 15 of the optical device cavity structure C6 as described above in Embodiment 6. It is sufficient that only a central portion of the surface of the base substrate is irradiated with laser light.

EMBODIMENT 8

Figure 31:
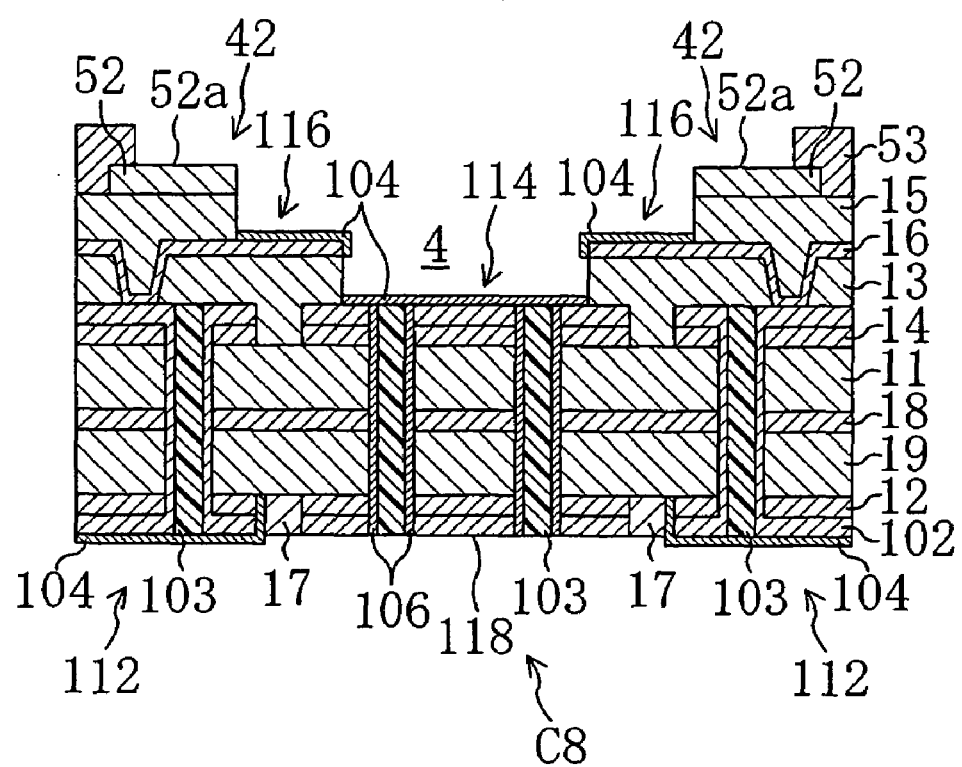
FIG. 31 is a cross-sectional view showing the structure of an optical device cavity structure C8 according to Embodiment 8.

Referring to FIGS. 31 to 33C, the structure and manufacturing method of an optical device cavity structure C8 and those of an optical device D8 according to Embodiment 8 of the present invention will now be described. FIG. 31 is a cross-sectional view showing the structure of the optical device cavity structure C8. FIGS. 32A to 33C are cross-sectional views showing the manufacturing process of the optical device cavity structure C8 and that of the optical device D8.

—Structure of Optical Device Cavity Structure C8—

As opposed to the optical device cavity structure C6 of Embodiment 6, the optical device cavity structure C8 includes the fourth metal layer 52 and the fourth insulator layer 53 layered in this order on the third insulator layer 15, as shown in FIG. 31. The fourth metal layer 52 is preferably a Cu layer, and the fourth insulator layer 53 is preferably an insulator layer containing a moisture-absorbing porous material.

The inner wall surface of a cavity portion 4 is formed by the second insulator layer 13, the third metal layer 16, the third insulator layer 15, the fourth metal layer 52 and the fourth insulator layer 53, which are layered in this order from the bottom surface toward the opening, and a total of 16 first protruding portions 41, 41, ..., and one second protruding portion 42 are formed along the inner wall surface. The first protruding portions 41, 41, ..., are formed on the inner wall surface, four on each side, while being equally spaced apart from one another so that the second insulator layer 13 and the third metal layer 16 are flush with each other along the three side surfaces of each protruding portion. The second protruding portion 42 protrudes over a shorter distance than the first protruding portions 41, and the third insulator layer 15 and the fourth metal layer 52 are flush with each other along the three side surfaces of the protruding portion.

The light-transmitting member placement section 52a of the present embodiment is the surface of the second protruding portion 42, and is thus formed in the cavity portion 4. Therefore, as compared with the optical device cavity structure C6, the optical device cavity structure C8 can provide a compact optical device.

—Method for Manufacturing Optical Device Cavity Structure C8—

First, a layered structure as shown in FIG. 24E is formed by the method shown in FIGS. 23A to 24E as described above in Embodiment 6.

Figure 32A:
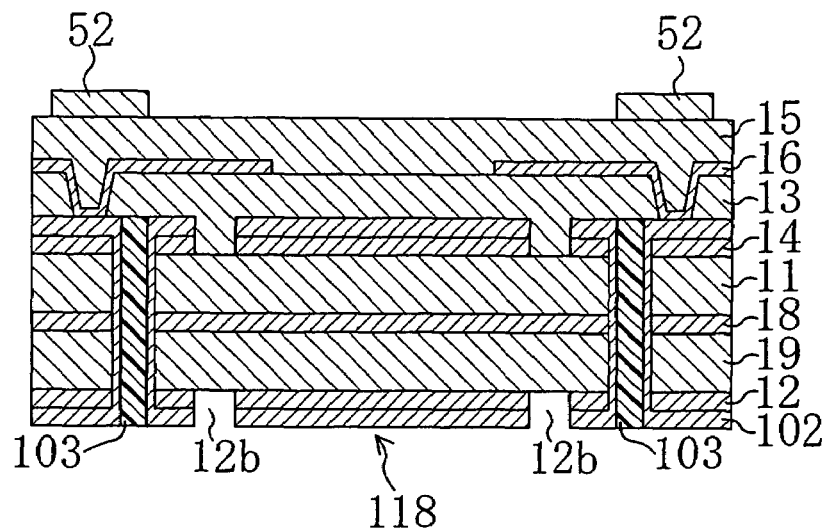
FIGS. 32A and 32B are cross-sectional views showing a part of the manufacturing process of the optical device cavity structure C8 according to Embodiment 8.

Then, the fourth metal layer 52 is formed on the surface of the third insulator layer 15, after which an etching mask is formed over a large portion of the surface of the fourth metal layer 52 and an etching process is performed. Thus, it is possible to form the fourth metal layer 52 near a peripheral portion of the surface of the third insulator layer 15, as shown in FIG. 32A.

Figure 32B:
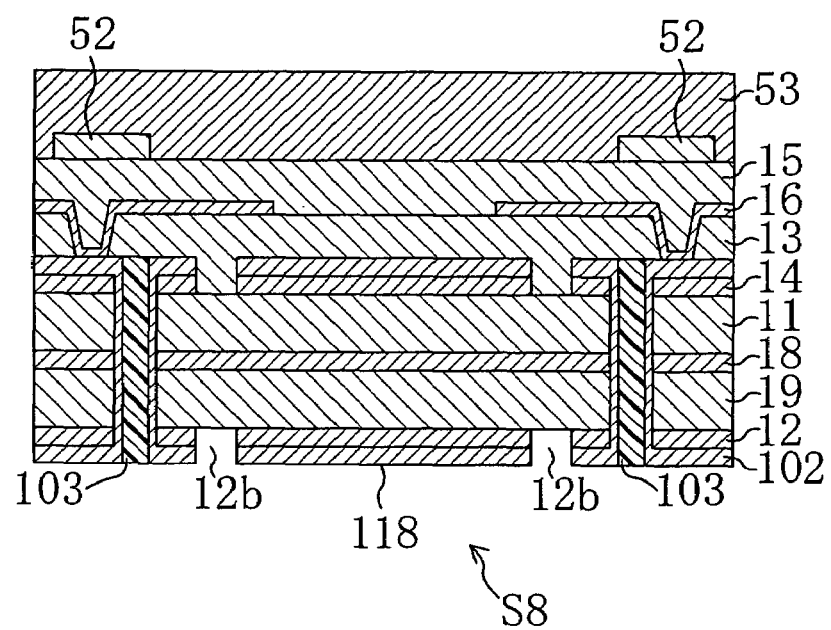
Figure 33A:
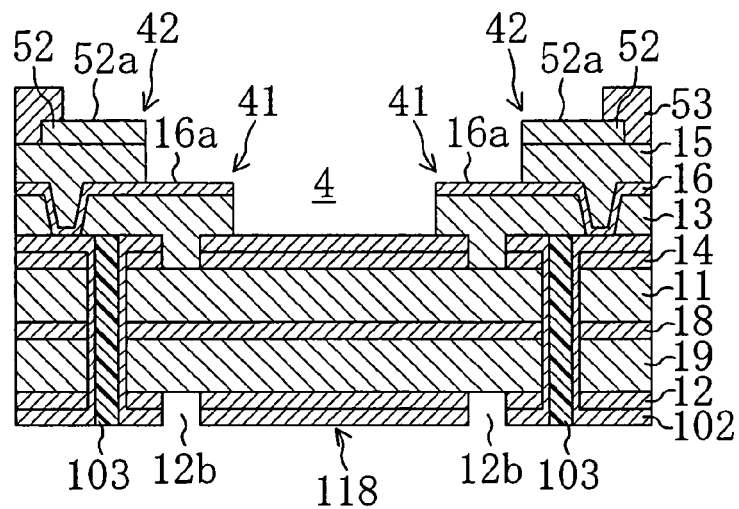
FIGS. 33A to 33C are cross-sectional views showing a part of the manufacturing process of an optical device D8 according to Embodiment 8.

Then, the fourth insulator layer 53 is formed on the surface of the fourth metal layer 52 and on a portion of the surface of the third insulator layer 15 that has been exposed through the etching process of FIG. 33A. Thus, it is possible to obtain a base substrate St. Of the optical device cavity structure C8 as shown in FIG. 32B.

Then, a central portion of the base substrate St. (specifically, a portion of the surface of the base substrate St. Where the third metal layer 16 is absent and portions thereof corresponding to the tongue-shaped portion 16a and a peripheral portion of the tongue-shaped portion 16a) is irradiated with laser light. Then, as shown in FIG. 33A, a portion of the second insulator layer 13 that is not covered by the third metal layer 16 and a portion of the third insulator layer 15 are removed, thereby forming the cavity portion 2 and the first protruding portions 41, 41, . . . . Moreover, a portion of the fourth insulator layer 53 is removed to form the second protruding portion 42, thus forming the light-transmitting member placement section 52a.

Then, the plating process shown in FIG. 25C is performed as described above in Embodiment 6, thereby obtaining the optical device cavity structure C8 shown in FIG. 31.

Figure 33B:
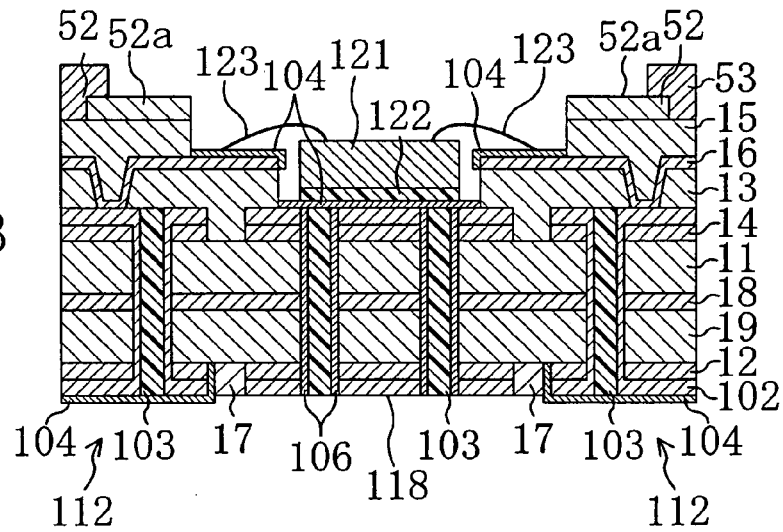

Then, as shown in FIG. 33B, the optical element chip 121 is secured on the chip placement section 114 by using the adhesive 122, and the second terminal sections 116, . . . , and the optical element chip 121 are electrically connected to each other by using the conductive threads 123, 123, . . . .

Figure 33C:
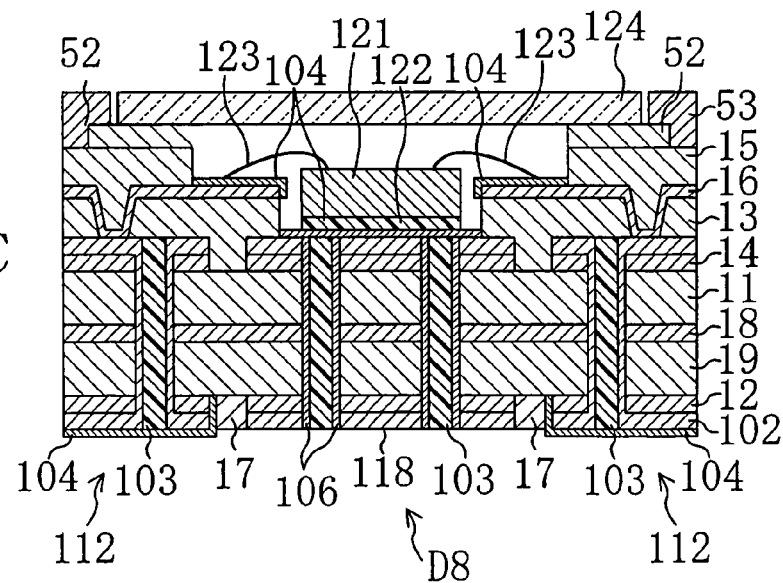

Then, as shown in FIG. 33C, the light-transmitting member 124 is placed on the light-transmitting member placement section 52a. Thus, it is possible to obtain the optical device D8.

EMBODIMENT 9

Figure 34:
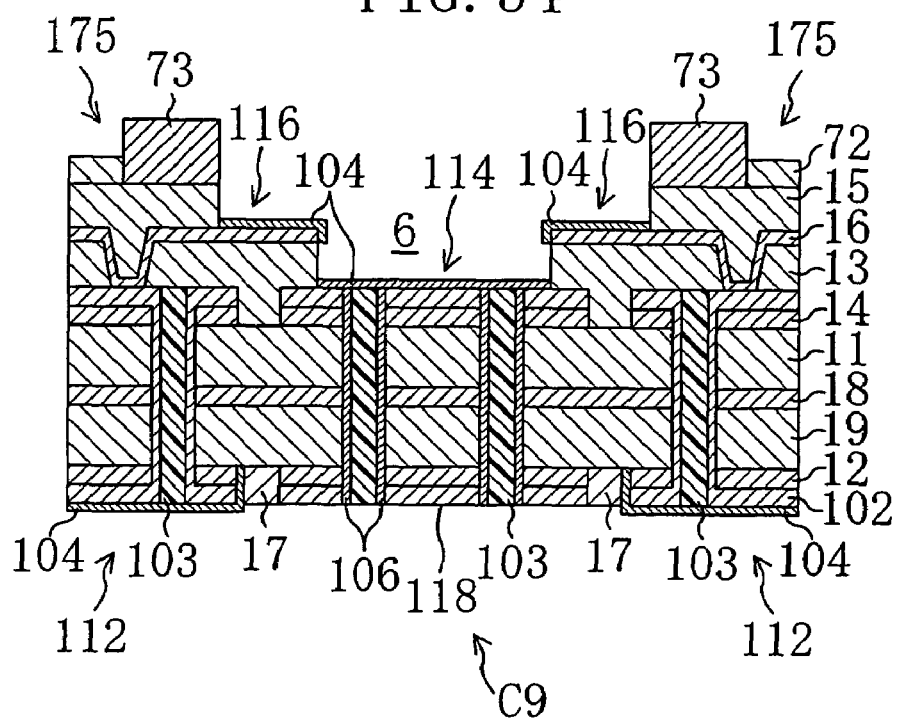
FIG. 34 is a cross-sectional view showing the structure of an optical device cavity structure C9 according to Embodiment 9.
Figure 35A:
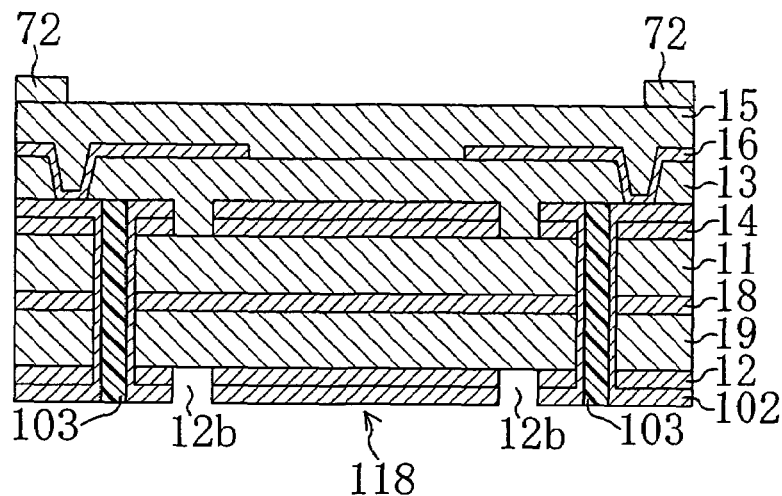
FIGS. 35A to 35C are cross-sectional views showing a part of the manufacturing process of the optical device cavity structure C9 according to Embodiment 9.
Figure 35B:
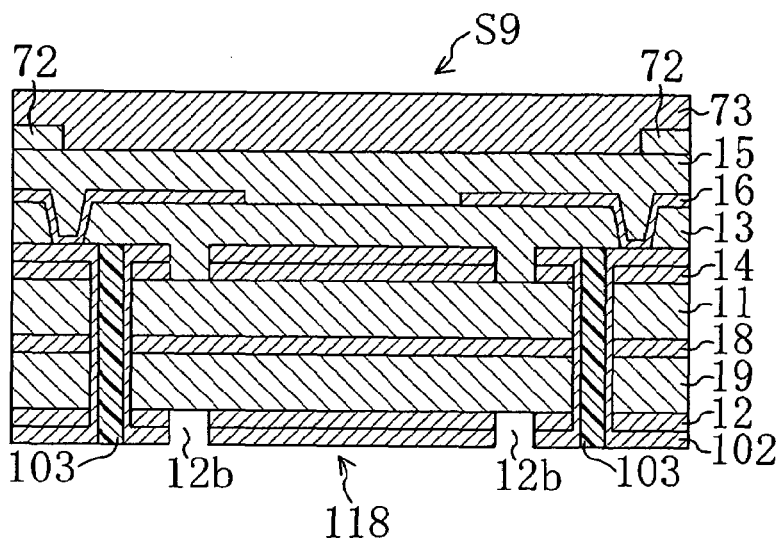
Figure 35C:
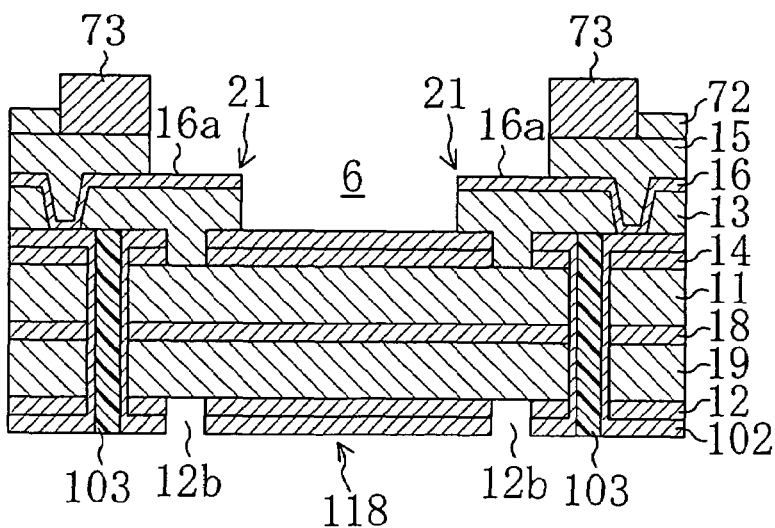
Figure 36:
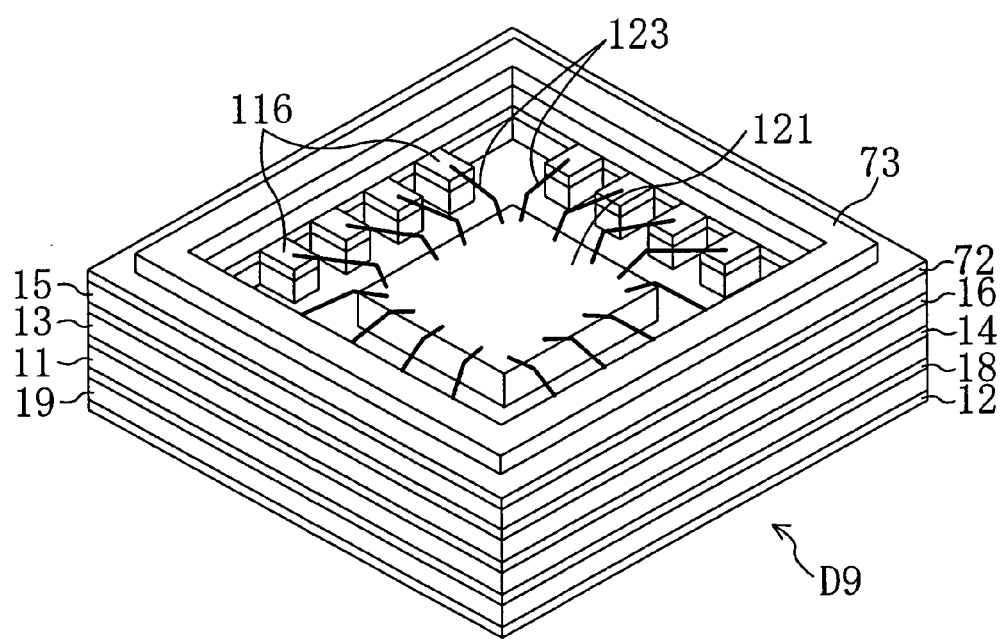
FIG. 36 is a perspective view showing an optical device D9 according to Embodiment 9.

Referring to FIGS. 34 to 36, the structure and manufacturing method of an optical device cavity structure C9 and those of an optical device D9 according to Embodiment 9 of the present invention will now be described. FIG. 34 is a cross-sectional view showing the structure of the optical device cavity structure C9. FIGS. 35A to 35C are cross-sectional views showing the manufacturing process of the optical device cavity structure C9. FIG. 36 is a perspective view showing the optical device D9.

—Structure of Optical Device Cavity Structure C9—

As opposed to the optical device cavity structure C6 of Embodiment 6, the optical device cavity structure C9 includes the fourth metal layer 72 and the fourth insulator layer 73 layered in this order on the third insulator layer 15, as shown in FIG. 34. The fourth metal layer 72 is preferably a Cu layer, and the fourth insulator layer 73 is preferably an insulator layer containing a moisture-absorbing porous material. The optical device cavity structure C9 includes the optical component fitting section 175, instead of a light-transmitting member placement section.

The inner wall surface of the cavity portion 6 is substantially the same as that of the cavity portion 2 of Embodiment 6, and is formed by the second insulator layer 13, the third metal layer 16 and the third insulator layer 15, which are layered in this order from the bottom surface toward the opening.

The optical component fitting section 175 is a section in which an optical component such as a lens barrel is to be fitted, and is formed so as to surround the opening of the cavity portion 6. The lower surface thereof is a part of the fourth metal layer 72.

—Method for Manufacturing Optical Device Cavity Structure C9—

First, a layered structure as shown in FIG. 24E is formed by the method shown in FIGS. 23A to 24E as described above in Embodiment 6.

Then, the fourth metal layer 72 is formed on the surface of the third insulator layer 15, after which an etching mask is formed over a central portion of the surface of the fourth metal layer 72 and an etching process is performed. Thus, it is possible to form the fourth metal layer 72 along the periphery of the upper surface of the third insulator layer 15, as shown in FIG. 25A.

Then, the fourth insulator layer 73 is formed on the surface of the fourth metal layer 72 and a portion of the surface of the third insulator layer 15 that has been exposed through the etching process of FIG. 25A. Thus, it is possible to obtain a base substrate St. As shown in FIG. 25B.

Then, as described above in Embodiment 6, a central portion of the surface of the base substrate St. Is irradiated with laser light, thereby forming the cavity portion 6 and the protruding portions 21, 21, . . . . Moreover, the periphery of the surface of the base substrate S4 is irradiated with laser light, thereby removing a portion of the fourth insulator layer 73 and thus exposing the fourth metal layer 72. Thus, the optical component fitting section 175 is obtained.

Thereafter, the plating process shown in FIG. 25C is performed as described above in Embodiment 6, thereby obtaining the optical device cavity structure C9 as shown in FIG. 34.

Then, the optical element chip 121 is secured on the chip placement section 114 by using an adhesive, the second terminal sections 116, 116, . . . , and the optical element chip 121 are electrically connected to each other by using the conductive threads 123, 123, . . . , and an optical component (not shown) is placed on an optical component placement section 175. Thus, it is possible to obtain the optical device D9 as shown in FIG. 36.

EMBODIMENT 10

Figure 37A:
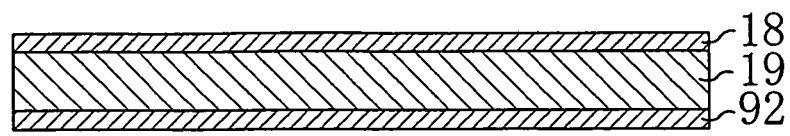
FIGS. 37A to 37D are cross-sectional views showing a part of the manufacturing process of an optical device cavity structure C10 according to Embodiment 10.
Figure 37B:
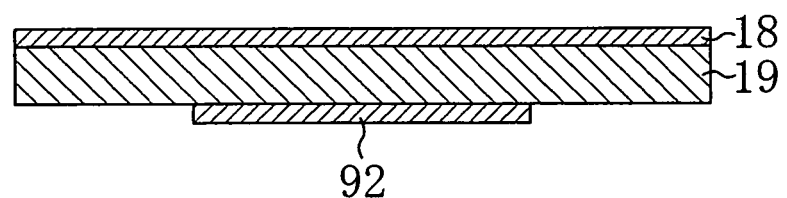
Figure 37C:
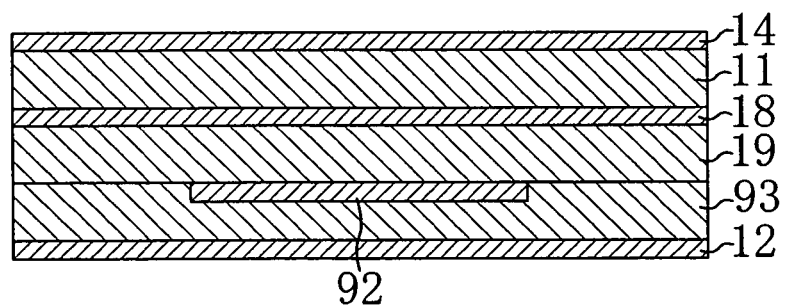
Figure 37D:
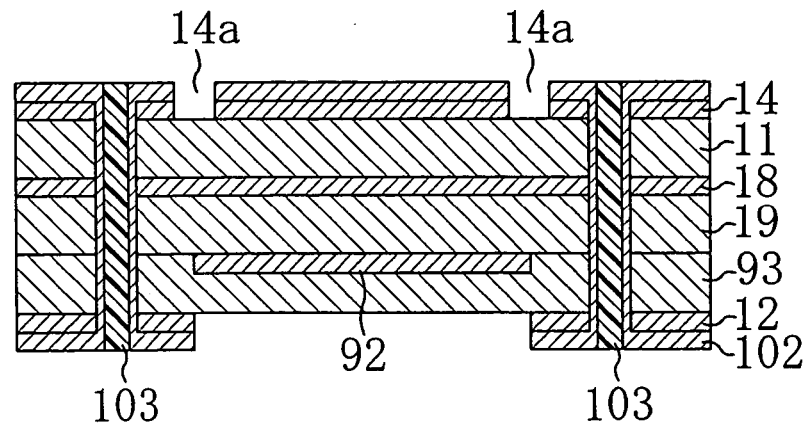
Figure 38A:
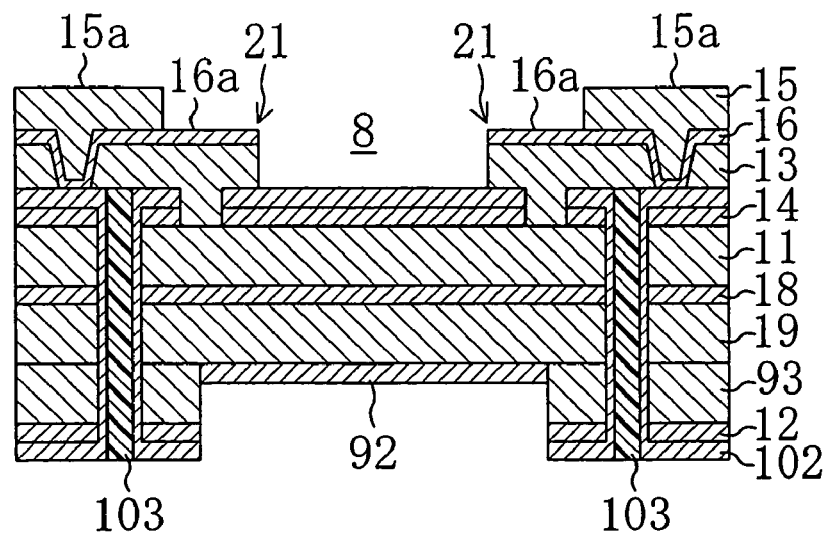
FIGS. 38A and 38B are cross-sectional views showing another part of the manufacturing process of the optical device cavity structure C10 according to Embodiment 10.
Figure 38B:
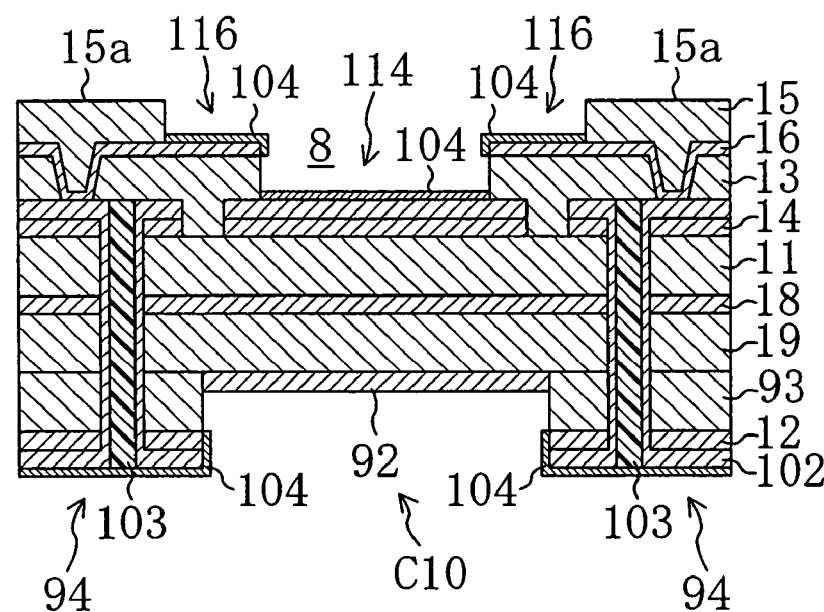
Figure 39:
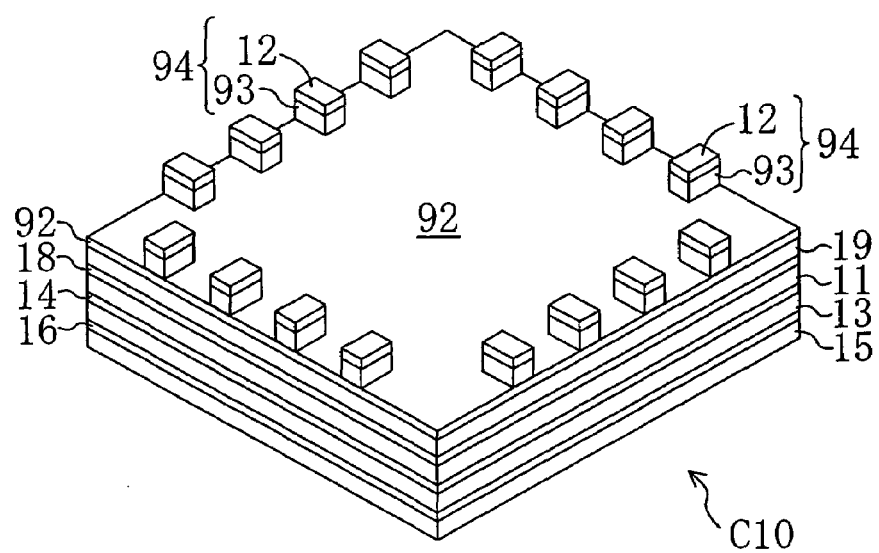
FIG. 39 is a perspective view showing the reverse surface side of the optical device cavity structure C10 according to Embodiment 10.

Referring to FIGS. 37A to 39, the structure and manufacturing method of an optical device cavity structure C10 according to Embodiment 10 of the present invention will now be described. FIGS. 37A to 38B are cross-sectional views showing the manufacturing process of the optical device cavity structure C10, and FIG. 39 is a perspective view showing the reverse surface side of the optical device cavity structure C10.

—Structure of Optical Device Cavity Structure C10—

As opposed to the optical device cavity structure C6 of Embodiment 6, the optical device cavity structure C10 does not include the first heat-radiating section 118 and the second heat-radiating portion 106, but includes the standoff insulator layer 93 and the standoff metal layer 92 layered between the first metal layer 12 and the first insulator layer 11. The standoff metal layer 92 is preferably a Cu layer, and the standoff insulator layer 93 is preferably an insulator layer containing a moisture-absorbing porous material.

The inner wall surface of the cavity portion 8 is substantially the same as that of the cavity portion 2 of Embodiment 6, and is formed by the second insulator layer 13, the third metal layer 16 and the third insulator layer 15, which are layered in this order from the bottom surface toward the opening.

As shown in FIG. 39, a first terminal section 94 is formed by the standoff insulator layer 93 and the first metal layer 12, and is protruding from the standoff metal layer 92. Therefore, as opposed to the optical device cavity structures C6, C7, C8 and C9 described above, the optical device cavity structure C10 can be firmly secured on the wiring substrate.

—Method for Manufacturing Optical Device Cavity Structure C10—

First, as shown in FIG. 37A, the warp preventing metal layer 18 is formed on the upper surface of the insulator layer 19, and the standoff metal layer 92 is formed on the lower surface of the insulator layer 19.

Then, although not shown in the drawings, an etching mask is formed partially over the lower surface of the standoff metal layer 92, and the standoff metal layer 92 is etched. Thus, the standoff metal layer 92 is left unetched at the center of the reverse surface of the insulator layer 19, as shown in FIG. 37B.

Then, as shown in FIG. 37C, the first insulator layer 11 and the second metal layer 14 are formed in this order on the upper surface of the warp preventing metal layer 18. The standoff insulator layer 93 is formed on the lower surface of the standoff metal layer 92 and on a portion of the lower surface of the first insulator layer 11 that has been exposed through the etching process of FIG. 37B, and the first metal layer 12 is formed on the lower surface of the standoff insulator layer 93.

Then, the plating 102 and the resin layer 103 are formed by substantially the same method as that of Embodiment 6 shown in FIG. 23D. An etching mask is formed partially over the lower surface of the first metal layer 12 and partially over the upper surface of the second metal layer 14, and the first metal layer 12 and the second metal layer 14 are etched. Thus, as shown in FIG. 37D, a large portion of the first metal layer 12 is etched away to form the warp preventing depressed portion 12a at the center thereof, while leaving portions of the first metal layer 12 at a total of 16 positions, four along each side of the lower surface of the first insulator layer 11. Moreover, the generally-square-shaped etched portion 14a is formed in the second metal layer 14 on the inner side with respect to the resin portions 103.

Then, steps as shown in FIGS. 24A to 24E are performed as described above in Embodiment 6 to obtain a base substrate of the optical device cavity structure C10.

Then, the upper surface and the reverse surface of the base substrate are irradiated with laser light. In this process, the upper surface of the base substrate is irradiated with laser light by substantially the same method as the laser irradiation step of Embodiment 6, whereas the reverse surface of the base substrate is irradiated with laser light of substantially the same intensity across the reverse surface. As the reverse surface of the base substrate is irradiated with laser light, a portion of the standoff insulator layer 93 where the first metal layer 12 is absent is removed, thereby exposing the standoff metal layer 92.

Then, the plating process shown in FIG. 25C is performed as described above in Embodiment 6, thereby forming the first terminal section 94, the chip placement section 114, the first terminal section 94 and the second terminal sections 116, 116, . . . , thus obtaining the optical device cavity structure C10 as shown in FIG. 38B.

EMBODIMENT 11

Figure 40:
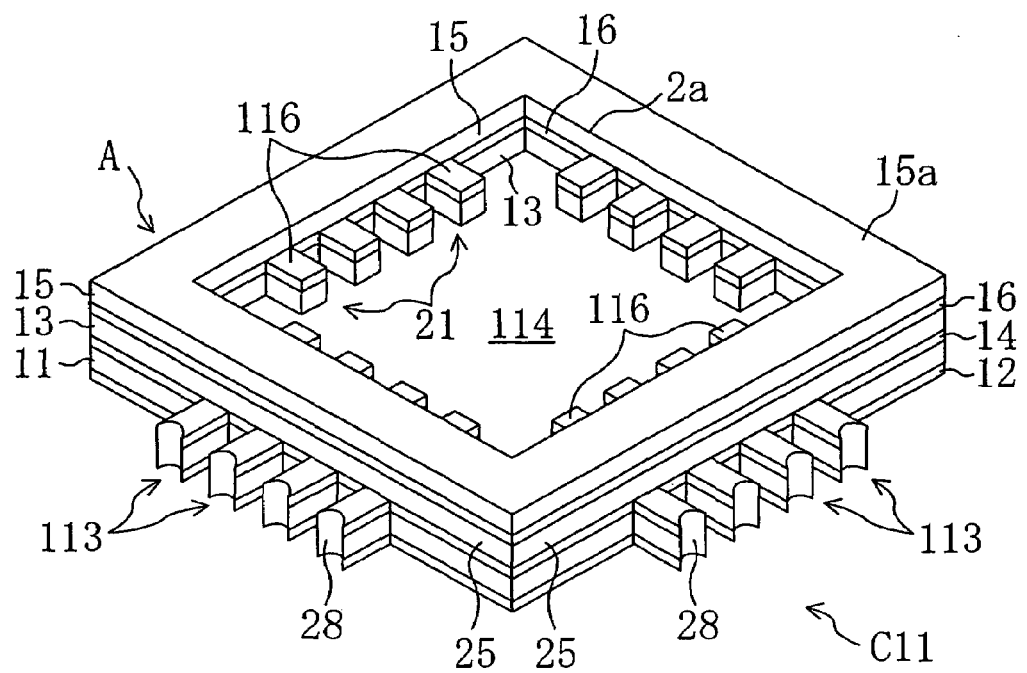
FIG. 40 is a perspective view showing the structure of an optical device cavity structure C11 according to Embodiment 11.
Figure 41A:
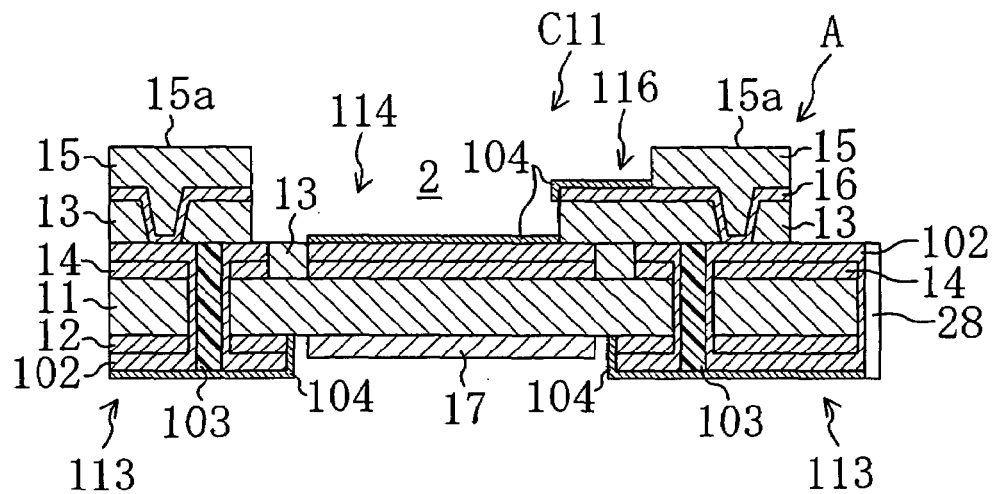
FIG. 41A is a cross-sectional view showing the structure of the optical device cavity structure C11 according to Embodiment 11.
Figure 41B:
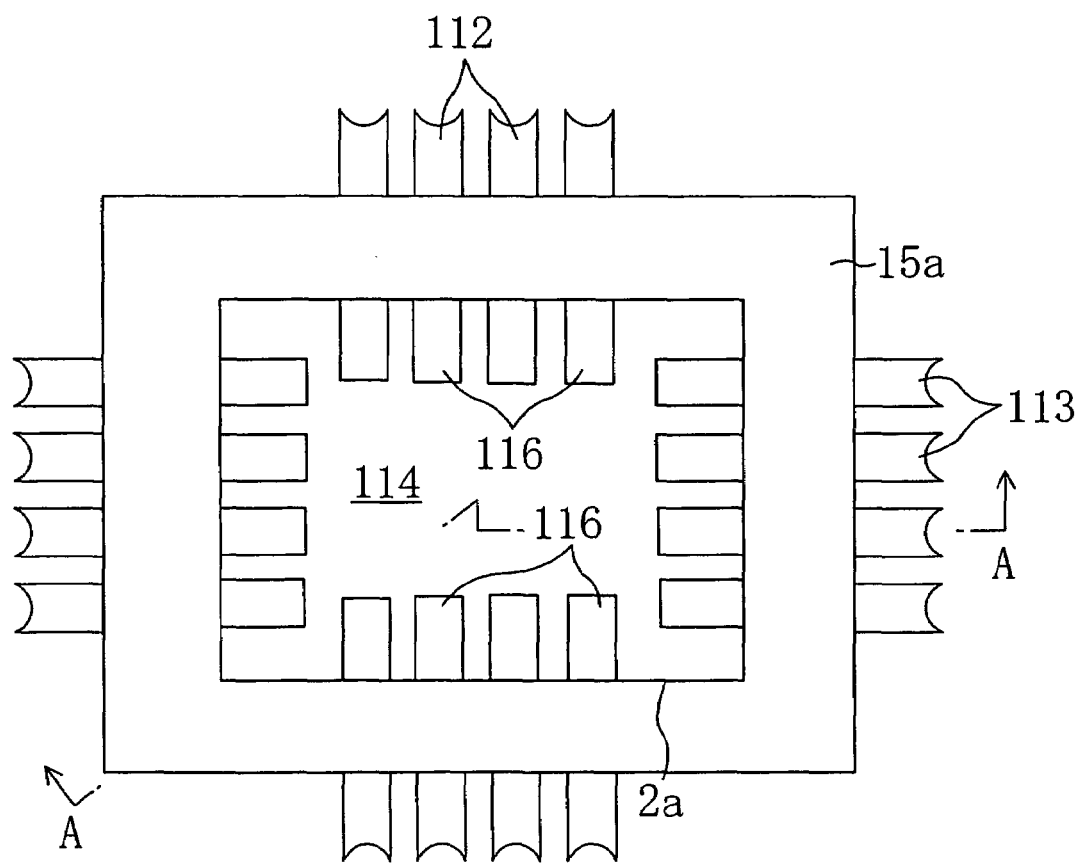
FIG. 41B is a plan view thereof.

Referring to FIGS. 40 to 46C, the structure and manufacturing method of an optical device cavity structure C11 and those of an optical device D11 according to Embodiment 11 of the present invention will now be described. FIGS. 40 to 41B are perspective views and a cross-sectional view showing the structure of the optical device cavity structure C11. FIG. 41A is a cross-sectional view taken along line IIA-IIA of FIG. 41B. FIGS. 42A to 44C are cross-sectional views showing the manufacturing process of the optical device cavity structure C11. FIGS. 45A to 46C are cross-sectional views and perspective views showing the manufacturing process of the optical device D11.

—Structure of Optical Device Cavity Structure C11—

As shown in as shown in FIGS. 40 to 41B, the optical device cavity structure C11 includes the first metal layer 12, the first insulator layer 11, the second metal layer 14, the second insulator layer 13, the third metal layer 16 and the third insulator layer 15, which are layered in this order from the mounting surface thereof (the lower surface as shown in FIG. 40) on which it is mounted on a wiring substrate, and includes the cavity portion 2, the 16 second terminal sections 116, 116, . . . , the chip placement section 114, the light-transmitting member placement section 15a and 16 first terminal sections 113, 113, . . . . It is preferred that the first, second and third insulator layers 11, 13 and 15 contain a moisture-absorbing porous material (not shown). Then, the optical device cavity structure C11 has a condensation preventing function. Moreover, it is preferred that the first, second and third metal layers 12, 14 and 16 are each made of Cu. Then, it is possible to manufacture the optical device cavity structure C11 by laser light irradiation.

As shown in FIG. 40, the cavity portion 2 includes the generally rectangular opening 2a at the center of the upper surface of the optical device cavity structure C11, and is made by taking the material away in a generally rectangular parallelepiped shape. As shown in FIGS. 41A and 41B, the bottom surface is formed by the plating 104 applied on the upper surface of a central portion of the second metal layer 14. The inner wall surface is formed by the second insulator layer 13, the third metal layer 16 and the third insulator layer 15, which are layered in this order from the bottom surface toward the opening 2a, and a total of 16 protruding portions 21, 21, . . . , are formed along the inner wall surface. The protruding portions 21, 21, . . . , are formed on the inner wall surface, four on each side, while being equally spaced apart from one another so that the second insulator layer 13 and the third metal layer 16 are flush with each other along the three side surfaces of each protruding portion.

As shown in FIGS. 21 to 41B, the second terminal sections 116, 116, . . . , are formed by applying the plating 104 on the upper surface and the side surface of the third metal layer 16 in the protruding portions 21, 21, . . . , of the cavity portion 2.

As shown in FIG. 40, the chip placement section 114 is formed by applying the plating 104 on the bottom surface of the cavity portion 2. As stated above to be the second element of an optical semiconductor device, it is preferred that the chip placement section 114 has a high degree of flatness. Specifically, it is formed so that the surface has an Rz value greater than or equal to 1 μm and less than or equal to 5 μm. Thus, it is possible to place the optical element chip 121 on the chip placement section 114 so as to be generally parallel to the mounting surface. Thus, an optical component such as a lens barrel can be placed, without being tilted, on the optical device in which the optical element chip 121 is placed on the chip placement section 114.

The chip placement section 114 is formed so that the distance between the chip placement section 114 and the upper surface of the second terminal sections 116, 116, . . . , is less than or equal to the thickness of the semiconductor element chip 121, i.e., so that the distance is greater than or equal to 50 μm and less than or equal to 575 μm. If the distance is less than 50 μm, the thickness of the second insulator layer 13 will be too small, thereby making it difficult to provide the second insulator layer 13. If the distance is greater than 575 μm, the upper surface of the second terminal section 116 will be above the optical plane of the semiconductor element chip 121. As a result, light diffusively reflected by the surface of conductive threads 123, 123, . . . , may be received by the semiconductor element chip 121, or light emitted from the semiconductor element chip 121 may be diffusively reflected by the surface of the conductive threads 123, 123, . . . , so as to be output from the optical device cavity structure C11. Thus, it is preferred that the distance is greater than or equal to 50 μm and less than or equal to 575 μm. In many cases, the actual thickness of the semiconductor element chip 121 is a value within the range from 100 μm to 200 μm.

As shown in FIG. 40, the light-transmitting member placement section 15*a* is at least a part of the upper surface of the third insulator layer 15, and includes the securing means A for securing the light-transmitting member 124 to be described later. The securing means A is the upper surface of the third insulator layer 15, which has been roughened. Thus, the light-transmitting member 124 can be secured in close contact with the light-transmitting member placement section 15*a*. The method for roughening the upper surface of the third insulator layer 15 is not limited to any particular method as long as the roughened surface has an Rz value greater than or equal to 5 μm and less than or equal to 20 μm, preferably an Rz value greater than or equal to 10 μm and less than or equal to 20 μm, more preferably an Rz value greater than or equal to 15 μm and less than or equal to 20 μm, whereby the light-transmitting member 124 can be very firmly secured in close contact with the light-transmitting member placement section 15*a*. It is more preferred that the light-transmitting member 124 is placed on the light-transmitting member placement section 15*a* via an adhesive, whereby the light-transmitting member 124 can be even more firmly secured in close contact with the light-transmitting member placement section 15*a*.

As shown in FIG. 40, the first terminal sections 113, 113, . . . , are protruding outwardly from outer wall surfaces 25, 25, . . . , of the optical device cavity structure C11, the upper surface thereof being the second metal layer 14, the surface of which has been plated with the plating 102, and the lower surface thereof being the first metal layer 12, the surface of which has been plated with the plating 102. The first terminal sections 113, 113, . . . , and the second terminal sections 116, 116, . . . , are electrically connected to each other via the third metal layer 16. One of the side walls (side surfaces) of the first terminal sections 113, 113, . . . , that is at the tip of the first terminal sections 113, 113, . . . , protruding from the outer wall surfaces 25, 25, . . . , is a gutter-like curved surface 28 having a semi-circular cross section. The plating 102, being a conductive layer, is applied on the surface of the curved surface 28. Since the first terminal sections 113, 113, . . . , have the shape and structure as described above, and the lower surface and the curved surface 28 are covered with the plating 102 being a conductive layer, solder fillets are likely to be formed between the first terminal sections 113, 113, . . . , and connection terminal wires of the wiring substrate, onto which the optical device cavity structure C11 of the present embodiment is being mounted, thereby making a reliable connection. Since side surfaces of the first terminal sections 113, 113, . . . , facing each other are not covered with the plating 102, it is possible to avoid shorting between adjacent terminals in cases where the inter-terminal pitch is small, e.g., 0.4 to 0.65 mm.

The platings 102 and 104 are each formed by layering an Au layer on the surface of an Ni layer.

The warp preventing depressed portion 12*a* (shown in FIG. 42E) is formed in a central portion of the mounting surface. Thus, even with the cavity portion 2 formed on the upper surface, it is possible to prevent the optical device cavity structure C11 from warping toward the mounting surface, and it is possible to prevent the optical element chip 121 from warping in a state where the optical element chip 121 is placed on the chip placement section 114. As shown in FIGS. 41A and 41B, the insulator layer 17 is formed on the lower surface of the warp preventing depressed portion 12*a*, whereby it is possible to completely prevent shorting between the first terminal sections 113.

The etched portion 14*a* having a generally-square-shaped bottom surface (shown in FIG. 42E) is formed in the second metal layer 14 on the inner side with respect to the through holes 101, 101, . . . . Therefore, the chip placement section 114 will not be electrically connected to the first terminal sections 113. The resin portion 103 is formed on the plating 102 inside each through hole 101.

The optical device cavity structure C11 has the following advantageous effects.

It is possible to secure the light-transmitting member 124 in close contact with the light-transmitting member placement section 15*a*.

It is possible to prevent light to be received by, or light to be emitted from, the optical element chip 121 from being diffusively reflected by the surface of the conductive threads 123, 123, . . . .

It is possible to place the optical element chip 121 on the chip placement section 114 with the optical plane being generally parallel to the mounting surface.

It is possible to prevent the optical device cavity structure C11 from warping toward the mounting surface due to the formation of the cavity portion 2.

It is possible to prevent, with desirable moisture absorbency, the mounted light-transmitting member from being fogged.

With a conventional optical device cavity structure, it is necessary to provide ribs in order to place a light-transmitting member, an optical component, etc., while being spaced apart from an optical element chip. In contrast, with the optical device cavity structure C11, it is not necessary to additionally provide ribs because the second and third insulator layers 13 and 15 and the third metal layer 16 layered above the chip placement section 114 function as ribs.

Since the first terminal sections 113, 113, . . . , have a structure such that solder fillets are likely to be formed between the first terminal sections 113, 113, . . . , and connection terminals on the wiring substrate, it is possible to make an easy and reliable connection to the wiring substrate. Thus, the optical device cavity structure C11 can provide an optical device that has desirable optical characteristics and can reliably be connected to the wiring substrate.

—Structure of Optical Device D11—

Figure 45A:
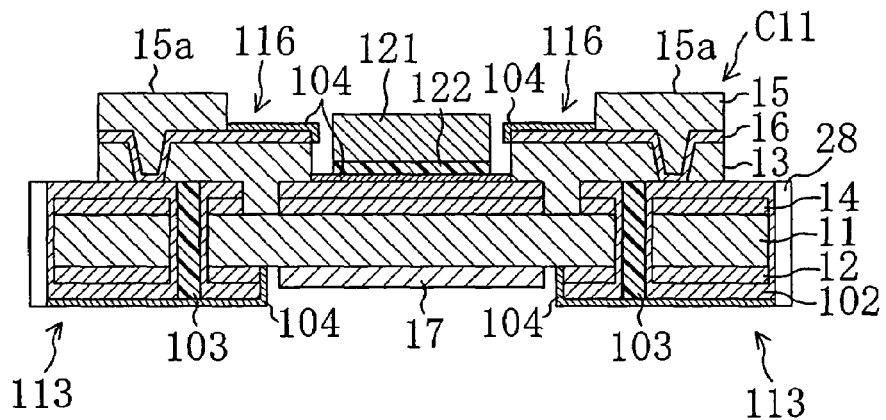
FIGS. 45A to 45C are cross-sectional views showing the manufacturing process of an optical device D11 according to Embodiment 11.
Figure 45B:
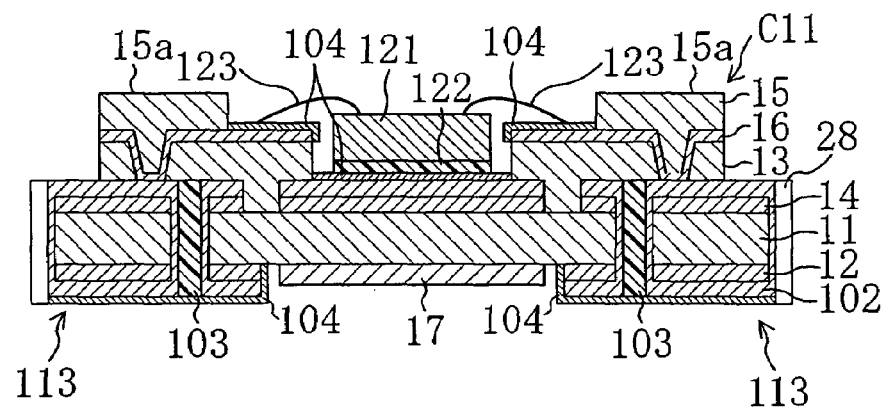
Figure 45C:
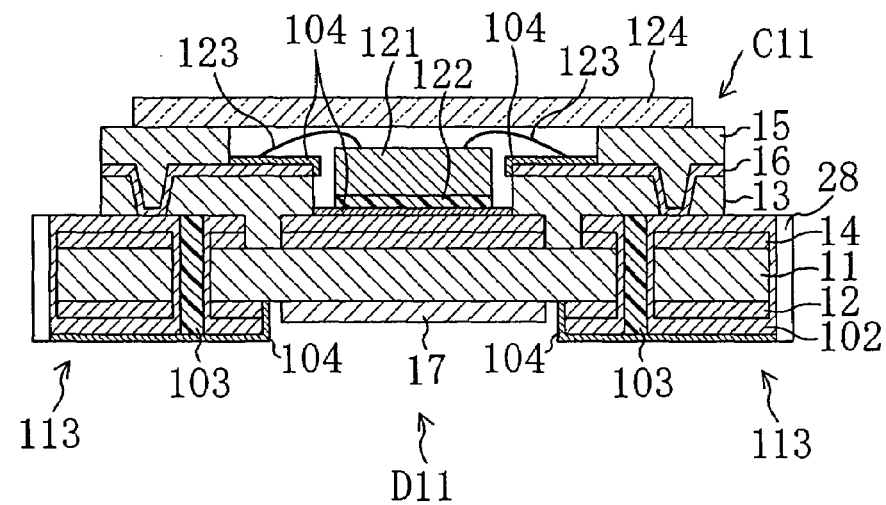
Figure 46A:
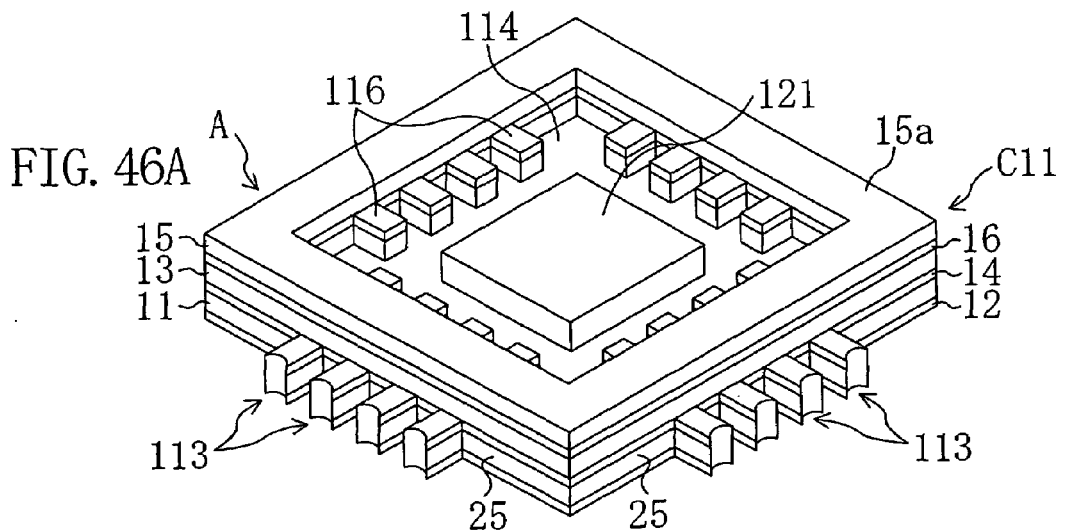
FIGS. 46A to 46C are diagrams showing the manufacturing process of the optical device D11 according to Embodiment 11.
Figure 46B:
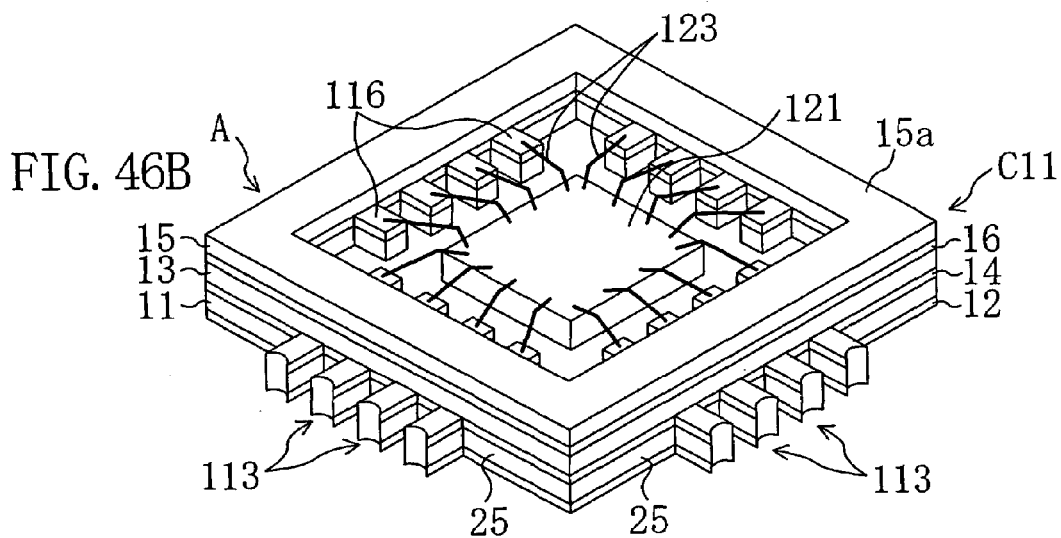
Figure 46C:
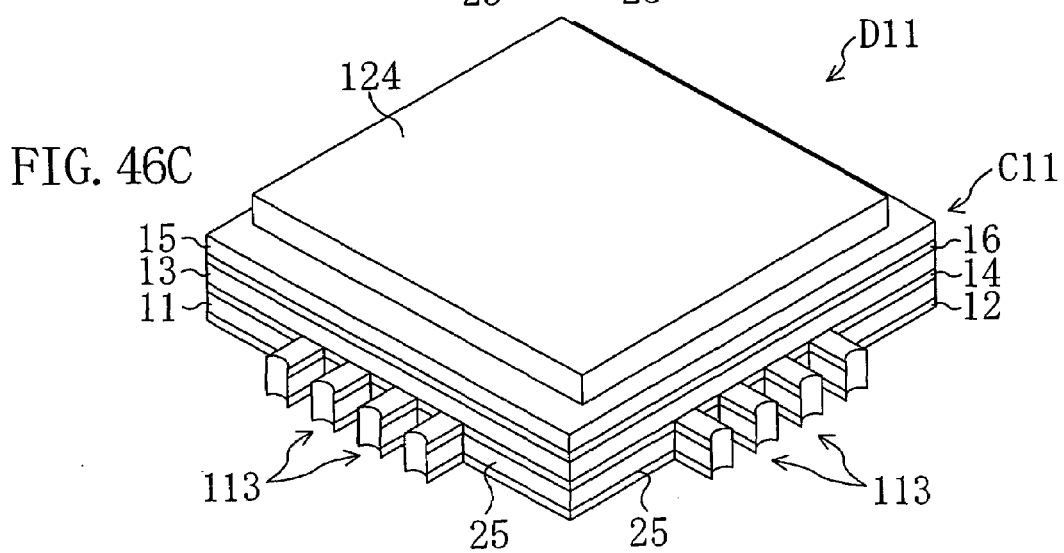

As shown in FIGS. 45C and 46C, the optical device D11 includes the optical device cavity structure C11, the optical element chip 121 and the light-transmitting member 124. The optical element chip 121 is a light-receiving element or a light-emitting element secured on the chip placement section 114 via the adhesive 122, and is connected to the second terminal sections 116, 116, . . . , via the conductive threads 123, 123, . . . . The light-transmitting member 124 is a member placed on the light-transmitting member placement section 15*a*, and transmits 70% or more, preferably 80% or more, and more preferably 90% or more, of incident light. Specifically, the light-transmitting member 124 is a glass plate.

After the optical device D11 is mounted on the wiring substrate, a voltage is applied to the optical element chip 121 via the first terminal sections 113, 113, . . . , the second terminal sections 116, 116, . . . , and the conductive threads 123, 123, . . . . Thus, the optical element chip 121 emits light, and the emitted light is output to the outside of the optical device D11 through the light-transmitting member 124.

Alternatively, light transmitted through the light-transmitting member 124 is received by the optical element chip 121.

Thus, the optical device D11, which is obtained by placing the optical element chip 121 and the light-transmitting member 124 on the optical device cavity structure C11, provides substantially the same advantageous effects as those of the optical device cavity structure C11.

—Method for Manufacturing Optical Device Cavity Structure C11—

Figure 43A:
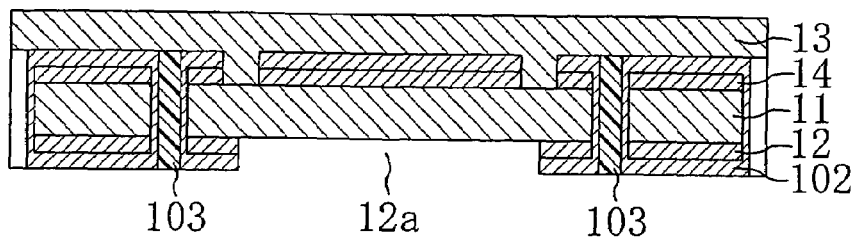
FIGS. 43A to 43E are cross-sectional views showing another part of the manufacturing process of the optical device cavity structure C11 according to Embodiment 11.
Figure 43B:
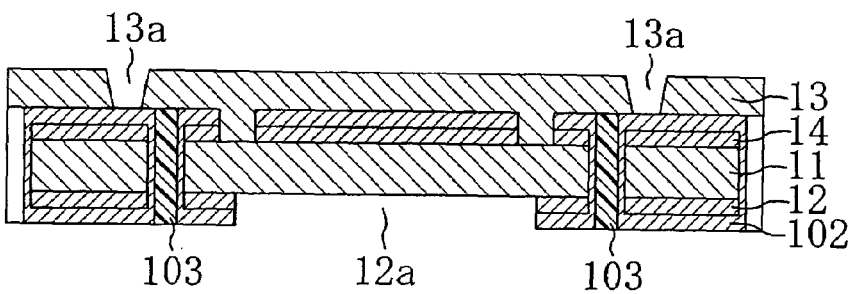
Figure 43C:
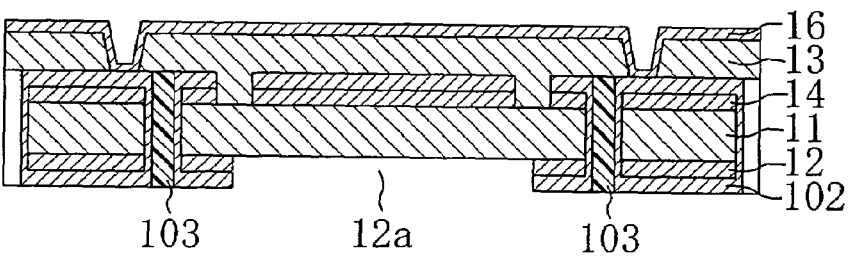
Figure 43D:
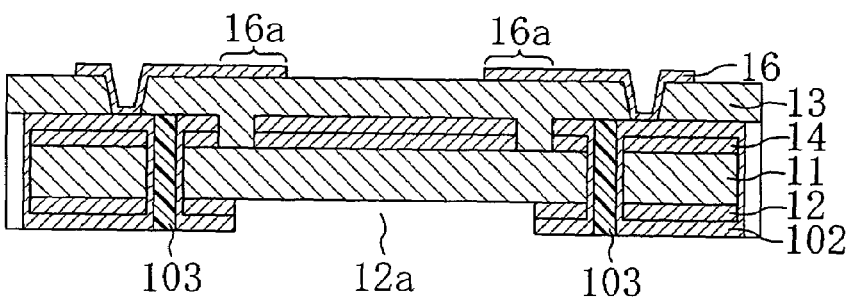
Figure 43E:
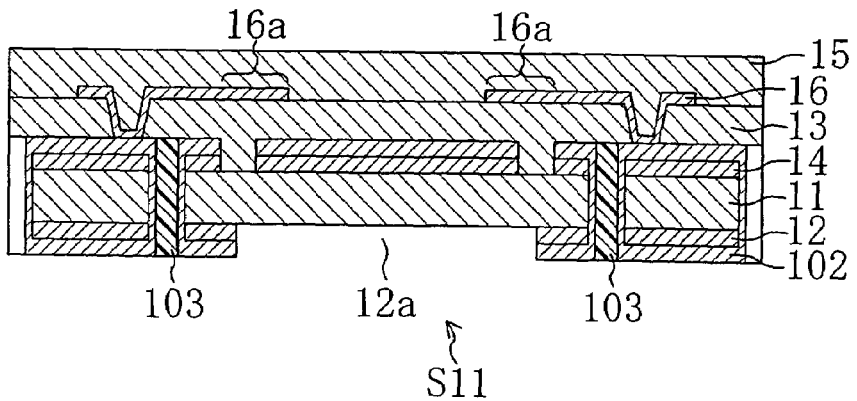
Figure 44A:
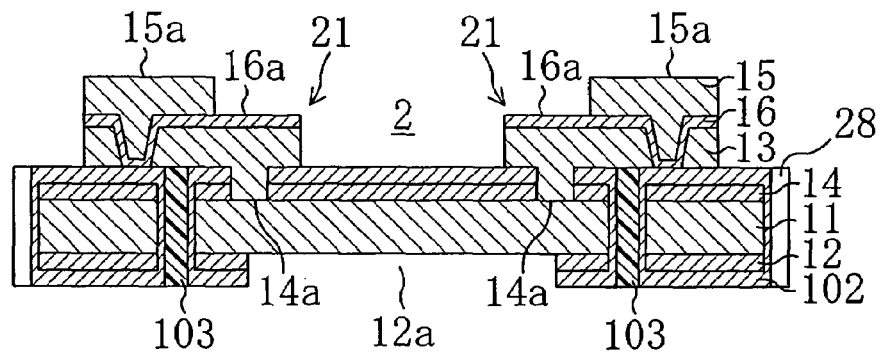
FIGS. 44A to 44C are cross-sectional views showing still another part of the manufacturing process of the optical device cavity structure C11 according to Embodiment 11.
Figure 44B:
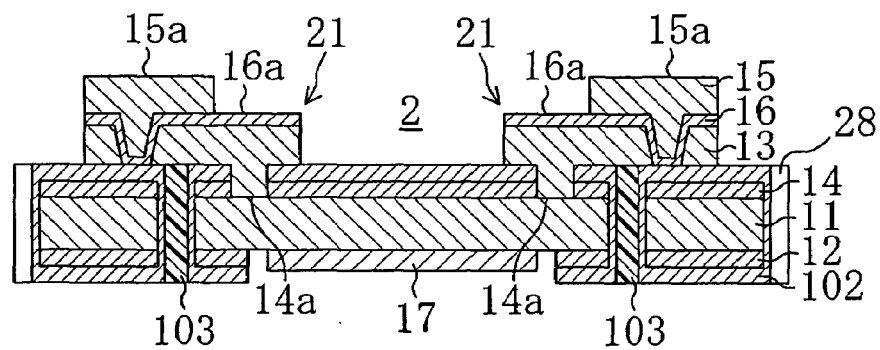
Figure 44C:
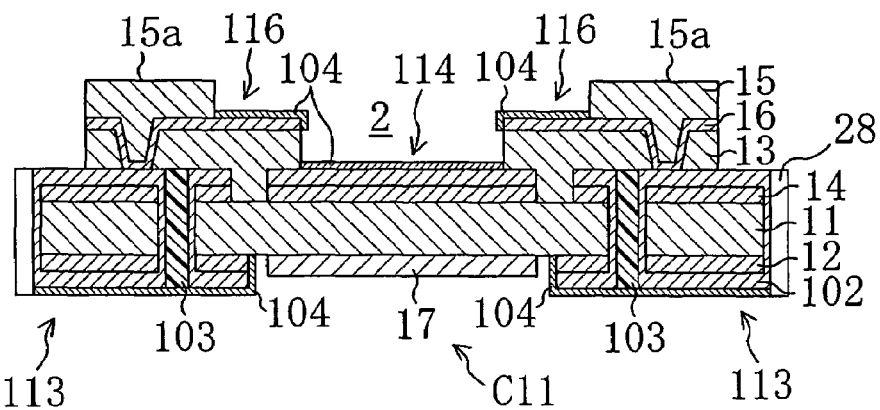

A base substrate SC is manufactured through steps shown in FIGS. 42A to 43E, and then a laser light irradiation step shown in FIG. 44A is performed to obtain the optical device cavity structure C11 shown in FIG. 44C. The details will be described below.

1. Step of Forming Base Substrate SC

First, as shown in FIG. 42A, the first metal layer 12 is formed on the lower surface of the first insulator layer 11, and the second metal layer 14 is formed on the upper surface of the first insulator layer 11, thus forming a layered structure including the three layers layered together.

Then, a spot laser irradiation is performed on the lower surface of the first metal layer 12 or the upper surface of the second metal layer 14 in order to form an electric connection between the first metal layer 12 and the second metal layer 14 and to shape the protruding tip portion of the first terminal section 113 into the curved surface 28. This forms through holes. As shown in FIG. 42B, the through hole portion 101 and the curved surface 28 are formed, running through the first metal layer 12, the first insulator layer 11 and the second metal layer 14. As a through hole is formed in a portion, corresponding to a first tongue-shaped portion, of the second metal layer 14 to be the upper surface of the first terminal section 113, the curved surface 28 is obtained. The ends of the layered structure are not shown in the figure, and the through holes are not clearly shown.

Then, as shown in FIG. 42C, the plating 102 is applied, by forming an Ni layer and then forming an Au layer, on the surface of the lower surface of the first metal layer 12, the upper surface of the second metal layer 14, the through hole portion 101 and the curved surface 28.

Then, as shown in FIG. 42D, a resin is poured into each through hole portion with the plating 102 having been applied to the inner wall thereof, thereby forming the resin portion 103. Then, a plating (not shown) is applied on the resin portions 103 on the surface of the plating 102.

Then, although not shown in the drawings, the lower surface of the first metal layer 12 and the upper surface of the second metal layer 14 are patterned, and these layers are etched. Specifically, an etching mask is formed over a peripheral portion of the lower surface of the first metal layer 12 (more specifically, an etching mask is formed so as to cover the plating 102 in a tongue shape pattern corresponding to the first terminal section 113). An etching mask is formed on the upper surface of the second metal layer 14 so as to cover the plating 102 in a tongue shape pattern corresponding to the first terminal section 113 in a peripheral portion the upper surface of the second metal layer 14 while covering the entire central portion of the upper surface of the second metal layer 14, wherein the tongue-shaped portion (first tongue-shaped portion) and the central portion are not connected to each other. Then, the layered structure with the etching mask formed thereon is etched. Thus, as shown in FIG. 42E, the central portion of the first metal layer 12 is etched away, thereby forming the warp preventing depressed portion 12a. The second metal layer 14 is partially etched away, whereby a portion of the second metal layer 14 on the inner side with respect to the etched portion 14a (i.e., the central portion of the second metal layer 14) becomes the chip placement section 114, and the first tongue-shaped portion is formed along the periphery, which will be the upper surface of the first terminal section 113.

Then, as shown in FIG. 43A, the second insulator layer 13 is formed on the upper surface of the second metal layer 14, which has been plated with the plating 102, and in the etched portion 14a.

Then, an etching mask is formed partially over the upper surface of the second insulator layer 13, and the second insulator layer 13 is etched. Thus, as shown in FIG. 43B, the 16 etched portions 13a, 13a, . . . , are formed on the outer side with respect to the resin portions 103, each corresponding to one of the resin portions 103.

Then, as shown in FIG. 43C, the third metal layer 16 is formed on the upper surface of the second insulator layer 13 and the upper surface of each etched portion 13a.

Then, although not shown in the drawings, an etching mask is formed over the upper surface of the third metal layer 16. The etching mask is formed along a peripheral portion of the upper surface of the third metal layer 16 (except for portions thereof corresponding to the first terminal section 113), and is formed in a pattern of a plurality of tongue shapes extending from the peripheral portion toward the central portion of the surface of the third metal layer. Then, after the layered structure is etched, portions of the third metal layer over which the etching mask is formed are left unetched, as shown in FIG. 43D. Thus, through this step, the third metal layer 16 is shaped into a portion extending over the peripheral portion of the surface of the second insulator layer 13 and into a plurality of second tongue-shaped portions 16a extending from the peripheral portion toward the central portion of the surface of the second insulator layer 13.

Then, as shown in FIG. 43E, the third insulator layer 15 is formed on the upper surface of the third metal layer 16 and on portions of the second insulator layer 13 that have been exposed through the etching process. Thus, the base substrate S11 is obtained.

2. Laser Light Irradiation Step

First, the entire upper surface of the base substrate S11 shown in FIG. 43E is irradiated with laser light. Specifically, a central portion of the surface of the base substrate S11 and a peripheral portion thereof where the first terminal section 113 is formed are irradiated with laser light that is more powerful in terms of the laser intensity, or the like, and a portion between the central portion and the peripheral portion where the first terminal section 113 is formed is irradiated with laser light that is less powerful in terms of the laser intensity, or the like. The central portion of the surface of the base substrate S11 is a portion of the surface of the base substrate S11 where the third metal layer 16 is absent and portions thereof corresponding to the tongue-shaped portions 16a. Irradiating the central portion of the surface of the base substrate S11 with the more powerful laser light removes a portion of the third insulator layer 15 that is irradiated with laser light, a portion of the second insulator layer 13 that is not covered by the third metal layer 16, and a peripheral portion of the first insulator layer 11 that is not covered by the second metal layer 14, as shown in FIG. 44A. As the third insulator layer 15 is removed, a plurality of second tongue-shaped portions 16a, . . . , are exposed, thereby forming a plurality of protruding portions 21, . . . , along the inner wall surface of the cavity portion 2. As the second insulator layer 13 is removed, a central portion of the second metal layer 14 is exposed, thus forming the bottom surface of the cavity portion 2, and the upper surfaces of the first terminal sections 113, being the plurality of first tongue-shaped portions, are exposed. As the peripheral portion of the first insulator layer 11 is removed, the first terminal section 113 is formed. In this process, each metal layer functions as a laser stop layer. Therefore, at the end surface (side surface) of each protruding portion 21, the second insulator layer 13 and the third metal layer 16 are flush with each other. The laser irradiation conditions are preferably adjusted so that the Rz value of the surface of the second metal layer 14 is greater than or equal to 1 μm and less than or equal to 5 μm.

Due to the irradiation with the less powerful laser light, the surface of a portion of the third insulator layer 15, which is left unetched between the central portion and the peripheral portion where the first terminal section 113 is formed, is roughened to serve as the light-transmitting member placement section 15a. The degree of roughening is such that the Rz value is greater than or equal to 5 μm and less than or equal to 20 μm.

Then, as shown in FIG. 44B, the insulator layer 17 is formed in the warp preventing depressed portion 12a. Thus, it is possible to prevent shorting between the first terminal sections 113.

Then, the plating 104 is applied on the upper surface of the tongue-shaped portions 16a, 16a, . . . , thereby forming the second terminal sections 116, 116, . . . . The plating 104 is applied on the upper surface of the second metal layer 14, which has been plated with the plating 102, thereby forming the chip placement section 114. The plating 104 is applied on the surface of the first metal layers 12, 12, . . . , thereby forming the first terminal sections 113, 113, . . . . It is possible to manufacture the optical device cavity structure C11 shown in FIG. 40 as described above.

The method for manufacturing the optical device cavity structure C11 has the following advantageous effects.

The optical device cavity structure C11 is obtained by removing unnecessary portions of insulator layers through laser light irradiation. Therefore, it is possible to manufacture the optical device cavity structure C11 without forming an isolation trench in advance.

In the optical device cavity structure C11, the cavity portion 2 is formed by laser irradiation, and the upper surface of the cavity portion 2 serves as the light-transmitting member placement section 15a. Therefore, as opposed to a conventional method for manufacturing an optical device cavity structure, it is not necessary to separate provide a step of forming ribs for placing a light-transmitting member.

—Method for Manufacturing Optical Device D11—

First, as shown in FIGS. 45A and 46A, the optical element chip 121 is bonded to the chip placement section 114 by using the adhesive 122.

Then, as shown in FIGS. 45B and 46B, the optical element chip 121 is electrically connected to the second terminal sections 116, 116, . . . , by using the 16 conductive threads 123, 123, . . . . In this process, it is preferred that the conductive threads 123, 123, . . . , are connected to the semiconductor element chip 121 and the second terminal sections 116, 116, . . . , by using a conductive adhesive (not shown). Then, the conductive threads 123, 123, . . . , are sealed with a resin (not shown).

Then, as shown in FIGS. 45C and 46C, the light-transmitting member 124 is bonded to the light-transmitting member placement section 15a by using an adhesive (not shown). Thus, the light-transmitting member 124 can be secured in close contact with the light-transmitting member placement section 15a. It is possible to manufacture the optical device D11 as described above.

Then, the mounting surface on which the first terminal sections 113 are formed is mounted on the wiring substrate, thereby obtaining an optical apparatus (not shown). The first terminal sections 113, 113, . . . , connected to the wiring substrate in the mounting process are protruding outwardly each in a tongue shape pattern from the outer wall of the optical device, while the lower surface thereof and the side surface of the protruding tip portion thereof are covered by a conductive layer. Therefore, with the lower surface and the curved portion, it is possible to ensure a high solder mounting strength between the optical device and the wiring substrate, whereby it is possible to easily form solder fillets, and to realize a reliable and firm connection.

The optical device cavity structure C11 may include means capable of visualizing the position of a first terminal section associated with a particular function. Optical device cavity structures C111 and C211 will now be described.

Variation 1

Figure 47:
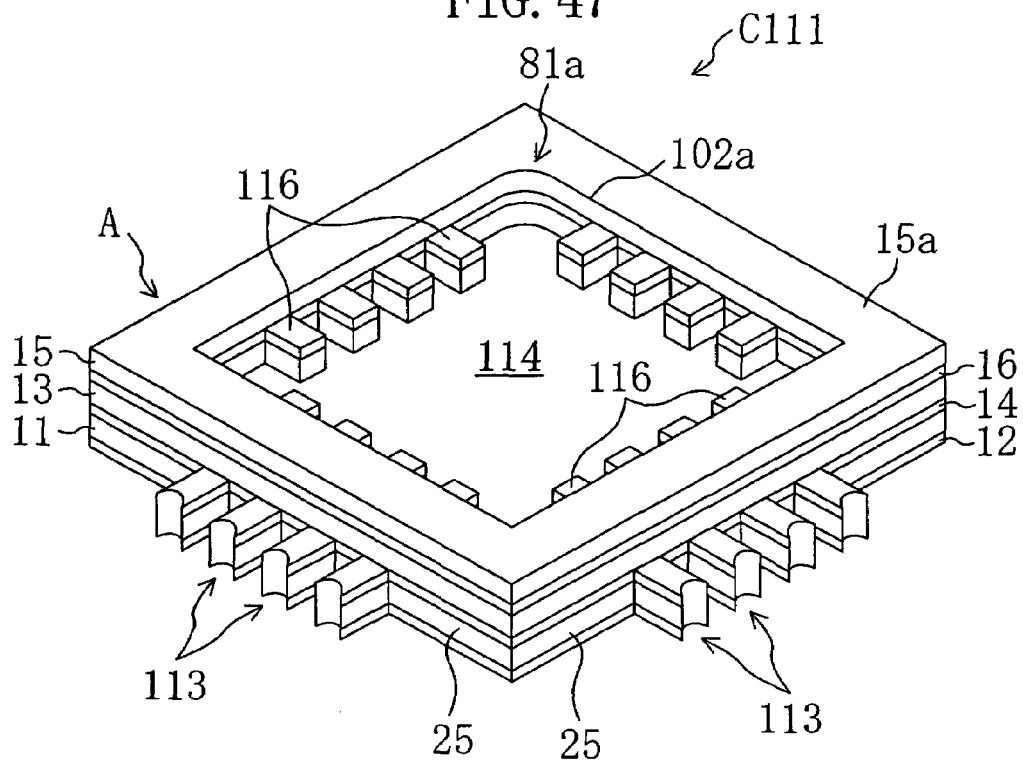
FIG. 47 is a perspective view showing the structure of the optical device cavity structure C111 according to Variation 1 of Embodiment 11.

FIG. 47 shows the optical device cavity structure C111 of Variation 1. With the optical device cavity structure C111, it is possible to identify the position of a first terminal section associated with a particular function by looking at the shape of the opening 102a of the cavity portion.

Specifically, the outline shape of the opening 102a of the cavity portion does not have point symmetry with respect to a generally center point of the opening 102a, as shown in FIG. 47. More specifically, one of the four corners of the rectangular opening 102a is in an arc shape (hereinafter the arc-shaped corner 81a will be referred to as "the non-point-symmetry portion 81a"). The non-point-symmetry portion 81a is formed at a position along the outline of the opening that is closest to the first terminal section associated with the particular function. Therefore, it is possible to identify the position of the first terminal section associated with the particular function by looking at the optical device cavity structure C111 from above the opening 102a.

The outline shape of the opening of the cavity portion is not limited to that specified above. For example, the outline of the opening may be a rectangular shape with one coiner thereof being filled with a generally triangular prism.

Variation 2

Figure 48:
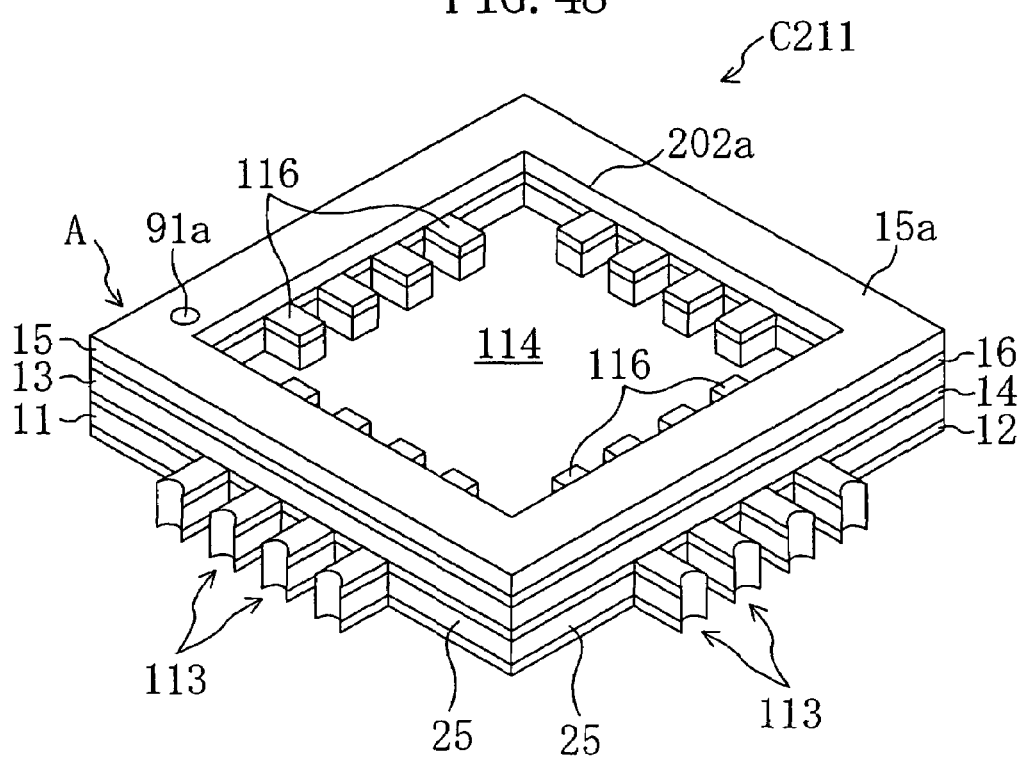
FIG. 48 is a perspective view showing the structure of the optical device cavity structure C211 according to Variation 2 of Embodiment 11.

FIG. 48 shows the optical device cavity structure C211 of Variation 2. With the optical device cavity structure C211, it is possible to identify the position of a first terminal section associated with a particular function by looking at the upper surface of the optical device cavity structure C211.

Specifically, the hole 91a is formed on the upper surface of the optical device cavity structure C211, as shown in FIG. 48, and the first terminal section associated with the particular function is located near the hole 91a. Therefore, it is possible to identify the first terminal section associated with the particular function by looking at the upper surface of the optical device cavity structure C211.

EMBODIMENT 12

Figure 49:
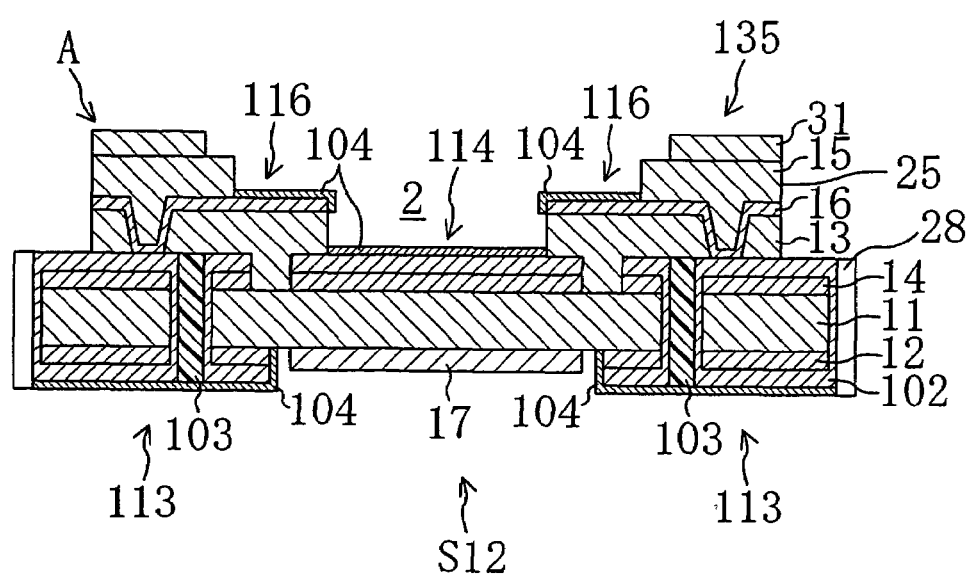
FIG. 49 is a cross-sectional view showing the structure of an optical device cavity structure C12 according to Embodiment 12.
Figure 50A:
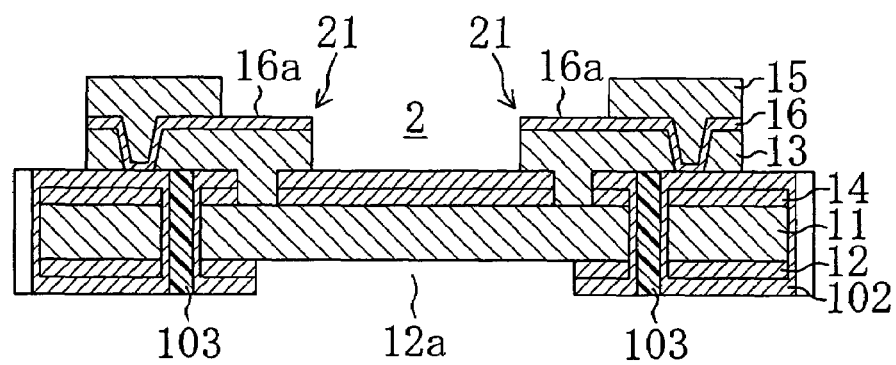
FIGS. 50A and 50B are cross-sectional views showing a part of the manufacturing process of the optical device cavity structure C12 according to Embodiment 12.
Figure 50B:
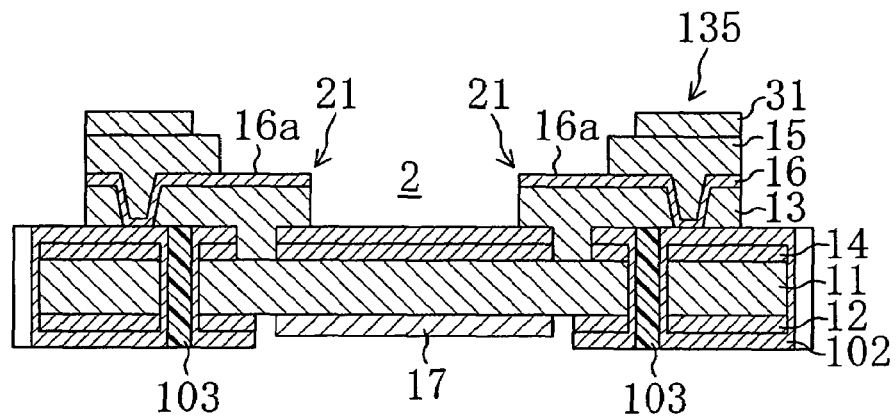

Referring to FIGS. 49 to 50B, the structure and manufacturing method of an optical device cavity structure C12 according to Embodiment 12 of the present invention will now be described. FIG. 49 is a cross-sectional view showing the structure of the optical device cavity structure C12.

FIGS. 50A and 50B are cross-sectional views showing a part of the manufacturing process of the optical device cavity structure C12.

—Structure of Optical Device Cavity Structure C12—

As opposed to the optical device cavity structure C11 of Embodiment 11, the optical device cavity structure C12 of the present embodiment includes the resist layer 31 formed on the surface of the third insulator layer 15, as shown in FIG. 49, with the upper surface of the resist layer 31 serving as the light-transmitting member placement section 135. Thus, since the light-transmitting member placement section 135 is the surface of the resist layer 31, the light-transmitting member 124 can be secured in close contact with the light-transmitting member placement section 135 in the optical device cavity structure C12.

The term "resist layer" as used herein refers to a layer that is formed on the foremost surface of the substrate in order to improve the resistance to shock, moisture and heat, e.g., to prevent corrosion of wirings or to prevent shorting between wirings (maintain the insulation reliability). A typical material of the resist layer is obtained by mixing an acrylic resin with an epoxy curing agent, and serves also as an insulator.

It is more preferred that the resist layer 31 is formed on the roughened surface of the third insulator layer, whereby it is possible to more firmly secure the light-transmitting member 124.

—Method for Manufacturing Optical Device Cavity Structure C12—

First, a base substrate of the optical device cavity structure C12 is manufactured through steps shown in FIGS. 42A to 43E as described above in Embodiment 11.

Then, a central portion of the base substrate (specifically, a portion of the surface of the base substrate where the third metal layer 16 is absent and portions thereof corresponding to the tongue-shaped portions 16a) is irradiated with laser light. Then, as shown in FIG. 50A, a portion of the third insulator layer 15 irradiated with laser light and a portion of the second insulator layer 13 that is not covered by the third metal layer 16 are removed.

Then, as shown in FIG. 50B, the resist layer 31 is formed on the surface of the third insulator layer 15. Thus, the light-transmitting member placement section 135 is obtained.

Thereafter, the plating process shown in FIG. 44C is performed as described above in Embodiment 11, thereby obtaining the optical device cavity structure C12 shown in FIG. 49, and the steps shown in FIGS. 45A to 46C are performed, thereby obtaining an optical device (not shown) including the optical device cavity structure C12.

EMBODIMENT 13

Figure 51:
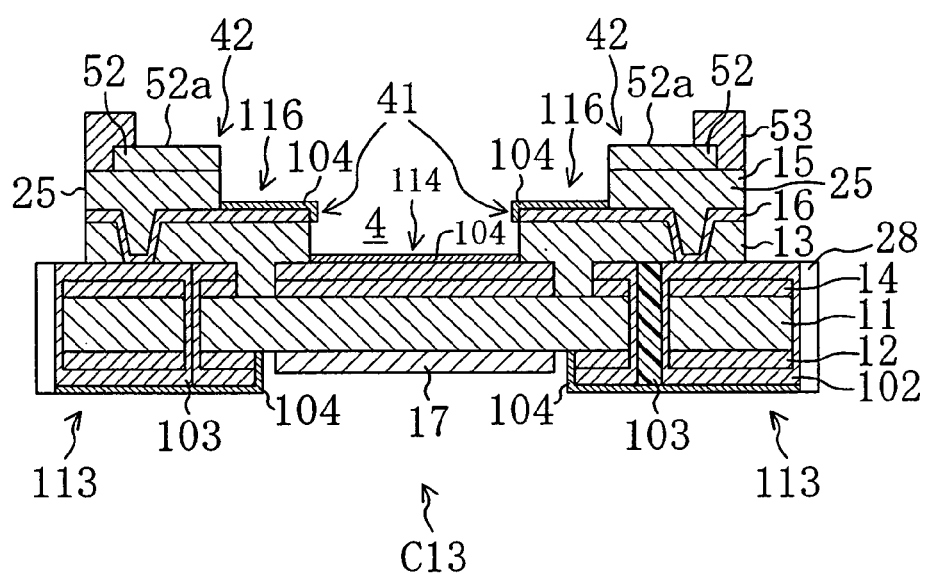
FIG. 51 is a cross-sectional view showing the structure of an optical device cavity structure C13 according to Embodiment 13.

Referring to FIGS. 51 to 53C, the structure and manufacturing method of an optical device cavity structure C13 and those of an optical device D13 according to Embodiment 13 of the present invention will now be described. FIG. 51 is a cross-sectional view showing the structure of the optical device cavity structure C13. FIGS. 52A to 53C are cross-sectional views showing the manufacturing process of the optical device cavity structure C13 and that of the optical device D13.

—Structure of Optical Device Cavity Structure C13—

As opposed to the optical device cavity structure C11 of Embodiment 11, the optical device cavity structure C13 includes the fourth metal layer 52 and the fourth insulator layer 53 layered in this order on the third insulator layer 15, as shown in FIG. 51. The fourth metal layer 52 is preferably a Cu layer, and the fourth insulator layer 53 is preferably an insulator layer containing a moisture-absorbing porous material.

The inner wall surface of a cavity portion 4 is formed by the second insulator layer 13, the third metal layer 16, the third insulator layer 15, the fourth metal layer 52 and the fourth insulator layer 53, which are layered in this order from the bottom surface toward the opening, and a total of 16 first protruding portions 41, 41, . . . , and one second protruding portion 42 are formed along the inner wall surface. The first protruding portions 41, 41, . . . , are formed on the inner wall surface, four on each side, while being equally spaced apart from one another so that the second insulator layer 13 and the third metal layer 16 are flush with each other along the three side surfaces of each protruding portion. The second protruding portion 42 protrudes over a shorter distance than the first protruding portions 41, and the third insulator layer 15 and the fourth metal layer 52 are flush with each other along the three side surfaces of the protruding portion.

The light-transmitting member placement section 52a of the present embodiment is the surface of the second protruding portion 42, and is thus formed in the cavity portion 4. Therefore, as compared with the optical device cavity structure C11, the optical device cavity structure C13 can provide a compact optical device.

—Method for Manufacturing Optical Device Cavity Structure C13—

First, a layered structure as shown in FIG. 43E is formed by the method shown in FIGS. 42A to 43E as described above in Embodiment 11.

Then, the fourth metal layer 52 is formed on the surface of the third insulator layer 15, after which an etching mask is formed over a large portion of the surface of the fourth metal layer 52 and an etching process is performed. Thus, it is possible to form the fourth metal layer 52 near a peripheral portion of the surface of the third insulator layer 15, as shown in FIG. 52A.

Figure 52A:
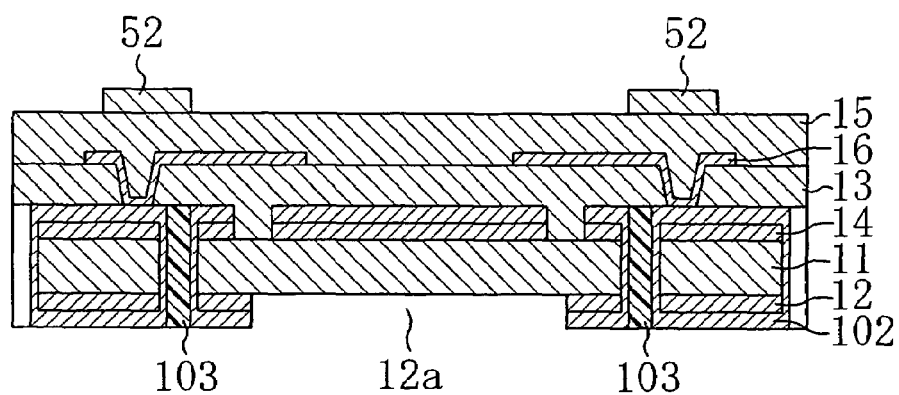
FIGS. 52A and 52B are cross-sectional views showing a part of the manufacturing process of the optical device cavity structure C13 according to Embodiment 13.
Figure 52B:
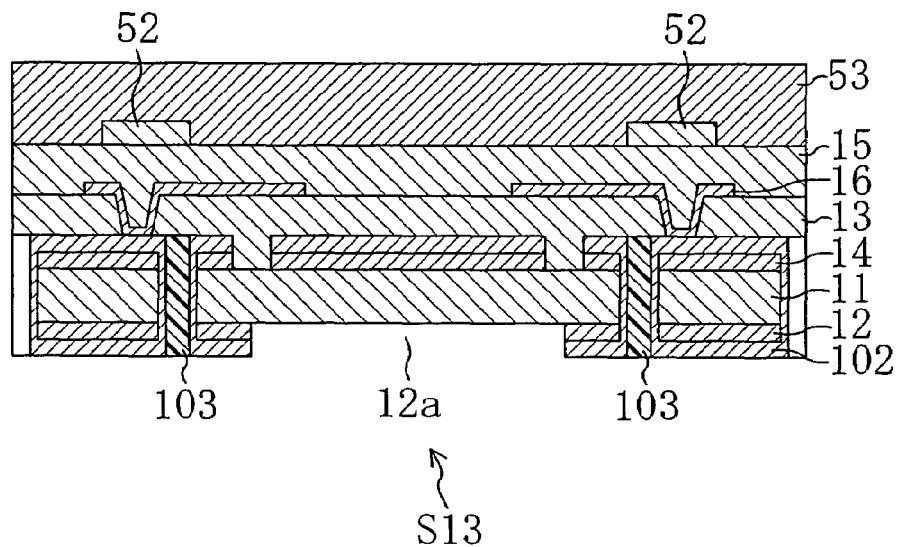

Then, the fourth insulator layer 53 is formed on the surface of the fourth metal layer 52 and on a portion of the surface of the third insulator layer 15 that has been exposed through the etching process of FIG. 52A. Thus, it is possible to obtain a base substrate Se of the optical device cavity structure C13 as shown in FIG. 52B.

Figure 53A:
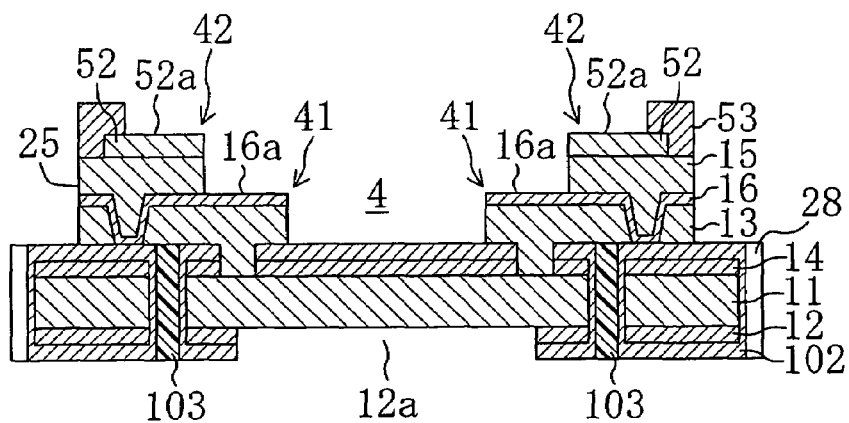
FIGS. 53A to 53C are cross-sectional views showing a part of the manufacturing process of an optical device D13 according to Embodiment 13.

Then, a central portion of the base substrate S13 (specifically, a portion of the surface of the base substrate Se where the third metal layer 16 is absent and portions thereof corresponding to the tongue-shaped portion 16a and a peripheral portion of the tongue-shaped portion 16a) is irradiated with laser light. Then, as shown in FIG. 53A, a portion of the second insulator layer 13 that is not covered by the third metal layer 16 and a portion of the third insulator layer 15 are removed, thereby forming the cavity portion 2 and the first protruding portions 41, 41, . . . . Moreover, a portion of the fourth insulator layer 53 is removed to form the second protruding portion 42, thus forming the light-transmitting member placement section 52a.

Then, the plating process shown in FIG. 44C is performed as described above in Embodiment 11, thereby obtaining the optical device cavity structure C13 shown in FIG. 51.

Figure 53B:
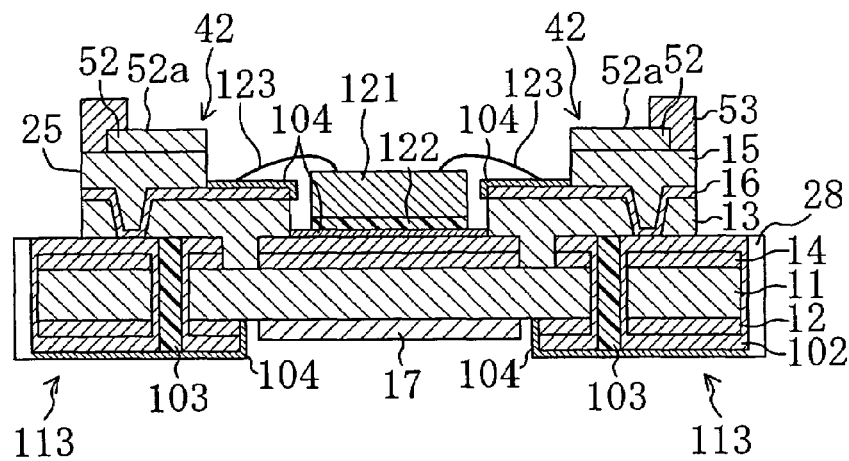

Then, as shown in FIG. 53B, the optical element chip 121 is secured on the chip placement section 114 by using the adhesive 122, and the second terminal sections 116, . . . , and the optical element chip 121 are electrically connected to each other by using the conductive threads 123, 123, . . . .

Figure 53C:
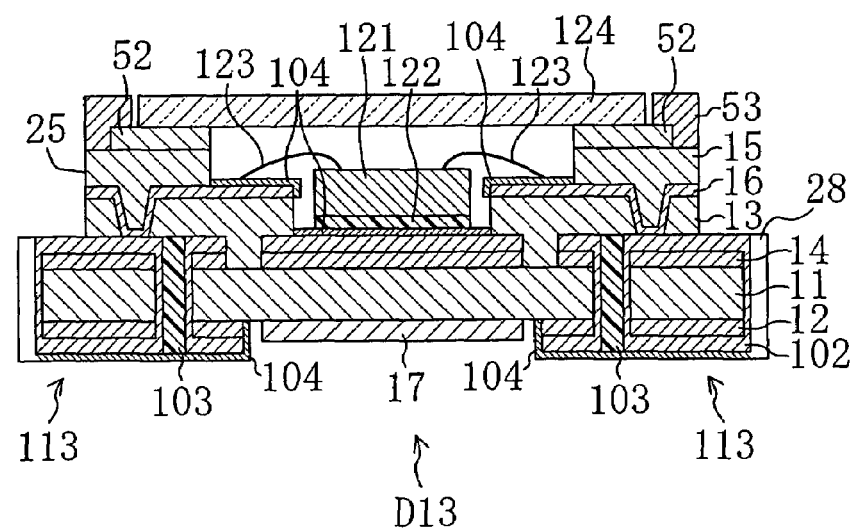

Then, as shown in FIG. 53C, the light-transmitting member 124 is placed on the light-transmitting member placement section 52a. Thus, it is possible to obtain the optical device D13.

EMBODIMENT 14

Figure 54:
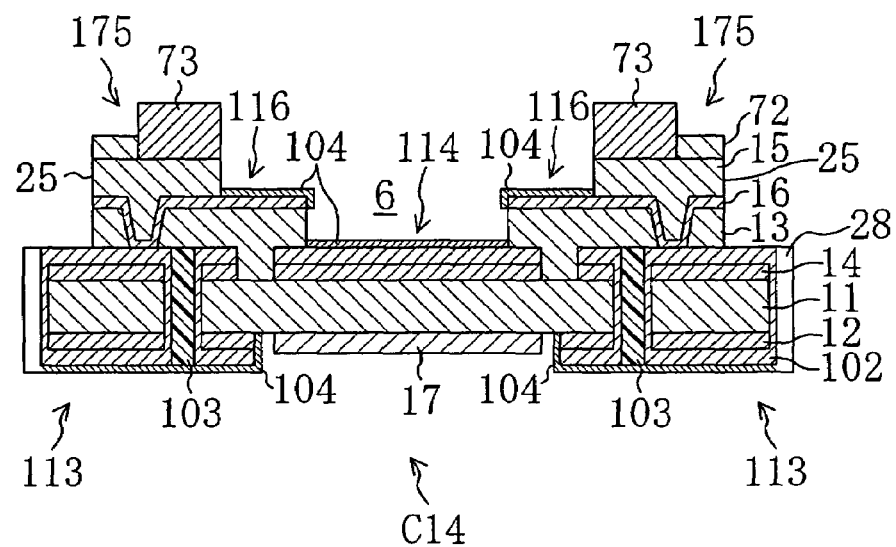
FIG. 54 is a cross-sectional view showing the structure of an optical device cavity structure C14 according to Embodiment 14.
Figure 55A:
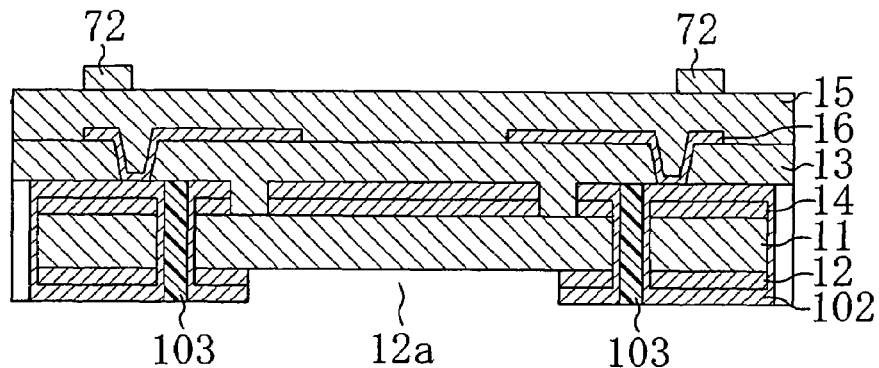
FIGS. 55A to 55C are cross-sectional views showing a part of the manufacturing process of the optical device cavity structure C14 according to Embodiment 14.
Figure 55B:
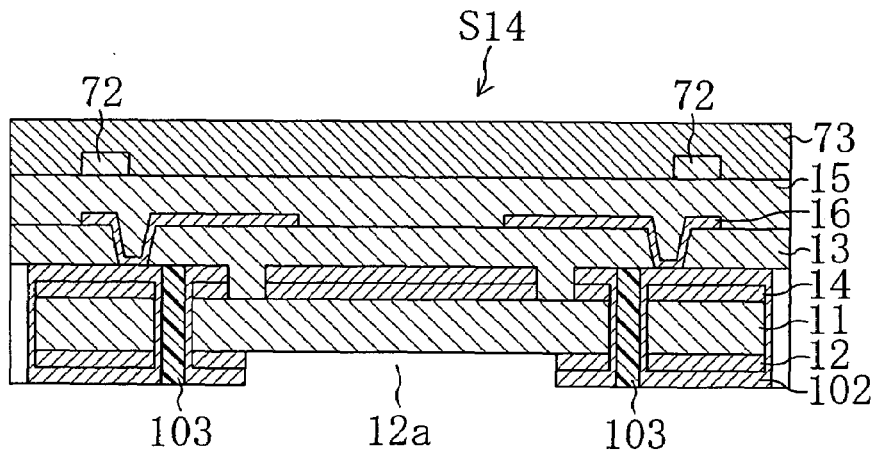
Figure 55C:
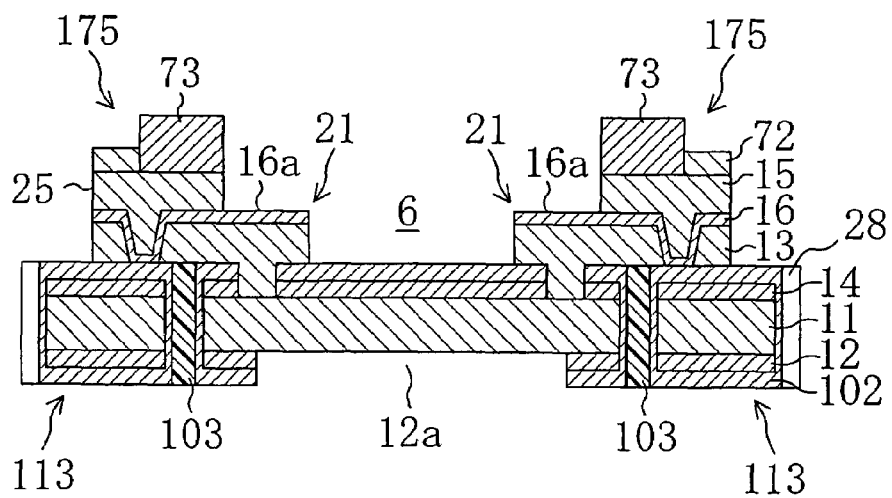
Figure 56:
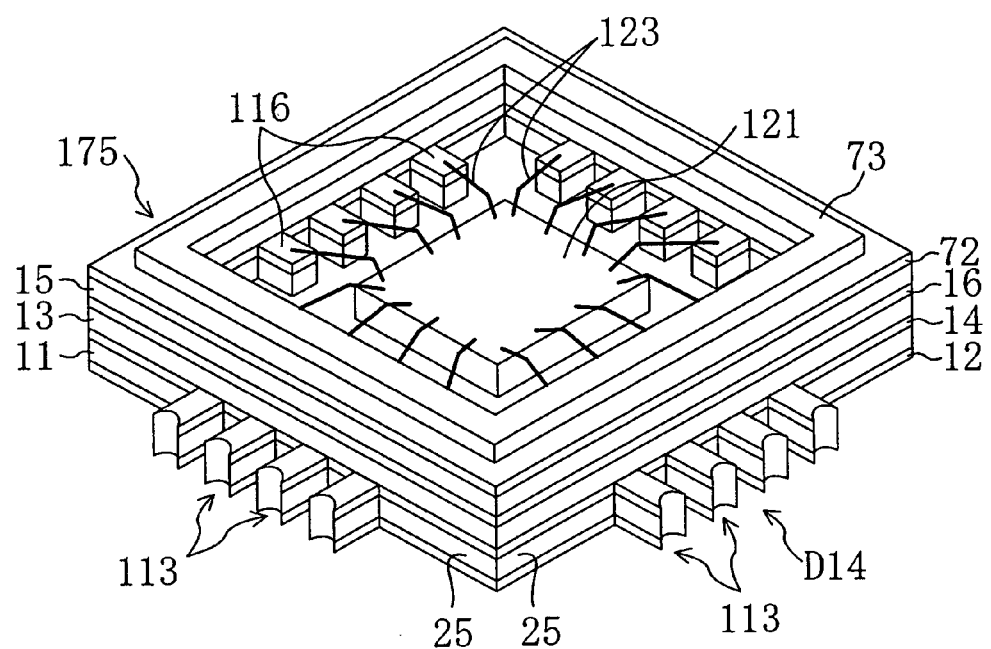
FIG. 56 is a perspective view showing an optical device D14 according to Embodiment 14.

Referring to FIGS. 54 to 56, the structure and manufacturing method of an optical device cavity structure C14 and those of an optical device D14 according to Embodiment 14 of the present invention will now be described. FIG. 54 is a cross-sectional view showing the structure of the optical device cavity structure C14. FIGS. 55A and 55B are cross-sectional views showing the manufacturing process of the optical device cavity structure C14. FIG. 56 is a perspective view showing the optical device D14.

—Structure of Optical Device Cavity Structure C14—

As opposed to the optical device cavity structure C11 of Embodiment 11, the optical device cavity structure C14 includes the fourth metal layer 72 and the fourth insulator layer 73 layered in this order on the third insulator layer 15, as shown in FIG. 54. The fourth metal layer 72 is preferably a Cu layer, and the fourth insulator layer 73 is preferably an insulator layer containing a moisture-absorbing porous material. The optical device cavity structure C14 includes the optical component fitting section 175, instead of a light-transmitting member placement section.

The inner wall surface of the cavity portion 6 is substantially the same as that of the cavity portion 2 of Embodiment 11, and is formed by the second insulator layer 13, the third metal layer 16 and the third insulator layer 15, which are layered in this order from the bottom surface toward the opening.

The optical component fitting section 175 is a section in which an optical component such as a lens barrel is to be fitted, and is formed so as to surround the opening of the cavity portion 6. The lower surface thereof is a part of the fourth metal layer 72.

—Method for Manufacturing Optical Device Cavity Structure C14—

First, a layered structure as shown in FIG. 43E is formed by the method shown in FIGS. 42A to 43E as described above in Embodiment 11.

Then, the fourth metal layer 72 is formed on the surface of the third insulator layer 15, after which an etching mask is formed over a central portion of the surface of the fourth metal layer 72 and an etching process is performed. Thus, it is possible to form the fourth metal layer 72 along the periphery of the upper surface of the third insulator layer 15, as shown in FIG. 55A.

Then, the fourth insulator layer 73 is formed on the surface of the fourth metal layer 72 and a portion of the surface of the third insulator layer 15 that has been exposed through the etching process of FIG. 55A. Thus, it is possible to obtain a base substrate S14 as shown in FIG. 55B.

Then, as described above in Embodiment 11, a central portion of the surface of the base substrate S14 is irradiated with laser light, thereby forming the cavity portion 6 and the protruding portions 21, 21, . . . . Moreover, the periphery of the surface of the base substrate S14 is irradiated with laser light, thereby removing a portion of the fourth insulator layer 73 and thus exposing the fourth metal layer 72. Thus, the optical component fitting section 175 is obtained.

Thereafter, the plating process shown in FIG. 44C is performed as described above in Embodiment 11, thereby obtaining the optical device cavity structure C14 as shown in FIG. 54.

Then, the optical element chip 121 is secured on the chip placement section 114 by using an adhesive, the second terminal sections 116, 116, . . . , and the optical element chip 121 are electrically connected to each other by using the conductive threads 123, 123, . . . , and an optical component (not shown) is placed on an optical component placement section 175. Thus, it is possible to obtain the optical device D14 as shown in FIG. 56.

EMBODIMENT 15

Figure 57A:
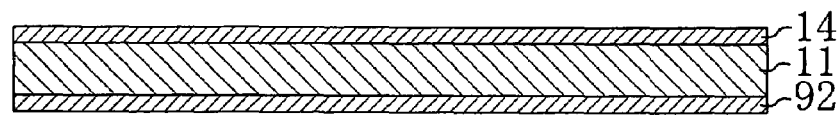
FIGS. 57A to 57D are cross-sectional views showing a part of the manufacturing process of an optical device cavity structure C15 according to Embodiment 15.
Figure 57B:
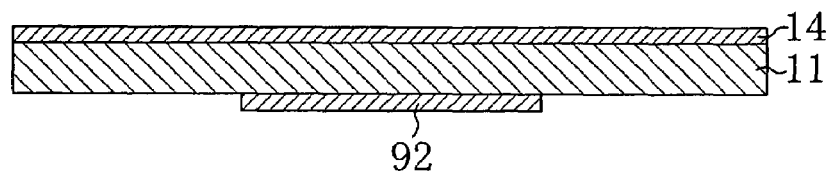
Figure 57C:
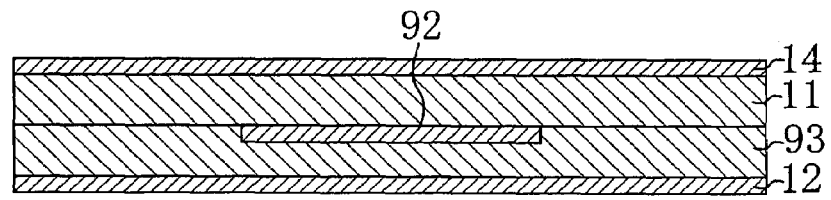
Figure 57D:
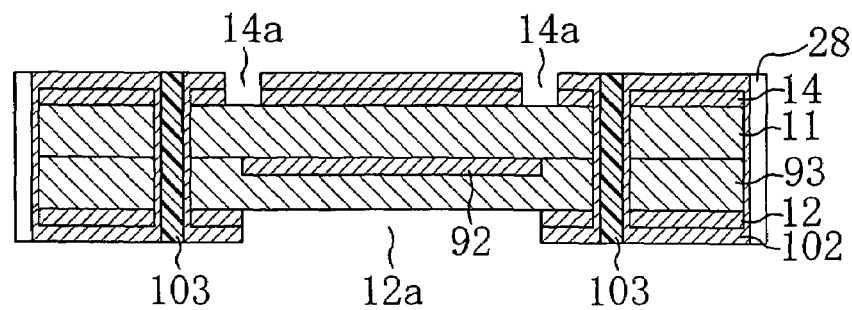
Figure 58A:
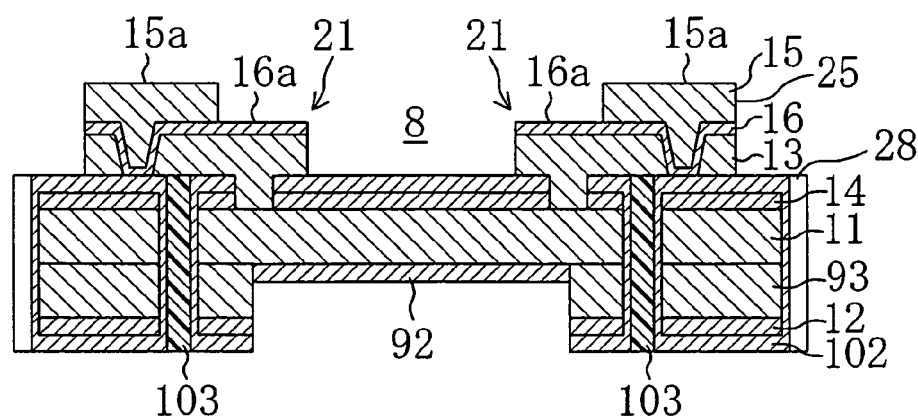
FIGS. 58A and 58B are cross-sectional views showing another part of the manufacturing process of the optical device cavity structure C15 according to Embodiment 15.
Figure 58B:
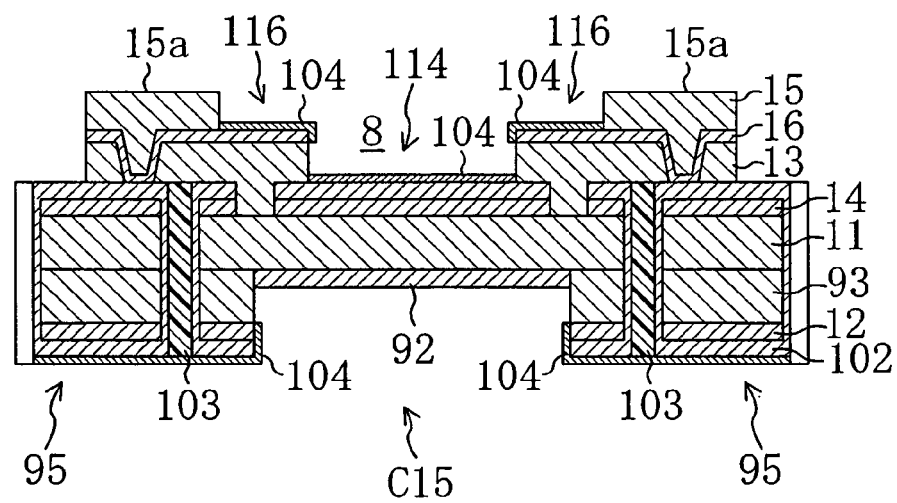
Figure 59:
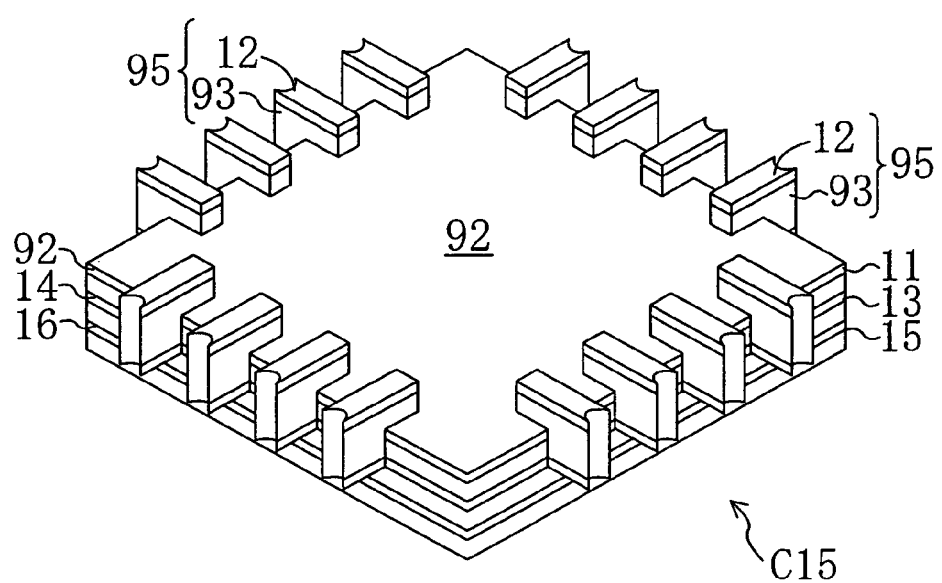
FIG. 59 is a perspective view showing the reverse surface side of the optical device cavity structure C15 according to Embodiment 15.

Referring to FIGS. 57A to 59, the structure and manufacturing method of an optical device cavity structure C15 according to Embodiment 15 of the present invention will now be described. FIGS. 57A to 58B are cross-sectional views showing the manufacturing process of the optical device cavity structure C15, and FIG. 59 is a perspective view showing the reverse surface side of the optical device cavity structure C15.

—Structure of Optical Device Cavity Structure C15—

As opposed to the optical device cavity structure C11 of Embodiment 11, the optical device cavity structure C15 includes the standoff insulator layer 93 and the standoff metal layer 92 layered between the first metal layer 12 and the first insulator layer 11. The standoff metal layer 92 is preferably a Cu layer, and the standoff insulator layer 93 is preferably an insulator layer containing a moisture-absorbing porous material.

The inner wall surface of the cavity portion 8 is substantially the same as that of the cavity portion 2 of Embodiment 11, and is formed by the second insulator layer 13, the third metal layer 16 and the third insulator layer 15, which are layered in this order from the bottom surface toward the opening.

As shown in FIG. 59, a first terminal section 95 is formed by the standoff insulator layer 93 and the first metal layer 12, and is protruding from the standoff metal layer 92. Therefore, as opposed to the optical device cavity structures C11, C12, C13 and C14 described above, the optical device cavity structure C15 can be firmly secured on the wiring substrate.

—Method for Manufacturing Optical Device Cavity Structure C15—

First, as shown in FIG. 57A, the second metal layer 14 is formed on the upper surface of the first insulator layer 11, and the standoff metal layer 92 is formed on the lower surface of the first insulator layer 11.

Then, although not shown in the drawings, an etching mask is formed partially over the lower surface of the standoff metal layer 92, and the standoff metal layer 92 is etched. Thus, the standoff metal layer 92 is left unetched at the center of the reverse surface of the first insulator layer 11, as shown in FIG. 57B.

Then, as shown in FIG. 57C, the standoff insulator layer 93 is formed on the reverse surface of the standoff metal layer 92 and a portion of the reverse surface of the first insulator layer 11 that has been exposed through the etching process of FIG. 57B, and the first metal layer 12 is formed on the reverse surface of the standoff insulator layer 93.

Then, the plating 102, the resin layer 103, the warp preventing depressed portion 12a and the etched portion 14a are formed by substantially the same method as that of Embodiment 11 shown in FIGS. 42D and 42E. Thus, it is possible to obtain a layered structure as shown in FIG. 57D.

Then, steps as shown in FIGS. 43A to 43E are performed as described above in Embodiment 11 to obtain a base substrate of the optical device cavity structure C15.

Then, the upper surface and the reverse surface of the base substrate are irradiated with laser light. In this process, the upper surface of the base substrate is irradiated with laser light by substantially the same method as the laser irradiation step of Embodiment 11, whereas the reverse surface of the base substrate is irradiated with laser light of substantially the same intensity across the reverse surface. As the reverse surface of the base substrate is irradiated with laser light, a portion of the standoff insulator layer 93 where the first metal layer 12 is absent is removed, thereby exposing the standoff metal layer 92.

Then, the plating process shown in FIG. 44C is performed as described above in Embodiment 11, thereby forming the first terminal section 95, the chip placement section 114, the first terminal section 95 and the second terminal sections 116, 116, . . . , thus obtaining the optical device cavity structure C15 as shown in FIG. 58B.

ALTERNATIVE EMBODIMENTS

The following variations may be made to Embodiments 1 to 15 of the present invention.

The number of the protruding portions 21 and the number of the first protruding portions 41 are not limited to those set forth above.

In each of the manufacturing methods of the optical device cavity structures C1 to C15, the base substrate is manufactured by layering together different layers.

Alternatively, a base substrate in which different layers are layered together in advance may be used.

Embodiments 2 to 5 may employ the non-point-symmetry portion 81a of Variation 1 of Embodiment 1 or the hole 91a of Variation 2.

In Embodiments 1 to 4, the first terminal section 112 may be the first terminal section 94 of Embodiment 5.

Embodiments 7 to 10 may employ the non-point-symmetry portion 81a of Variation 1 of Embodiment 6 or the hole 91a of Variation 2.

In Embodiments 6 to 9, the first terminal section 112 may be the first terminal section 94 of Embodiment 10.

Embodiments 12 to 15 may employ the non-point-symmetry portion 81a of Variation 1 of Embodiment 11 or the hole 91a of Variation 2.

In Embodiments 11 to 14, the first terminal section 113 may be the first terminal section 95 of Embodiment 15.

Figure 60:
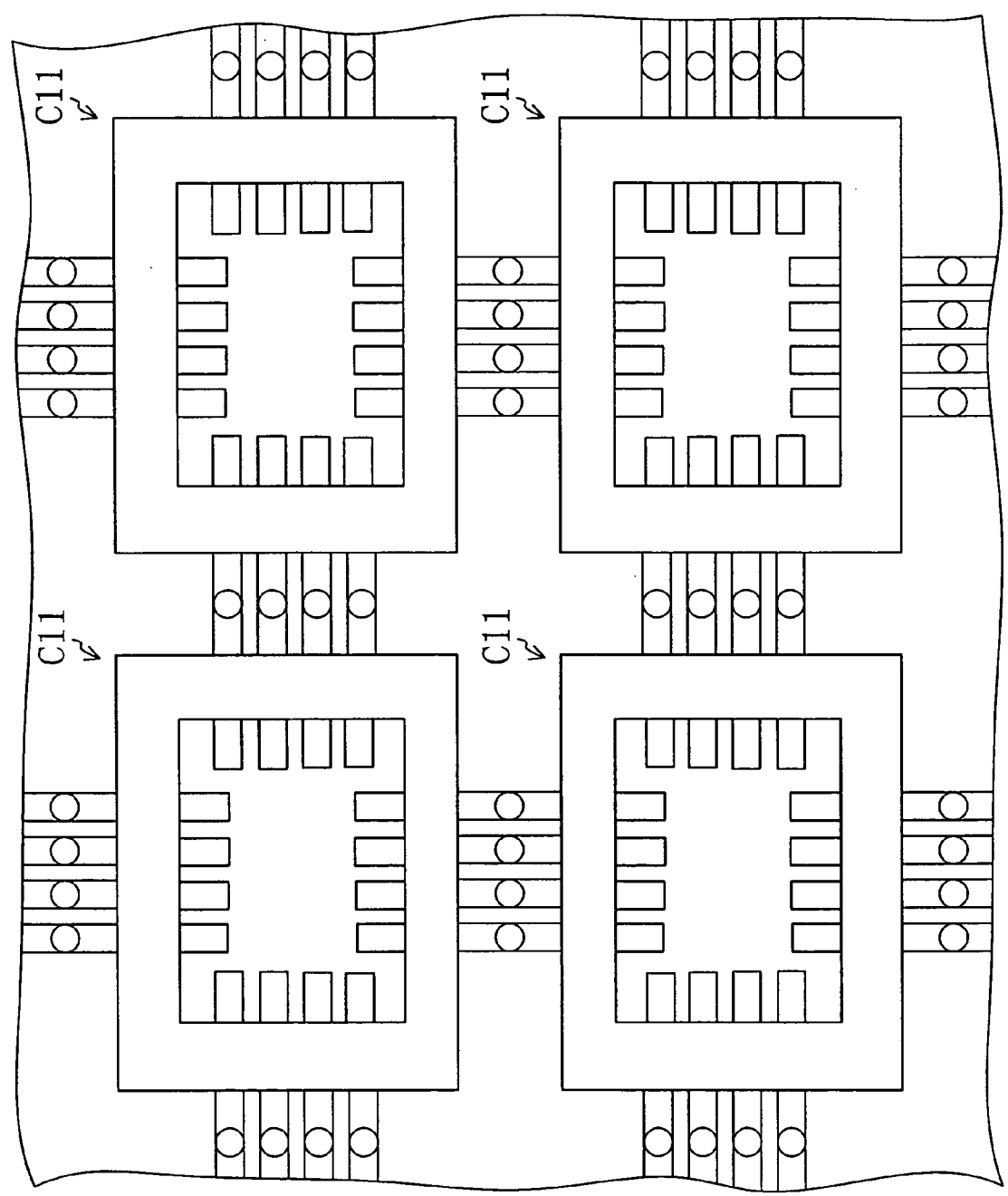
FIG. 60 is a plan view showing how a plurality of optical device cavity structures C11 according to Embodiment 11 are manufactured at once.

A plurality of optical device cavity structures C11, C11, . . . , may be manufactured at once by using a larger base substrate, as shown in FIG. 60. This improves the productivity and significantly reduces the production cost. This method can be used with any embodiment of the present invention. Typically, the base substrate, being temporarily secured on a dicing tape, is cut by a dicing saw using diamond grains while being washed with water, thereby separating adjacent optical device cavity structures C11, C11, . . . , from one another.

What is claimed is:

1. An optical device cavity structure which receives an optical element chip thereon and which is to be mounted on a wiring substrate, the optical device cavity structure comprising:

at least two insulator layers, including a first and a second insulator layer, and at least two metal layers, including a first and a second metal layer, alternately layered on one another;

a first terminal section formed on a mounting surface to be mounted on the wiring substrate so as to be electrically connected to the wiring substrate;

a cavity portion having a generally rectangular opening in a central portion of a surface opposite to the mounting surface; and a light-transmitting member placement section formed on the opposite surface surrounding the opening for receiving a light-transmitting member thereon, wherein the light-transmitting member is for transmitting therethrough light to be received by, or light emitted from, the optical element chip, wherein:

a bottom surface of the cavity portion is a portion of the first metal layer and is a chip placement section for receiving the optical element chip thereon;

each inner wall surface of the cavity portion is formed by the first insulator layer, the second metal layer and the second insulator layer, which are layered in this order from the bottom surface toward the opening, with a plurality of protruding portions protruding from the inner wall surface, each protruding portion being formed by the first insulator layer and the second metal layer;

the second metal layer in each protruding portion is a second terminal section which is electrically connected to the first terminal section and which is to be electrically connected to the optical element chip; and the light-transmitting member placement section includes securing means, being a portion of the second insulator layer, for securing the light-transmitting member.

2. The optical device cavity structure of claim 1, wherein the securing means is a roughened surface of the second insulator layer.

3. The optical device cavity structure of claim 2, wherein the surface of the second insulator layer is roughened so that an Rz value thereof is greater than or equal to 5 μm and less than or equal to 20 μm.

4. The optical device cavity structure of claim 1, wherein the securing means is a resist layer formed on a surface side of the light-transmitting member placement section.

5. An optical device cavity structure which receives an optical element chip thereon and which is to be mounted on a wiring substrate, the optical device cavity structure comprising:

at least three insulator layers, including a first, a second and a third insulator layer, and at least three metal layers, including a first, a second and a third metal layer, alternately layered on one another;

a first terminal section formed on a mounting surface to be mounted on the wiring substrate so as to be electrically connected to the wiring substrate; and a cavity portion having a generally rectangular opening in a central portion of a surface opposite to the mounting surface, wherein:

a bottom surface of the cavity portion is a portion of the first metal layer and is a chip placement section for receiving the optical element chip thereon;

each inner wall surface of the cavity portion is formed by the first insulator layer, the second metal layer, the second insulator layer, the third metal layer and the third insulator layer, which are layered in this order from the bottom surface toward the opening, with a plurality of first protruding portions and a second protruding portion protruding from the inner wall surface, wherein the first protruding portions are formed by the first insulator layer and the second metal layer, and the second protruding portion is formed by second insulator layer and the third metal layer and is protruding over a shorter distance than the first protruding portions;

the second metal layer in each first protruding portion is a second terminal section which is electrically connected to the first terminal section and which is to be electrically connected to the optical element chip; and a surface of the third metal layer in the second protruding portion is a light-transmitting member placement section for receiving a light-transmitting member thereon, wherein the light-transmitting member is for transmitting therethrough light to be received by, or light emitted from, the optical element chip.

6. An optical device cavity structure which receives an optical element chip thereon and which is to be mounted on a wiring substrate, the optical device cavity structure comprising:

at least two insulator layers, including a first and a second insulator layer, and at least three metal layers, including a first, a second and a third metal layer, alternately layered on one another;

a first terminal section formed on a mounting surface to be mounted on the wiring substrate so as to be electrically connected to the wiring substrate;

a cavity portion having a generally rectangular opening in a central portion of a surface opposite to the mounting surface; and an optical component fitting section being a depression surrounding the opening in which an optical component for transmitting therethrough light to be received by, or light emitted from, the optical element chip is to be fitted, wherein:

a bottom surface of the cavity portion is a portion of the first metal layer and is a chip placement section for receiving the optical element chip thereon;

each inner wall surface of the cavity portion is formed by the first insulator layer, the second metal layer and the second insulator layer, which are layered in this order from the bottom surface toward the opening, with a plurality of protruding portions protruding from the inner wall surface, each protruding portion being formed by the first insulator layer and the second metal layer;

the second metal layer in each protruding portion is a second terminal section which is electrically connected to the first terminal section and which is to be electrically connected to the optical element chip; and a surface of the optical component fitting section generally parallel to the bottom surface of the cavity portion is a portion of the third metal layer.

7. The optical device cavity structure of claim 1, wherein a surface of the chip placement section is formed so that an Rz value thereof is greater than or equal to 1 µm and less than or equal to 5 µm.

8. The optical device cavity structure of claim 1, wherein a moisture-absorbing porous material is mixed in the insulator layers.

9. The optical device cavity structure of claim 1, wherein the first terminal section is formed in a peripheral portion of the mounting surface and a warp preventing depressed portion is formed inside the peripheral portion.

10. The optical device cavity structure of claim 9, wherein the warp preventing depressed portion prevents shorting at the mounting surface.

11. The optical device cavity structure of claim 1, wherein an outline shape of the opening of the cavity portion on the surface opposite to the mounting surface does not have point symmetry with respect to a generally center point of the opening.

12. The optical device cavity structure of claim 11, wherein the non-point-symmetry outline shape has a function of indicating a position of a terminal in the first terminal section.

13. The optical device cavity structure of claim 1, wherein the surface opposite to the mounting surface includes a hole therein for indicating a position of a terminal in the first terminal section.

14. An optical device, comprising:
the optical device cavity structure of claim 1;
an optical element chip placed on the chip placement section of the optical device cavity structure; and
a light-transmitting member placed on the light-transmitting member placement section of the optical device cavity structure.

15. An optical device, comprising:
the optical device cavity structure of claim 5;
an optical element chip placed on the chip placement section of the optical device cavity structure; and
a light-transmitting member placed on the light-transmitting member placement section of the optical device cavity structure.

16. An optical device, comprising:
the optical device cavity structure of claim 6;
an optical element chip placed on the chip placement section of the optical device cavity structure; and
an optical component fitted in the optical component fitting section of the optical device cavity structure.

17. The optical device of claim 14, wherein:
the optical element chip and a surface of the second terminal section are electrically connected to each other by a conductive thread; and
the conductive thread is sealed with a resin.

18. The optical device of claim 14, wherein an optical plane of the optical element chip is placed closer to the opening than the surface of the second terminal section.

19. A method for manufacturing an optical device cavity structure which receives an optical element chip thereon and which is to be mounted on a wiring substrate, the optical device cavity structure including a first terminal section electrically connected to the wiring substrate, a second terminal section electrically connected to the first terminal section, a chip placement section for receiving thereon the optical element chip electrically connected to the second terminal section, and a light-transmitting member placement section for receiving a light-transmitting member thereon, wherein the light-transmitting member is for transmitting therethrough light to be received by, or light emitted from, the optical element chip, the method comprising:

a step of providing a base substrate, the base substrate including a first metal layer which is formed on one surface of a first insulator layer and which is to be the first terminal section, a second metal layer formed on the other surface of the first insulator layer, a second insulator layer formed on a surface of the second metal layer, a third metal layer formed on a peripheral portion of a surface of the second insulator layer and a plurality of tongue-shaped portions extending from the peripheral portion toward a central portion of the surface of the second insulator layer, and a third insulator layer formed on a surface of the third metal layer and on a portion of the second insulator layer that is not covered by the third metal layer; and a laser light irradiation step of irradiating a surface of the base substrate with laser light, thereby removing a portion of the second insulator layer that is not covered by the third metal layer, a portion of the third insulator layer where the third metal layer is absent and a portion of the third insulator layer formed over the tongue-shaped portions, while roughening a remaining portion of the third insulator layer, wherein:

in the laser light irradiation step, as a result of the removal of the second and third insulator layers, a cavity portion having a generally rectangular opening is formed in a central portion of the surface of the base substrate;

as a result of the removal of the second insulator layer, at least a portion of the second metal layer is exposed, thus forming a bottom surface of the cavity portion, which serves as the optical element chip placement section;

as a result of the removal of the third insulator layer, the tongue-shaped portions are exposed, thus forming a plurality of protruding portions protruding from inner wall surfaces of the cavity portion, each protruding portion serving as the second terminal section; and as a result of the roughening of the remaining portion of the third insulator layer, the light-transmitting member placement section is formed.

20. A method for manufacturing an optical device cavity structure which receives an optical element chip thereon and which is to be mounted on a wiring substrate, the optical device cavity structure including a first terminal section electrically connected to the wiring substrate, a second terminal section electrically connected to the first terminal section, a chip placement section for receiving thereon the optical element chip electrically connected to the second terminal section, and a light-transmitting member placement section for receiving a light-transmitting member thereon, wherein the light-transmitting member is for transmitting therethrough light to be received by, or light emitted from, the optical element chip, the method comprising:

a step of providing a base substrate, the base substrate including a first metal layer which is formed on one surface of a first insulator layer and which is to be the first terminal section, a second metal layer formed on the other surface of the first insulator layer, a second insulator layer formed on a surface of the second metal layer, a third metal layer formed on a peripheral portion of a surface of the second insulator layer and a plurality of tongue-shaped portions extending from the peripheral portion toward a central portion of the surface of the second insulator layer, and a third insulator layer formed on a surface of the third metal layer and on a portion of the second insulator layer that is not covered by the third metal layer;

a laser light irradiation step of irradiating a portion of a surface of the base substrate where the third metal layer is absent and portions thereof corresponding to the tongue-shaped portions with laser light, thereby removing a portion of the second insulator layer that is not covered by the third metal layer and an irradiated portion of the third insulator layer; and a step of, after the laser light irradiation step, forming a resist layer on a surface of a remaining portion of the third insulator layer, thus forming the light-transmitting member placement section, wherein:

in the laser light irradiation step, as a result of the removal of the second and third insulator layers, a cavity portion having a generally rectangular opening is formed in a central portion of the surface of the base substrate;

as a result of the removal of the second insulator layer, at least a portion of the second metal layer is exposed, thus forming a bottom surface of the cavity portion, which serves as an optical element chip placement section; and as a result of the removal of the third insulator layer, the tongue-shaped portions are exposed, thus forming a plurality of protruding portions protruding from inner wall surfaces of the cavity portion, each protruding portion serving as the second terminal section.

21. A method for manufacturing an optical device cavity structure which receives an optical element chip thereon and which is to be mounted on a wiring substrate, the optical device cavity structure including a first terminal section electrically connected to the wiring substrate, a second terminal section electrically connected to the first terminal section, a chip placement section for receiving thereon the optical element chip electrically connected to the second terminal section, and a light-transmitting member placement section for receiving a light-transmitting member thereon, wherein the light-transmitting member is for transmitting therethrough light to be received by, or light emitted from, the optical element chip, the method comprising:

a step of providing a base substrate, the base substrate including a first metal layer which is formed on one surface of a first insulator layer and which is to be the first terminal section, a second metal layer formed on the other surface of the first insulator layer, a second insulator layer formed on a surface of the second metal layer, a third metal layer formed on a peripheral portion of a surface of the second insulator layer and a plurality of tongue-shaped portions extending from the peripheral portion toward a central portion of the surface of the second insulator layer, a fourth metal layer formed on a surface of a third insulator layer formed on the third metal layer so as to be narrower than the third metal layer, and a fourth insulator layer formed on a surface of the fourth metal layer and on a portion of the third insulator layer that is not covered by the fourth metal layer; and a laser light irradiation step of irradiating a portion of a surface of the base substrate where the third metal layer is absent and portions thereof corresponding to the tongue-shaped portions and a peripheral portion of the tongue-shaped portions with laser light, thereby removing an irradiated portion of the fourth insulator layer, a portion of the third insulator layer that is not covered by the fourth metal layer and a portion of the second insulator layer that is not covered by the third metal layer, wherein:

in the laser light irradiation step, as a result of the removal of the second, third and fourth insulator layers, a cavity portion having a generally rectangular opening is formed in a central portion of the surface of the base substrate;

as a result of the removal of the second insulator layer, at least a portion of the second metal layer is exposed, thus forming a bottom surface of the cavity portion, which serves as the optical element chip placement section;

as a result of the removal of the third insulator layer, the tongue-shaped portions are exposed, thus forming a plurality of protruding portions protruding from inner wall surfaces of the cavity portion, each protruding portion serving as the second terminal section; and as a result of the removal of the fourth insulator layer, at least a portion of the fourth metal layer is exposed, thereby forming a second protruding portion protruding, over a shorter distance than the first protruding portion, from each inner wall surface of the cavity portion, the second protruding portion serving as the light-transmitting member placement section.

22. A method for manufacturing an optical device cavity structure which receives an optical element chip thereon and which is to be mounted on a wiring substrate, the optical device cavity structure including a first terminal section electrically connected to the wiring substrate, a second terminal section electrically connected to the first terminal section, a chip placement section for receiving thereon the optical element chip electrically connected to the second terminal section, and an optical component fitting section in which an optical component is fitted, the optical component transmitting therethrough light to be received by, or light emitted from, the optical element chip, the method comprising:

a step of providing a base substrate, including a first metal layer which is formed on one surface of a first insulator layer and which is to be the first terminal section, a second metal layer formed on the other surface of the first insulator layer, a second insulator layer formed on a surface of the second metal layer, a third metal layer formed on a peripheral portion of a surface of the second insulator layer and a plurality of tongue-shaped portions extending from the peripheral portion toward a central portion of the surface of the second insulator layer, a fourth metal layer formed on a surface of a third insulator layer formed on the third metal layer so as to be narrower than the third metal layer, and a fourth insulator layer formed on a surface of the fourth metal layer and on a portion of the third insulator layer that is not covered by the fourth metal layer; and a laser light irradiation step of irradiating a portion of a surface of the base substrate where the third metal layer is absent and portions corresponding to the tongue-shaped portions and the fourth metal layer with laser light, thereby removing an irradiated portion of the fourth insulator layer, a portion of third insulator layer that is not covered by the fourth metal layer and a portion of the second insulator layer that is not covered by the third metal layer, wherein:

in the laser light irradiation step, as a result of the removal of the second, third and fourth insulator layers, a cavity portion having a generally rectangular opening is formed in a central portion of the surface of the base substrate;

as a result of the removal of the second insulator layer, at least a portion of the second metal layer is exposed, thus forming a bottom surface of the cavity portion, which serves as an optical element chip placement section;

as a result of the removal of the third insulator layer, the tongue-shaped portions are exposed, thereby forming a plurality of first protruding portions protruding from inner wall surfaces of the cavity portion, each first protruding portion serving as the second terminal section; and as a result of the removal of the peripheral portion of the fourth insulator layer, at least a portion of the fourth metal layer is exposed, thereby forming the optical component fitting section.

23. The method for manufacturing an optical device cavity structure of claim 19, wherein a surface of the optical element placement section is flatter than an unexposed portion of the second metal layer.

24. The method for manufacturing an optical device cavity structure of claim 23, wherein the surface of the optical element placement section is formed so that an Rz value thereof is greater than or equal to 1 µm and less than or equal to 5 µm.

25. An optical device cavity structure which is mounted on a wiring substrate and which receives an optical element chip thereon, the optical device cavity structure comprising:

a plurality of insulator layers, including a first and a second insulator layer, and a plurality of metal layers, including a first, a second and a third metal layer, alternately layered on one another;

a first terminal section formed on a mounting surface to be mounted on the wiring substrate so as to be electrically connected to the wiring substrate;

a cavity portion having a generally rectangular opening in a central portion of a surface opposite to the mounting surface; and a light-transmitting member placement section for receiving a light-transmitting member thereon, wherein the light-transmitting member is for transmitting therethrough light to be received by, or light emitted from, the optical element chip, wherein:

a bottom surface of the cavity portion is a portion of the first metal layer and is a chip placement section for receiving the optical element chip thereon;

each inner wall surface of the cavity portion is formed by the first insulator layer, the second metal layer and the second insulator layer, which are layered in this order from the bottom surface toward the opening, with a plurality of protruding portions protruding from the inner wall surface, each protruding portion being formed by the first insulator layer and the second metal layer;

the second metal layer in each protruding portion is a second terminal section which is electrically connected to the first terminal section and which is to be electrically connected to the optical element chip; and the third metal layer is placed closer to the mounting surface than the first metal layer.

26. The optical device cavity structure of claim 25, wherein the third metal layer prevents warping of the chip placement section.

27. The optical device cavity structure of claim 25, wherein:

the first terminal section is formed in a peripheral portion of the mounting surface;

the optical device cavity structure includes a first heat-radiating section provided on an inner side with respect to the peripheral portion of the mounting surface; and the optical device cavity structure includes a second heat-radiating section extending from the chip placement section to the first heat-radiating section while running through the third metal layer.

28. The optical device cavity structure of claim 25, wherein a surface of the chip placement section is formed so that an Rz value thereof is greater than or equal to 1 µm and less than or equal to 5 µm.

29. The optical device cavity structure of claim 25, wherein a moisture-absorbing porous material is mixed in the insulator layers.

30. The optical device cavity structure of claim 25, wherein an outline shape of the opening of the cavity portion on the surface opposite to the mounting surface does not have point symmetry with respect to a generally center point of the opening.

31. The optical device cavity structure of claim 30, wherein the non-point-symmetry outline shape has a function of indicating a position of a terminal in the first terminal section.

32. The optical device cavity structure of claim 25, wherein the surface opposite to the mounting surface includes a hole therein for indicating a position of a terminal in the first terminal section.

33. An optical device, comprising:
the optical device cavity structure of claim 25;
an optical element chip placed on the chip placement section of the optical device cavity structure; and
a light-transmitting member placed on the light-transmitting member placement section of the optical device cavity structure.

34. The optical device of claim 33, wherein:
the optical element chip and a surface of the second terminal section are electrically connected to each other by a conductive thread; and
the conductive thread is sealed with a resin.

35. The optical device of claim 33, wherein an optical plane of the optical element chip is placed closer to the opening than the surface of the second terminal section.

36. An optical device cavity structure which receives an optical element chip thereon and which is to be mounted on a wiring substrate, the optical device cavity structure comprising:
at least two insulator layers, including a first and a second insulator layer, and at least two metal layers, including a first and a second metal layer, alternately layered on one another;
a cavity portion having a generally rectangular opening in a central portion of a surface opposite to a mounting surface to be mounted on the wiring substrate;
a light-transmitting member placement section formed on the opposite surface surrounding the opening for receiving a light-transmitting member thereon, wherein the light-transmitting member is for transmitting therethrough light to be received by, or light emitted from, the optical element chip; and
a first terminal section electrically connected to a wire of the wiring substrate, wherein:
a bottom surface of the cavity portion is a portion of the first metal layer and is a chip placement section for receiving the optical element chip thereon;
each inner wall surface of the cavity portion is formed by the first insulator layer, the second metal layer and the second insulator layer, which are layered in this order from the bottom surface toward the opening, with a plurality of protruding portions protruding from the inner wall surface, each protruding portion being formed by the first insulator layer and the second metal layer;
the second metal layer in each protruding portion is a second terminal section which is electrically connected to the first terminal section and which is to be electrically connected to the optical element chip;
the first terminal section is protruding outwardly from an outer wall surface generally perpendicular to the mounting surface, and a lower surface and at least a portion of a side surface of the first terminal section are covered by a conductive layer; and
the light-transmitting member placement section includes securing means, being a portion of the second insulator layer, for securing the light-transmitting member.

37. The optical device cavity structure of claim 36, wherein the securing means is a roughened surface of the second insulator layer.

38. The optical device cavity structure of claim 37, wherein the surface of the second insulator layer is roughened so that an Rz value thereof is greater than or equal to 5 μm and less than or equal to 20 μm.

39. The optical device cavity structure of claim 36, wherein the securing means is a resist layer formed on a surface side of the light-transmitting member placement section.

40. An optical device cavity structure which receives an optical element chip thereon and which is to be mounted on a wiring substrate, the optical device cavity structure comprising:
at least three insulator layers, including a first, a second and a third insulator layer, and at least three metal layers, including a first, a second and a third metal layer, alternately layered on one another;
a cavity portion having a generally rectangular opening in a central portion of a surface opposite to a mounting surface to be mounted on the wiring substrate; and
a first terminal section electrically connected to a wire of the wiring substrate, wherein:
a bottom surface of the cavity portion is a portion of the first metal layer and is a chip placement section for receiving the optical element chip thereon;
each inner wall surface of the cavity portion is formed by the first insulator layer, the second metal layer, the second insulator layer, the third metal layer and the third insulator layer, which are layered in this order from the bottom surface toward the opening, with a plurality of first protruding portions and a second protruding portion protruding from the inner wall surface, wherein the first protruding portions are formed by the first insulator layer and the second metal layer, and the second protruding portion is formed by second insulator layer and the third metal layer and is protruding over a shorter distance than the first protruding portions;
the second metal layer in each first protruding portion is a second terminal section which is electrically connected to the first terminal section and which is to be electrically connected to the optical element chip;
a surface of the third metal layer in the second protruding portion is a light-transmitting member placement section for receiving a light-transmitting member thereon, wherein the light-transmitting member is for transmitting therethrough light to be received by, or light emitted from, the optical element chip; and
the first terminal section is protruding outwardly from an outer wall surface generally perpendicular to the mounting surface, and a lower surface and at least a portion of a side surface of the first terminal section are covered by a conductive layer.

41. An optical device cavity structure which receives an optical element chip thereon and which is to be mounted on a wiring substrate, the optical device cavity structure comprising:

at least two insulator layers, including a first and a second insulator layer, and at least three metal layers, including a first, a second and a third metal layer, alternately layered on one another;

a cavity portion having a generally rectangular opening in a central portion of a surface opposite to a mounting surface to be mounted on the wiring substrate;

an optical component fitting section being a depression surrounding the opening in which an optical component for transmitting therethrough light to be received by, or light emitted from, the optical element chip is to be fitted; and a first terminal section electrically connected to a wire of the wiring substrate, wherein:

a bottom surface of the cavity portion is a portion of the first metal layer and is a chip placement section for receiving the optical element chip thereon;

each inner wall surface of the cavity portion is formed by the first insulator layer, the second metal layer and the second insulator layer, which are layered in this order from the bottom surface toward the opening, with a plurality of protruding portions protruding from the inner wall surface, each protruding portion being formed by the first insulator layer and the second metal layer;

the second metal layer in each protruding portion is a second terminal section which is electrically connected to the first terminal section and which is to be electrically connected to the optical element chip;

a surface of the optical component fitting section generally parallel to the bottom surface of the cavity portion is a portion of the third metal layer; and the first terminal section is protruding outwardly from an outer wall surface generally perpendicular to the mounting surface, and a lower surface and at least a portion of a side surface of the first terminal section are covered by a conductive layer.

42. The optical device cavity structure of claim 36, wherein a portion of the side surface of the first terminal section that is covered by the conductive layer is the side surface of a tip portion of the first terminal that is protruding outwardly from the outer wall surface.

43. The optical device cavity structure of claim 36, wherein a surface of the chip placement section is formed so that an Rz value thereof is greater than or equal to 1 μm and less than or equal to 5 μm.

44. The optical device cavity structure of claim 36, wherein a moisture-absorbing porous material is mixed in the insulator layers.

45. The optical device cavity structure of claim 36, wherein on the mounting surface, a metal layer is formed in a peripheral portion and a warp preventing depressed portion is formed on an inner side with respect to the peripheral portion.

46. The optical device cavity structure of claim 45, wherein the warp preventing depressed portion prevents shorting at the mounting surface.

47. The optical device cavity structure of claim 36, wherein an outline shape of the opening of the cavity portion on the surface opposite to the mounting surface does not have point symmetry with respect to a generally center point of the opening.

48. The optical device cavity structure of claim 47, wherein the non-point-symmetry outline shape has a function of indicating a position of a terminal in the first terminal section.

49. The optical device cavity structure of claim 36, wherein the surface opposite to the mounting surface includes a hole therein for indicating a position of a terminal in the first terminal section.

50. An optical device, comprising:

the optical device cavity structure of claim 36;

an optical element chip placed on the chip placement section of the optical device cavity structure; and a light-transmitting member placed on the light-transmitting member placement section of the optical device cavity structure.

51. An optical device, comprising:

the optical device cavity structure of claim 40;

an optical element chip placed on the chip placement section of the optical device cavity structure; and a light-transmitting member placed on the light-transmitting member placement section of the optical device cavity structure.

52. An optical device, comprising:

the optical device cavity structure of claim 41;

an optical element chip placed on the chip placement section of the optical device cavity structure; and an optical component fitted in the optical component fitting section of the optical device cavity structure.

53. The optical device of claim 50, wherein:

the optical element chip and a surface of the second terminal section are electrically connected to each other by a conductive thread; and the conductive thread is sealed with a resin.

54. The optical device of claim 50, wherein an optical plane of the optical element chip is placed closer to the opening than the surface of the second terminal section.

55. A method for manufacturing an optical device cavity structure which receives an optical element chip thereon and which is to be mounted on a wiring substrate, the optical device cavity structure including a first terminal section electrically connected to the wiring substrate, a second terminal section electrically connected to the first terminal section, a chip placement section for receiving thereon the optical element chip electrically connected to the second terminal section, and a light-transmitting member placement section for receiving a light-transmitting member thereon, wherein the light-transmitting member is for transmitting therethrough light to be received by, or light emitted from, the optical element chip, the method comprising:

a step of providing a base substrate, the base substrate including a first metal layer formed on one surface of a first insulator layer, a second metal layer formed on the other surface of the first insulator layer and having a plurality of first tongue-shaped portions extending outwardly, a second insulator layer formed on a surface of the second metal layer, a third metal layer formed on a peripheral portion of the second insulator layer and a plurality of second tongue-shaped portions extending from the peripheral portion toward a central portion of the second insulator layer, and a third insulator layer formed on a surface of the third metal layer and on a portion of the second insulator layer that is not covered by the third metal layer; and a laser light irradiation step of irradiating a surface of the base substrate with laser light, thereby removing a portion of the second insulator layer that is not covered by the third metal layer, a portion of the third insulator layer where the third metal layer is absent, a portion of the third insulator layer that is formed on the second tongue-shaped portion, and a portion of the first insulator layer that is not covered by the second metal layer, while roughening a remaining portion of the third insulator layer, wherein:

in the laser light irradiation step, as a result of the removal of the second and third insulator layers, a cavity portion having a generally rectangular opening is formed in a central portion of the surface of the base substrate;

as a result of the removal of the second insulator layer, at least a portion of the second metal layer is exposed, thus forming a bottom surface of the cavity portion, which serves as an optical element chip placement section, and the first tongue-shaped portions are exposed;

as a result of the removal of the first insulator layer, the first terminal section is formed whose upper surface is covered by the first tongue-shaped portions;

as a result of the removal of the third insulator layer, the second tongue-shaped portions are exposed, thereby forming a plurality of protruding portions protruding from inner wall surfaces of the cavity portion, each protruding portion serving as the second terminal section; and as a result of the roughening of the remaining portion of the third insulator layer, the light-transmitting member placement section is formed.

56. A method for manufacturing an optical device cavity structure which receives an optical element chip thereon and which is to be mounted on a wiring substrate, the optical device cavity structure including a first terminal section electrically connected to the wiring substrate, a second terminal section electrically connected to the first terminal section, a chip placement section for receiving thereon the optical element chip electrically connected to the second terminal section, and a light-transmitting member placement section for receiving a light-transmitting member thereon, wherein the light-transmitting member is for transmitting therethrough light to be received by, or light emitted from, the optical element chip, the method comprising:

a step of providing a base substrate, including a first metal layer formed on one surface of a first insulator layer, a second metal layer formed on the other surface of the first insulator layer and having a plurality of first tongue-shaped portions extending outwardly, a second insulator layer formed on a surface of the second metal layer, a third metal layer formed on a peripheral portion of the second insulator layer and a plurality of second tongue-shaped portions extending from the peripheral portion toward a central portion of the second insulator layer, and a third insulator layer formed on a surface of the third metal layer and on a portion of the second insulator layer that is not covered by the third metal layer;

a laser light irradiation step of irradiating a portion of a surface of the base substrate where the third metal layer is absent and portions thereof corresponding to the second tongue-shaped portions with laser light, thereby removing an irradiated portion of the second insulator layer that is not covered by the third metal layer, an irradiated portion of the third insulator layer, and an irradiated portion of the first insulator layer; and a step of, after the laser light irradiation step, forming a resist layer on a surface of a remaining portion of the third insulator layer, thus forming the light-transmitting member placement section, wherein:

in the laser light irradiation step, as a result of the removal of the second and third insulator layers, a cavity portion having a generally rectangular opening is formed in a central portion of the surface of the base substrate;

as a result of the removal of the second insulator layer, at least a portion of the second metal layer is exposed, thus forming a bottom surface of the cavity portion, which serves as an optical element chip placement section, and the first tongue-shaped portions are exposed;

as a result of the removal of the first insulator layer, the first terminal section is formed whose upper surface is covered by the first tongue-shaped portions; and as a result of the removal of the third insulator layer, the second tongue-shaped portions are exposed, thereby forming a plurality of protruding portions protruding from inner wall surfaces of the cavity portion, each protruding portion serving as the second terminal section.

57. A method for manufacturing an optical device cavity structure which receives an optical element chip thereon and which is to be mounted on a wiring substrate, the optical device cavity structure including a first terminal section electrically connected to the wiring substrate, a second terminal section electrically connected to the first terminal section, a chip placement section for receiving thereon the optical element chip electrically connected to the second terminal section, and a light-transmitting member placement section for receiving a light-transmitting member thereon, wherein the light-transmitting member is for transmitting therethrough light to be received by, or light emitted from, the optical element chip, the method comprising:

a step of providing a base substrate, including a first metal layer formed on one surface of a first insulator layer, a second metal layer formed on the other surface of the first insulator layer and having a plurality of first tongue-shaped portions extending outwardly, a second insulator layer formed on a surface of the second metal layer, a third metal layer formed on a peripheral portion of the second insulator layer and a plurality of second tongue-shaped portions extending from the peripheral portion toward a central portion of the second insulator layer, a fourth metal layer formed on a surface of a third insulator layer formed on the third metal layer so as to be narrower than the third metal layer, and a fourth insulator layer formed on a surface of the fourth metal layer and on a portion of the third insulator layer that is not covered by the fourth metal layer; and a laser light irradiation step of irradiating a portion of a surface of the base substrate where the third metal layer is absent and portions thereof corresponding to the second tongue-shaped portions and a peripheral portion of the tongue-shaped portions with laser light, thereby removing an irradiated portion of the fourth insulator layer, a portion of the third insulator layer that is not covered by the fourth metal layer, a portion of the second insulator layer that is not covered by the third metal layer, and a portion of the first insulator layer, wherein:

in the laser light irradiation step, as a result of the removal of the second, third and fourth insulator layers, a cavity portion having a generally rectangular opening is formed in a central portion of the surface of the base substrate;

as a result of the removal of the second insulator layer, at least a portion of the second metal layer is exposed, thus forming a bottom surface of the cavity portion, which serves as the optical element chip placement section, and the first tongue-shaped portions are exposed;

as a result of the removal of the first insulator layer, the first terminal section is formed whose upper surface is covered by the first tongue-shaped portions;

as a result of the removal of the third insulator layer, the second tongue-shaped portions are exposed, thereby forming a plurality of protruding portions protruding from inner wall surfaces of the cavity portion, each protruding portion serving as the second terminal section; and as a result of the removal of the fourth insulator layer, at least a portion of the fourth metal layer is exposed, thereby forming a second protruding portion protruding, over a shorter distance than the first protruding portion, from each inner wall surface of the cavity portion, the second protruding portion serving as the light-transmitting member placement section.

58. A method for manufacturing an optical device cavity structure which receives an optical element chip thereon and which is to be mounted on a wiring substrate, the optical device cavity structure including a first terminal section electrically connected to the wiring substrate, a second terminal section electrically connected to the first terminal section, a chip placement section for receiving thereon the optical element chip electrically connected to the second terminal section, and an optical component fitting section in which an optical component is fitted, the optical component transmitting therethrough light to be received by, or light emitted from, the optical element chip, the method comprising:

a step of forming a base substrate, including a first metal layer formed on one surface of a first insulator layer, a second metal layer formed on the other surface of the first insulator layer and having a plurality of first tongue-shaped portions extending outwardly, a second insulator layer formed on a surface of the second metal layer, a third metal layer formed on a peripheral portion of the second insulator layer and a plurality of second tongue-shaped portions extending from the peripheral portion toward a central portion of the second insulator layer, a fourth metal layer formed on a surface of a third insulator layer formed on the third metal layer so as to be narrower than the third metal layer, and a fourth insulator layer formed on a surface of the fourth metal layer and on a portion of the third insulator layer that is not covered by the fourth metal layer; and a laser light irradiation step of irradiating, a portion of a surface of the base substrate where the third metal layer is absent and portions thereof corresponding to the second tongue-shaped portions and the fourth metal layer with laser light, thereby removing an irradiated portion of the fourth insulator layer, a portion of the third insulator layer that is not covered by the fourth metal layer, a portion of the second insulator layer that is not covered by the third metal layer, and a portion of the first insulator layer, wherein:

in the laser light irradiation step, as a result of the removal of the second, third and fourth insulator layers, a cavity portion having a generally rectangular opening is formed in a central portion of the surface of the base substrate;

as a result of the removal of the second insulator layer, at least a portion of the second metal layer is exposed, thus forming a bottom surface of the cavity portion, which serves as an optical element chip placement section, and the first tongue-shaped portions are exposed;

as a result of the removal of the first insulator layer, the first terminal section is formed whose upper surface is covered by the first tongue-shaped portions;

as a result of the removal of the third insulator layer, the second tongue-shaped portions are exposed, thereby forming a plurality of first protruding portions protruding from inner wall surfaces of the cavity portion, each first protruding portion serving as the second terminal section; and as a result of the removal of the peripheral portion of the fourth insulator layer, at least a portion of the fourth metal layer is exposed, thereby forming the optical component fitting section.

59. The method for manufacturing an optical device cavity structure of claim 55, wherein the step of providing the base substrate includes:

a step of forming a layered structure by layering the first metal layer, the first insulator layer and the second metal layer together;

a through hole formation step of irradiating the layered structure with laser light to make a through hole in a portion that is to be the first tongue-shaped portion; and a plating step of forming, by plating, a conductive layer on an inner wall surface of the through hole.

60. The method for manufacturing an optical device cavity structure of claim 59, wherein a surface of the optical element placement section is flatter than an unexposed portion of the second metal layer.

61. The method for manufacturing an optical device cavity structure of claim 60, wherein the surface of the optical element placement section is formed so that an Rz value thereof is greater than or equal to 1 μm and less than or equal to 5 μm.

* * * * *